US012094319B2

United States Patent
Menzel et al.

(10) Patent No.: US 12,094,319 B2
(45) Date of Patent: *Sep. 17, 2024

(54) SYSTEMS AND METHODS FOR MANAGING SMART ALARMS

(71) Applicant: Schneider Electric USA, Inc., Andover, MA (US)

(72) Inventors: Johannes Menzel, Eybens (FR); Jeffrey Winston Yeo, Saanichton (CA)

(73) Assignee: Schneider Electric USA, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/143,887

(22) Filed: May 5, 2023

(65) Prior Publication Data

US 2023/0394950 A1   Dec. 7, 2023

Related U.S. Application Data

(63) Continuation of application No. 17/103,127, filed on Nov. 24, 2020, now Pat. No. 11,668,764, which is a
(Continued)

(51) Int. Cl.
*G08B 21/18* (2006.01)
*G01R 19/25* (2006.01)
(Continued)

(52) U.S. Cl.
CPC ....... *G08B 21/185* (2013.01); *G01R 19/2513* (2013.01); *G01R 21/00* (2013.01);
(Continued)

(58) Field of Classification Search
CPC .... G01R 19/2513; G01R 31/40; G01R 31/56; G01R 21/00; G01R 21/133; G05B 11/00;
(Continued)

(56) References Cited

U.S. PATENT DOCUMENTS 8,099,452 B2   1/2012   Chkodrov et al.
10,467,083 B2  11/2019  Settle
(Continued)

FOREIGN PATENT DOCUMENTS

CN   106021063 A    10/2016
WO   2019195582 A1  10/2019

OTHER PUBLICATIONS

Extended European Search Report and Search Opinion dated Jul. 22, 2022 for corresponding European Patent Application No. 21208751. 4, 17 pages.
(Continued)

*Primary Examiner* — John H Le
(74) *Attorney, Agent, or Firm* — Locke Lord LLP

(57) ABSTRACT

A method of analyzing events for an electrical system includes: receiving event stream(s) of events occurring in the electrical system, the events being identified from captured energy-related signals in the system; analyzing, an event stream(s) of the events to identify different actionable triggers therefrom, the different triggers including a scenario in which a group of events satisfies one or more predetermined triggering conditions; analyzing, over time, the different actionable triggers to identify a combination of occurring and/or non-occurring actionable triggers which satisfies a predefined trigger combination condition and an analysis time constraint; and in response to the observation of the combination, taking one or more actions to address the events. The analysis time constraint can be a time period duration and/or sequence within which time-stamped data of events in the event stream(s) and the associated actionable triggers are considered or not considered in the analysis to identify the combination.

20 Claims, 30 Drawing Sheets

Related U.S. Application Data continuation-in-part of application No. 17/044,905, filed as application No. PCT/US2019/025842 on Apr. 4, 2019, now Pat. No. 11,443,610.

(60) Provisional application No. 62/652,844, filed on Apr. 4, 2018, provisional application No. 62/785,291, filed on Dec. 27, 2018, provisional application No. 62/788,532, filed on Jan. 4, 2019.

(51) Int. Cl.
| | |
|---|---|
| *G01R 21/00* | (2006.01) |
| *G01R 21/133* | (2006.01) |
| *G01R 31/40* | (2020.01) |
| *G01R 31/56* | (2020.01) |
| *G05B 11/00* | (2006.01) |
| *G05B 13/00* | (2006.01) |
| *G05B 19/00* | (2006.01) |
| *G08B 25/08* | (2006.01) |
| *G08B 27/00* | (2006.01) |
| *G08B 29/00* | (2006.01) |

(52) U.S. Cl.
CPC ........... *G01R 21/133* (2013.01); *G01R 31/40* (2013.01); *G01R 31/56* (2020.01); *G05B 11/00* (2013.01); *G05B 13/00* (2013.01); *G05B 19/00* (2013.01); *G08B 21/182* (2013.01); *G08B 25/08* (2013.01); *G08B 27/005* (2013.01); *G08B 29/00* (2013.01); *G08B 21/18* (2013.01); *Y04S 10/52* (2013.01)

(58) Field of Classification Search
CPC ........ G05B 19/00; G05B 13/00; G08B 21/18; G08B 21/182; G08B 21/185; G08B 25/08; G08B 27/005
USPC .......................................................... 702/58
See application file for complete search history.

(56) References Cited

U.S. PATENT DOCUMENTS

| | | | |
|---|---|---|---|
| 10,685,043 B2 | 6/2020 | Brew et al. | |
| 10,832,564 B2 | 11/2020 | Subramanian et al. | |
| 11,668,764 B2 * | 6/2023 | Menzel | G06Q 50/06 |
| | | | 702/58 |
| 2009/0066528 A1 | 3/2009 | Bickel et al. | |
| 2009/0070447 A1 | 3/2009 | Jubinville et al. | |
| 2011/0153236 A1 | 6/2011 | Montreuil et al. | |
| 2012/0004867 A1 | 1/2012 | Mousavi et al. | |
| 2013/0191185 A1 | 7/2013 | Galvin | |
| 2016/0370771 A1 | 12/2016 | Torres Fuchslocher et al. | |
| 2017/0270414 A1 | 9/2017 | Ignatova et al. | |

OTHER PUBLICATIONS

Indian Examination Report dated Jul. 28, 2022 for related Indian Patent Application No. 202017042177, 13 pages.
Extended European Search Report and Written Opinion dated Nov. 3, 2021 for related European Patent Application No. EP19782427.9-1202, 10 pages.
International Search Report and Written Opinion mailed Jul. 9, 2019 in International Application Serial No. PCT/US2019/025842, 19 pages.
Partial European Search Report dated Apr. 5, 2022 for corresponding European Application No. 21208751.4-1202, 10 pages.
Chinese Office Action dated Sep. 9, 2022 for related Chinese Application No. 201980034509.9, 11 pages.
Chinese Office Action dated Nov. 2, 2021 for related Chinese Application No. 201980034509.9, 32 pages.

* cited by examiner

- POWER-CURRENT LOSS
- VOLTAGE-MAGNITUDE-ISSUE & CONNECTION
- SYS PME, TIMESYNC, COMS, CONFIG & PROTECTION
- UPSTREAM
- SAG-DISTURBANCE-WAVEFORM
- DROPOUT-STATUS-LOAD
- HARMONICS-OVERVOLTAGE OR CURRENT

US 12,094,319 B2

SYSTEMS AND METHODS FOR MANAGING SMART ALARMS

CROSS-REFERENCE TO RELATED APPLICATIONS

The present application is a continuation of U.S. Ser. No. 17/103,127, filed Nov. 24, 2020, which claims priority to U.S. Ser. No. 17/044,905, filed Oct. 2, 2020, which is the U.S. national stage of International Application No. PCT/US2019/25842, filed Apr. 4, 2019, which claims priority to U.S. Provisional Application Ser. No. 62/652,844 filed on Apr. 4, 2018, U.S. Provisional Application Ser. No. 62/785,291 filed on Dec. 27, 2018 and U.S. Provisional Application Ser. No. 62/788,532 filed on Jan. 4, 2019, all of the applications of which are incorporated by reference herein in their entirety.

FIELD

This disclosure relates generally to smart alarms, and more particularly, to systems and methods related to managing smart alarms in an electrical or power system.

BACKGROUND

The changing world of energy is making it increasingly challenging to optimize power reliability, energy costs, and operational efficiency such as in critical power environments (e.g., hospitals, data centers, airports, and manufacturing facilities). Utility power grids are becoming more dynamic and facility power distribution systems are becoming more complex and sensitive to power quality issues due to increasing electronic control devices, threatening network stability. Competitive pressures and environmental regulations are pushing expectations for energy efficiency and business sustainability higher than ever. Addressing these challenges requires new digital tools designed specifically to enable faster response to opportunities and risks related to electrical/power system reliability and operational stability.

Power quality disturbances are a primary cause of unexpected business downtime and equipment malfunction/damage/failure. According to some estimates, power quality disturbances are responsible for 30-40% of business downtime, and power quality problems cost companies roughly 4% of their annual revenue. Examples of the detrimental effects to equipment that may be attributed to power quality disturbances include overheating of equipment components (e.g., motors, capacitors, cables, transformers, etc.), accelerated wear and tear, premature aging of equipment components, malfunctions and mis-operations, and erroneous circuit breaker or relays operations.

The economic impact produced by power quality disturbances may include increased energy bills, additional financial penalties (e.g., penalties as a result of power disruption), and potentially detrimental impacts on the environment (e.g., increased carbon footprint). Power quality disturbances may also adversely result in increased charges related to demand, and increases in electrical/power system losses. Three examples of areas that are influenced by power quality disturbances include: uptime, asset condition, and energy efficiency. For example, system uptime may be affected by electrical installations intentionally or inadvertently being removed from service due to voltage sags, interruptions, and/or undervoltage/overvoltage conditions. Moreover, nuisance trips of circuits caused by harmonics, voltage swells, or transients may also lead to reduced uptime. Assets (e.g., cables, transformers, capacitor banks, etc.) may be detrimentally affected by power quality disturbances or conditions. For instance, overheating of equipment, an unplanned change in design characteristics, and/or a decreased service life are just a few impacts caused by power quality anomalies. Finally, the efficient use of energy is also affected by power quality disturbances.

According to a specific example, capacitor banks may be affected by power quality disturbances (e.g., harmonics) which are characterized as a steady-state distortion of the voltage and/or current signals. Non-linear power loads from electric arc furnaces (EAFs), electric railways, thyristor-based voltage and frequency modifying devices have become primary harmonic sources in a power grid. These systems inject large amounts of harmonic currents into the power system, leading to distortion of the fundamental current signal in the power grid. Harmonics may adversely impact the normal operations of capacitor banks in numerous ways (e.g., increasing power losses, producing harmonic resonance, increasing harmonic currents, and reducing the service life of the capacitor bank through additional heating).

Proper collection and interpretation of events, alarms, power quality data and other associated data about the system (e.g., contextual data from manufacturing process SCADA, building management system (BMS) and the user interactions, user defined priority levels, etc.) may allow for both businesses and energy providers to discriminate useful information from collected events, improve electrical/power system operations, recovery time and efficiency, and limit detrimental effects from power quality disturbances and other undesirable conditions on the electrical/power system or facilities. Energy procurement managers may use power quality data to identify and avoid penalties or to revise/update energy contracts. Likewise, maintenance engineers may use power quality data to properly diagnose equipment issues and improve root cause analysis and reduce equipment downtime.

Furthermore, the processes in which power monitoring systems are deployed and operate are very diverse and often exhibit complex behavior. Some of these complex behaviors are linked to the time related aspect of the data flow. For instance, some data may arrive later than other data. Order of arrival may be different from the time stamping order of this data. Delays may appear in data reception between the IED measuring and sending data and the storage and processing unit (e.g., due to connectivity issues, power loss of in between devices such as gateways as two possible reasons amongst many others). Other examples of complex behaviors related to time may be evaluated by measuring the time to process, the time to capture the data, the time to send the data, the time to receive the data, the time to process the data, the time to send the results. Then analyzing each one of these and making sense of the different changes is beyond the human brain or would take far too much time to process. So automating the analysis and discriminating between the possible causes and consequences to provide actions is part of the problem scope of this application.

SUMMARY

Described herein are systems and methods related to managing smart alarms in an electrical or power system. In one aspect of this disclosure, a method for managing smart alarms in an electrical system includes processing electrical measurement data from or derived from energy-related signals captured or derived by at least one intelligent electronic device (IED) of a monitoring and control system (MCS) to identify power events in the electrical system, and to identify alarms triggered in response to the identified power events. Information related to the identified power events and the identified alarms may be aggregated, and relevant event management groups and/or relevant event and/or alarm periods may be identified (e.g., automatically or manually) from the aggregated information. In some embodiments, the event management groups include groups and/or sequences of the identified power events, and/or groups and/or sequences of alarm events triggered in response to the identified alarms. One or more actions may be triggered, avoided or postponed in response to the identified event management groups and/or event and/or alarm periods in some embodiments.

In some embodiments, the method may be implemented using one or more IEDs of the at least one IED. Additionally, in some embodiments the method (or portions thereof) may be implemented remote from the at least one IED, for example, on a diagnostic computing system and/or on other portions of the MCS. In some embodiments, the at least one IED may be coupled to measure energy-related signals, receive electrical measurement data from or derived from the energy-related signals at an input, and configured to generate at least one or more outputs. The outputs may be used to identify power events, and to identify alarms triggered in response to the identified power event, in an electrical system. Examples of the at least one IED may include a smart utility meter, a power quality meter, and/or another metering device (or devices). The at least one IED may include breakers, relays, power quality correction devices, uninterruptible power supplies (UPSs), filters, and/or variable speed drives (VSDs), for example. Additionally, the at least one IED may include at least one virtual meter in some embodiments.

In some embodiments, each IED of the at least one IED is installed or located at a respective metering point of a plurality of metering points (e.g., physical or virtual metering points) in the electrical system, and the energy-related signals captured or derived by each IED are associated with the respective metering point. At least one load (e.g., electrical equipment or devices) may be installed or located at each metering point of the plurality of metering points, for example, and each IED may be configured to monitor the at least one load installed or located at the respective metering point at which the IED is installed or located. In the illustrated example, the energy-related signals captured or derived by the IED may be associated with the at least one load.

Examples of energy-related signals captured or derived by the at least one IED may include at least one of: voltage, current, energy, active power, apparent power, reactive power, harmonic voltages, harmonic currents, total voltage harmonic distortion, total current harmonic distortion, harmonic power, individual phase currents, three-phase currents, phase voltages, line voltages and power factor.

In some embodiments, identifying power events from electrical measurement data from or derived from the energy-related signals includes identifying power quality event types of the of the power events. The power quality event types may include, for example, at least one of: a voltage sag, a voltage swell, a voltage or current transient, a temporary interruption, and voltage or current harmonic distortion. It is understood there are types of power quality events and there are certain characteristics of these types of power quality events. According to IEEE Standard 1159-2009, for example, a voltage sag is a decrease to between 0.1 and 0.9 per unit (pu) in rms voltage or current at the power frequency for durations of 0.5 cycle to 1 min. Typical values are 0.1 to 0.9 pu. Additionally, according to IEEE Standard 1159-2009, a voltage swell is an increase in rms voltage or current at the power frequency for durations from 0.5 cycles to 1 min. It is understood that IEEE Standard 1159-2009 is one standards body's (IEEE in this case) way of defining/characterizing power quality events. It is understood there are other standards that define power quality categories/events as well, such as the International Electrotechnical Commission (IEC), American National Standards Institute (ANSI), etc., which may have different descriptions or power quality event types, characteristics, and terminology. In some embodiments, power quality events may be customized power quality events (e.g., defined by a user).

The above method, and the other methods (and systems) described below, may include one or more of the following features either individually or in combination with other features in some embodiments. In some embodiments, at least one of the alarms is triggered in response to the electrical measurement data being above one or more upper alarm thresholds or below one or more lower alarm thresholds. An anomalous voltage condition, for example, which is one example type of power event, corresponds to a measured IED voltage being above one or more upper alarm thresholds or below one or more lower alarm thresholds. In some embodiments, at least one of the alarms is additionally or alternatively triggered in response to multiple power events. For example, an alarm may be triggered in response to a sag and an interruption (or other group of power events) that occur over a particular time period.

In some embodiments, the information related to the identified power events and the identified alarms is aggregated based on at least one of: locations of the identified power events in the electrical system, time period(s) or interval(s), criticality of the identified alarms to a particular process or application, and device type(s) of the at least one IED. Additional aspects of aggregation of power events and alarms are described, for example, in co-pending application number PCT/US19/25754, entitled "Systems and Methods for Intelligent Alarm Grouping", which application is assigned to the same assignee as the present disclosure, and is incorporated by reference herein in its entirety.

In some embodiments, discriminant characteristics may be identified in the aggregated information. Identifying the discriminant characteristics may include, for example, identifying breakpoints associated with the event and/or alarm periods, modeling each of the event and/or alarm periods, classifying each of the modeled event and/or alarm periods, and identifying discriminant characteristics in each of the modeled event and/or alarm periods. In some embodiments, the event and/or alarm periods may be identified based on detected changes in relevant data from the aggregated information. The breakpoints associated with the event and/or alarm periods may correspond to significant change points in the aggregated information separating one event and/or alarm period from a next event and/or alarm period of the event and/or alarm periods, for example.

In some embodiments, modeling each of the event and/or alarm periods, includes determining a best possible model for each of the event and/or alarm periods, and modeling each of the event and/or alarm periods based on the determined best possible model. The best possible model may be determined, for example, by comparing each event and/or alarm period of the event and/or alarm periods with a previous event and/or alarm period of the event and/or alarm periods. As one example, an impact of each event and/or alarm period on the electrical system may be compared with the impact of a previous event and/or alarm period on the electrical system to determine the best possible model. For example, a current day/real-time number of alarms/events may be determined to have many more alarms/events than any of the previous days over the past five years (or another period of time). Additionally, a current day may be determined to have a sequence of events (SoE) which is ten (or another multiple) times larger than a previous SoE group. Both could generate the action of triggering a diagnostic report, for example, showing the discriminant differences to help identify and focus on what is going wrong, or at a minimum where something is going wrong, or when the alarms/events started.

In some embodiments, each of the modeled event and/or alarm periods may be classified, for example, as stable, rising or dropping based on an analysis of the modeled event and/or alarm periods. Additionally, or alternatively, each of the event and/or alarm periods may be classified though curve fitting techniques, for example, using one or more statistical or machine learning algorithms to provide an enriched or finer model. The statistical or machine learning algorithms may model slope or slope variations of the event and/or alarm periods, for example. A simple median model (and many other models and/or modeling techniques) may be used.

In some embodiments, a relative criticality score of each of the identified discriminant characteristics may be determined, for example, to a process or an application associated with the electrical system. In some embodiments, the relative criticality score may be determined for a particular time period. The particular time period may be associated with one or more of the event periods and/or alarm periods, for example. In some embodiments, the relative criticality score is based on an impact of the identified discriminant characteristics to the process or the application over the particular time period. As one example, the impact of the identified discriminant characteristics may be related to tangible or intangible costs associated with the identified discriminant characteristics to the process or the application. In some embodiments, the relative criticality score may be used to prioritize responding to the identified alarms.

In some embodiments, the relevant alarms or actions may be triggered, for example, by comparing a real time or time aggregated status of number and/or type of events and/or alarms and/or groups and/or sequences and/or periods and/or any aggregated information or discriminant characteristic, to a derived threshold or type from the model of any of the event and/or alarm periods. Additionally, in some embodiments the actionable information and recommendations for the system users to reduce the number of events/alarms may be derived from the groupings and the discriminant characteristics in a report or through an IED or any of the components of the MCS or any other system connected to the MCS.

In some embodiments, the identified events and/or the identified alarms are enriched with the normal behavior profiles derived from waveform captures associated with the energy-related signals and then are used as comparison for the discriminant dimensions identification and groupings, for example, using the waveform captures of normal operations (not events or alerts triggered), and the profiles derived which create "normal profiles" and store these in the digital repository. In some embodiments, these profiles may be lined to loads switching on/off or power consumption profiles as well as to other systems' status changes or processes. This then provides context to the current application for more complete or more precise diagnostics, recommendations, actions, especially when impacting other systems. This builds the layer of interpretation of the alerts/events/alarms, as it provides additional contextual information, thus providing more meaning, or help to identify possible or probable sources (such as using machine learning, AI algorithms to find most probable source or combination of sources to explain a change in status or in a change of value).

In some embodiments, the actions that are triggered or postponed in response to the identified event management groups or event and/or alarm periods include at least one of: shutting down or turning on at least one component in the electrical system, adjusting one or more parameters associated with the at least one component, selectively interrupting power at one or more locations in the electrical system, and generating an alarm or report. The at least one component may include at least one load (e.g., equipment or device) in the electrical system, for example. If a normal sequence or group of events is a first number of events (e.g., forty events), for example, and a new sequence or group of events is second, much larger number of events (e.g., one thousand events) over a particular period (e.g., two seconds), an action (or actions) may be triggered. The actions that are avoided in response to the identified event management groups or event and/or alarm periods may include launching a specific process step which would be normal in the schedule, for example.

In some embodiments, the actions are automatically performed by a control device of the MCS. The at least one IED may include the control device, or the control device may include the at least one IED, in some embodiments. In other embodiments, the at least one IED may be communicatively coupled with the control device, for example, in embodiments in which the control device includes, corresponds to, or is included in a user device or a diagnostic computing system. It is understood that the control device may take other forms as will be understood by one of ordinary skill in the art.

In another aspect of this disclosure, an MCS for managing smart alarms in an electrical system is provided. The MCS includes at least one IED including a processor and memory coupled to the processor. The processor and the memory of the at least one IED are configured to: process electrical measurement data from or derived from energy-related signals captured or derived by the at least one IED to identify power events in the electrical system, and to identify alarms triggered in response to the identified power events. Additionally, the processor and the memory of the at least one IED are configured to: aggregate information related to the identified power events and the identified alarms and identify relevant event management groups and/or relevant event and/or alarm periods from the aggregated information. The event management groups may include groups and/or sequences of the identified power events, and/or groups and/or sequences of alarm events triggered in response to the identified alarms. The processor and the memory of the at least one IED are further configured to: trigger, avoid or postpone triggering of one or more actions in response to the identified event management groups and/or the identified event and/or alarm periods.

In some embodiments, the at least one IED includes a plurality of IEDs arrange in a hierarchical configuration in the electrical system. In some embodiments, each IED of the plurality of IEDs is communicatively coupled to other IEDs of the plurality of IEDs, and each IED is configured to share electrical measurement data from or derived from energy-related signals derived or captured by the IED with the other IEDs. The shared electrical measurement data may be processed, for example, to identify the power events in the electrical system, and to identify the alarms triggered in response to the identified power events.

In some embodiments, the MCS includes at least one user device in communication with the at least one IED. In some embodiments, the at least one user device is capable of configuring the at least one IED.

In some embodiments, the processor and the memory of the at least one IED are further configured to: determine a relative criticality score of each of the identified discriminant characteristics to a process or an application associated with the electrical system over a particular time period. Additionally, in some embodiments the processor and the memory of the at least one IED are further configured to: use the determined relative criticality score to prioritize responding to the identified alarms.

In another aspect of this disclosure, an MCS for managing smart alarms in an electrical system includes at least one IED configured to capture or derive energy-related signals in the electrical system, and a diagnostic computing system (e.g., a cloud-based diagnostic computing system) communicatively coupled to the at least one IED. The diagnostic computing system includes a processor and memory coupled to the processor. The processor and the memory of the diagnostic computing system are configured to: process electrical measurement data from or derived from the energy-related signals captured or derived by the at least one IED to identify power events in the electrical system, and to identify alarms triggered in response to the identified power events. Additionally, the processor and the memory of the diagnostic computing system are configured to: aggregate information related to the identified power events and the identified alarms and identify relevant event management groups and/or relevant event and/or alarm periods from the aggregated information. The event management groups may include groups and/or sequences of the identified power events, and/or groups and/or sequences of alarm events triggered in response to the identified alarms. The processor and the memory of the diagnostic computing system are further configured to: trigger, avoid or postpone triggering of one or more actions in response to the identified event management groups and/or the identified event and/or alarm periods.

In some embodiments, the at least one IED includes a plurality of IEDs, and aggregating information related to the identified power events and the identified alarms includes aggregating information related to the identified power events and the identified alarms from the plurality of IEDs.

In some embodiments, the processor and the memory of the diagnostic computing system are further configured to: determine a relative criticality score of each of the identified discriminant characteristics to a process or an application associated with the electrical system over a particular time period. Additionally, in some embodiments the processor and the memory of the diagnostic computing system are further configured to: use the determined relative criticality score to prioritize responding to the identified alarms.

As used herein, an IED (e.g., of the above-discussed MCS) is a computational electronic device optimized to perform a particular function or set of functions. As discussed above, examples of IEDs include smart utility meters, power quality meters, and other metering devices. IEDs may also be imbedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, and the like. For example, where the IED is an electrical power monitoring device, it may be coupled to (or be installed in) an electrical power distribution system and configured to sense and store data as electrical parameters representing operating characteristics (e.g., voltage, current, waveform distortion, power, etc.) of the power distribution system. These parameters and characteristics may be analyzed by a user to evaluate potential performance, reliability or power quality-related issues. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem. For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software.

In a further embodiment, a method and system is provided for analyzing events and events flows for an electrical system. The method and system can include receiving an event stream(s) of events occurring in the electrical system, the events being identified from captured energy-related signals in the electrical system; analyzing, an event stream(s) of the events to identify different actionable triggers therefrom, the different triggers including a scenario in which a group of events satisfies one or more predetermined triggering conditions; analyzing, over time, the different actionable triggers to identify a combination of occurring and/or non-occurring actionable triggers which satisfies a predefined trigger combination condition and an analysis time constraint; and in response to the observation of the combination, taking one or more actions to address the events. The analysis time constraint can be a time period duration and/or sequence within which time-stamped data of events in the event stream(s) and the associated actionable triggers are considered or not in the analysis to identify the combination. The event streams(s) can be analyzed in real or semi-real time or based on all available time stamped events at the time of analysis.

In some embodiments, data of an event or actionable trigger which does not satisfy the analysis time constraint is considered invalid data. The invalid data can include data of an event or actionable trigger which is unavailable, missing, incomplete, delayed or received out of sequence when performing the analysis of the event stream(s) to identify an actionable trigger or a combination of occurring and/or non-occurring actionable triggers.

In some embodiments, the analysis time constraint can include a predefined time duration within which data of actionable triggers or their associated events are to be considered valid or invalid when performing the analysis of the event stream(s) to identify an actionable trigger or a combination of occurring and/or non-occurring actionable triggers. In one possible implementation, the analysis time constraint can be implemented using a running time window for analyzing the event stream(s) to identify an actionable trigger or a combination of occurring and/or non-occurring actionable triggers. The time window can incorporate a receipt delay period which defines an acceptable delay for receipt of data to be considered in the event stream analysis. The analysis time constraint can further include a predefined timing sequence in which actionable triggers and their associated events are to be considered valid or invalid when performing the analysis of the event stream(s) to identify an actionable trigger or a combination.

In some embodiments, the analysis time constraint can include a time condition in which data of any events or actionable triggers having the same time-stamp are considered invalid as contradictory data. The analysis time constraint can also include a time condition in which the event data stream(s) includes incomplete event data. The method and system can further involve substituting incomplete event data with complementary event data from the event data stream(s) for the purpose of performing the event stream analysis.

In some embodiments, the method and system can further involve characterizing the events as normal or abnormal events based on at least one of: location(s) of the events, process steps related to events, time of occurrence, processing time, a rate of events, stream of events, severity(ies) of the events, impact of the events, and type(s) of the events. The event stream(s) can include a stream(s) of normal and abnormal events. The one or more predetermined triggering conditions can include: a rate at which the abnormal events are occurring in the electrical system exceeding an acceptable level based on the electrical system's current configuration, a rate at which the severity(ies) or derived impact of the events are increasing in the electrical system exceeding an acceptable level based on the electrical system's current configuration, a rate at which normal events are turning into abnormal events exceeding an acceptable level based on the electrical system's current configuration, or changes in the location(s) of the events in the electrical system exceeding an acceptable level based on the electrical system's current configuration.

In another embodiment, a method and system are provided for analyzing events in an electrical system. The method and system involve receiving an event stream(s) of events occurring in the electrical system, the events being identified from captured energy-related signals in the electrical system; characterizing, in real or semi-real time, the events as normal or abnormal events based on at least one of location(s) of the events, process steps related to events, severity(ies) of the events, and type(s) of the events; observing, over a predetermined time period, at least one of: a rate at which the abnormal events are occurring in the electrical system, a rate at which the severity(ies) of the events are increasing in the electrical system, a rate at which normal events are turning into abnormal events, and changes in the location(s) of the events in the electrical system; and in response to the at least one of: the rate at which the abnormal events are occurring in the electrical system, the rate at which the severity(ies) of the events are increasing in the electrical system, the rate at which normal events are turning into abnormal events, and the changes in the location(s) of the events in the electrical system, exceeding an acceptable level based on the electrical system's current configuration, taking one or more actions to address the events.

In some embodiments, each event has a first time stamp associated with a time at which the event is identified by at least one IED, and a second time stamp indicating when the event data for the identified event is received by the system/IED performing the processing, analysis, and storage. The method and system can further involve evaluating the first and second time stamps for the received identified events over time to identify timing issues (e.g., sudden delays, or steady drifts over time) with the event stream(s). The method and system can further involve identifying the possible or probable causes and impacts, and then trigger actions related to the causes and possible and probable impacts.

Additional objects and advantages will be set forth in part in the description which follows, and in part will be obvious from the description, or may be learned by practice of the present disclosure. At least some of these objects and advantages may be realized and attained by the elements and combinations particularly pointed out in the disclosure.

It is to be understood that both the foregoing general description and the following detailed description are exemplary and explanatory only and are not restrictive of the invention, as disclosed.

BRIEF DESCRIPTION OF THE DRAWINGS

The foregoing features of the disclosure, as well as the disclosure itself may be more fully understood from the following detailed description of the drawings, in which:

FIGS. 11-111B and -12 illustrate various plots that may be generated in accordance with embodiments of the disclosure;

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
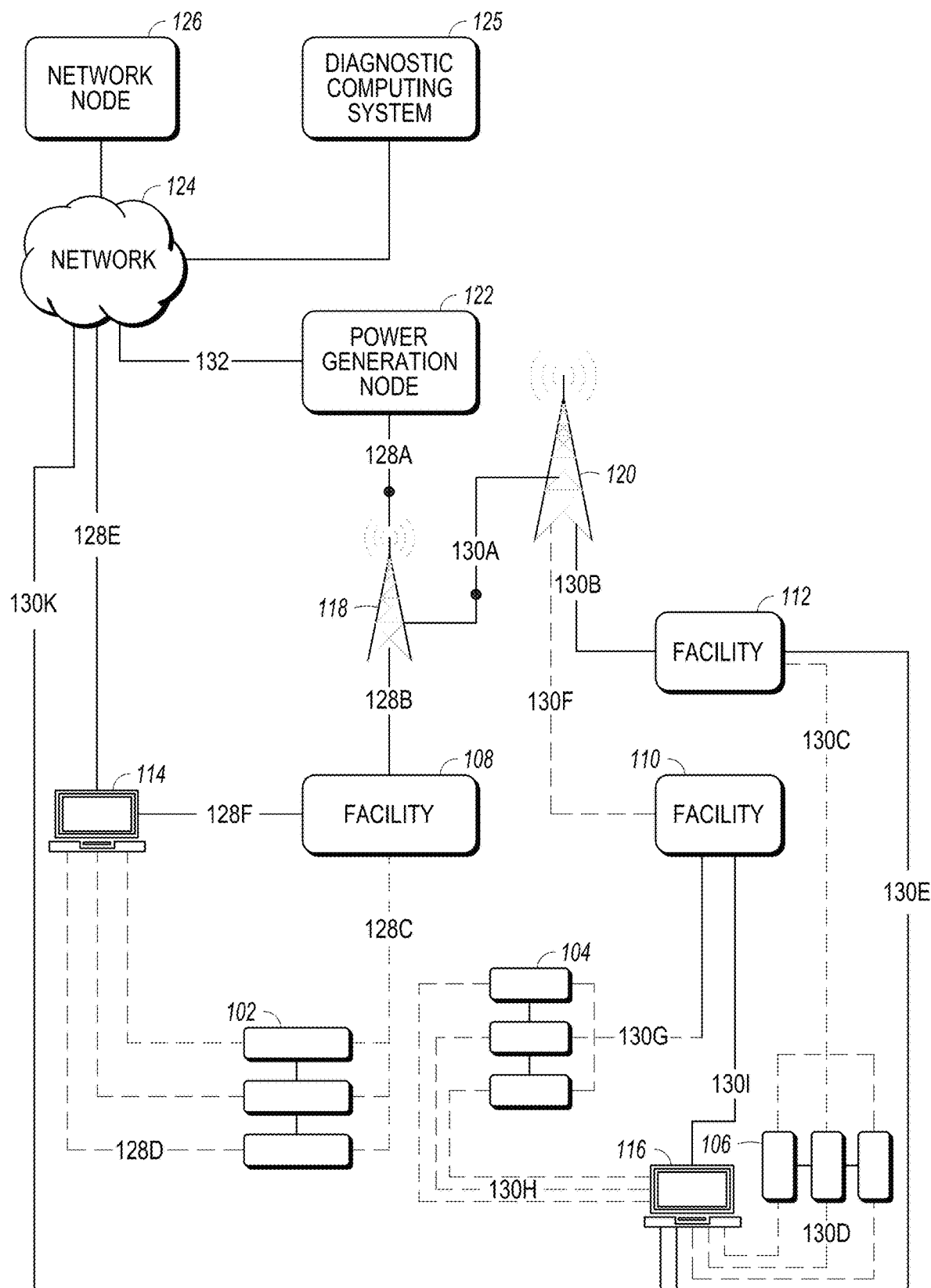
FIG. 1 shows an example network system architecture in accordance with embodiments of the disclosure.

Referring to FIG. 1, there is depicted a schematic view of an exemplary network system architecture configured to perform among other things intelligent event and/or alarm analysis and management. The architecture includes an electrical or power monitoring architecture and control system (MCS) including one or more network nodes 126 and user devices 114 and 116 to monitor and control equipment or other devices 102, 104 and 106 of the facilities 108, 110 and 112. The network system architecture also includes an electrical or power system including a power generation node(s) 122 to supply power to the facilities 108, 110 and 112 across a power distribution network of a utility, e.g., power grids 118 and 120, and the facilities 108, 110 and 112. The facilities 108, 110 and 112 can be an automated industrial facility or include automated industrial equipment, or be a commercial building or university campus, as one example amongst many others. The systems and devices in the network architecture can use a local area network (LAN), wide area network (WAN), or internetwork (including the Internet) to communicate over a communication network 124. The communication network 124 can be a wired and/or wireless network that uses, for example, physical and/or wireless data links to carry network data among (or between) the network nodes.

Each network node 126 can include a computer system, such as an intelligent electronic device (IED), to sense, monitor, capture and analyze energy-related data on the electrical system. In accordance with the various embodiments, the IED can capture signal waveforms representative of voltage, current, power or other measurable electrical property on the electrical system, create power event profiles, perform event analysis to identify power events and additional information including alarms triggered in response to power events, and perform other operations as part of the systems and methods for managing smart alarms described herein. The IED can be a smart device such as a smart power meter or other power equipment, or be incorporated into or associated with a power meter or other power equipment on the electrical system. The architecture can include a plurality of IEDs arranged at different upstream and downstream positions in a hierarchical level or layer relationship on the electrical system (e.g., as shown in FIG. 1B, as will be discussed below) to monitor, derive or calculate, analyze and share energy-related information (e.g., measurement data, derived data, event data and additional information, results of event analysis, event profiles, etc.) at any desired position along the electrical system, including positions along the grid, between the utility and a facility, and within the facility. Each of the IEDs may be installed at a respective metering point or location of a plurality of metering points or locations in the electrical system (e.g., as shown in FIG. 1B, as will be discussed below).

In some embodiments, a user may view information about the IEDs (e.g., IED make, model, type, etc.) and data collected by the IEDs (e.g., energy usage statistics) using at least one of the user devices 114 and 116. Additionally, in some embodiments the user may configure the IEDs using at least one of the user devices 114 and 116. Each user device 114 and 116 can include a computing device, for example, a desktop computer, a laptop computer, a handheld computer, a tablet computer, a smart phone, and/or the like. Additionally, each user device 114 and 116 can include or be coupled to one or more input/output devices, for example, to facilitate user interaction with the IEDs (e.g., to view information about the IEDs).

In some embodiments, the MCS may also include, or be communicatively coupled to, a diagnostic computing system 125 via the communication network 124. In some embodiments, the above-discussed IEDs and user devices 114 and 116 of the MCS may be directly communicatively coupled to the diagnostic computing system 125. In other embodiments, the IEDs and user devices 114 and 116 may be indirectly communicatively coupled to the diagnostic computing system 125, for example, through an intermediate device, such as a cloud-connected hub or a gateway. The cloud-connected hub (or the gateway) may, for example, provide the IEDs and the user devices 114 and 116 with access to the diagnostic computing system 125.

The diagnostic computing system 125 may be an example of a cloud computing system, or cloud-connected computing system. In embodiments, the diagnostic computing system may be a server located within one or more of the facilities 108, 110 and 112, or may be remotely-located cloud-based service. The diagnostic computing system 125 may include computing functional components similar to those of the IEDs is some embodiments, but may generally possess greater numbers and/or more powerful versions of components involved in data processing, such as processors, memory, storage, interconnection mechanisms, etc. The diagnostic computing system 125 can be configured to implement a variety of analysis techniques to identify patterns in received measurement data from the IEDs, as discussed further below. The various analysis techniques discussed herein further involve the execution of one or more software functions, algorithms, instructions, applications, and parameters, which are stored on one or more sources of memory communicatively coupled to the diagnostic computing system 125. In certain embodiments, the terms "function", "algorithm", "instruction", "application", or "parameter" may also refer to a hierarchy of functions, algorithms, instructions, applications, or parameters, respectively, operating in parallel and/or tandem. A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the diagnostic computing system 125 is connected to the cloud, it may access additional cloud-connected devices or databases (not shown) via the cloud. For example, the diagnostic computing system 125 may access historical measurement data previously received from the at least one IED, historical power event and/or alarm data, or other data that may be useful in analyzing current measurement data received from the at least one IED. In embodiments, the cloud-connected devices or databases may correspond to a device or database associated with one or more external data sources.

In embodiments, by leveraging the cloud-connectivity and enhanced computing resources of the diagnostic computing system 125 relative to the IEDs, sophisticated analysis can be performed on data retrieved from one or more IEDs, as well as on additional sources of data that may be received (e.g., from other devices in the electrical system, such as humidity and temperature sensors), when appropriate. This analysis can be used to dynamically control one or more parameters, processes, conditions or devices (e.g., 102, 104 and 106) associated with the electrical system.

In embodiments, the parameters, processes, conditions or equipment are dynamically controlled by one or more control devices of the MCS. In embodiments, the control devices may correspond to, include, or be included one or more of the above-discussed IEDs, diagnostic computing system and/or other devices within or external to the electrical system.

It is understood that the network architecture shown in FIG. 1 is but one example network architecture of many potential network architectures that may suitable for the systems and methods described herein. Any suitable network architecture may be used, which allows for communication and interaction between components of the MCS (e.g., IEDs, diagnostic computing system, user devices, etc.), equipment or loads, facilities, etc. to perform the operations described herein. For example, the systems and methods herein, including but not limited to the identification of power events, and the identification of alarms triggered in response to the power events, can be implemented through a cloud-based architecture via one or more network nodes.

Figure 1A:
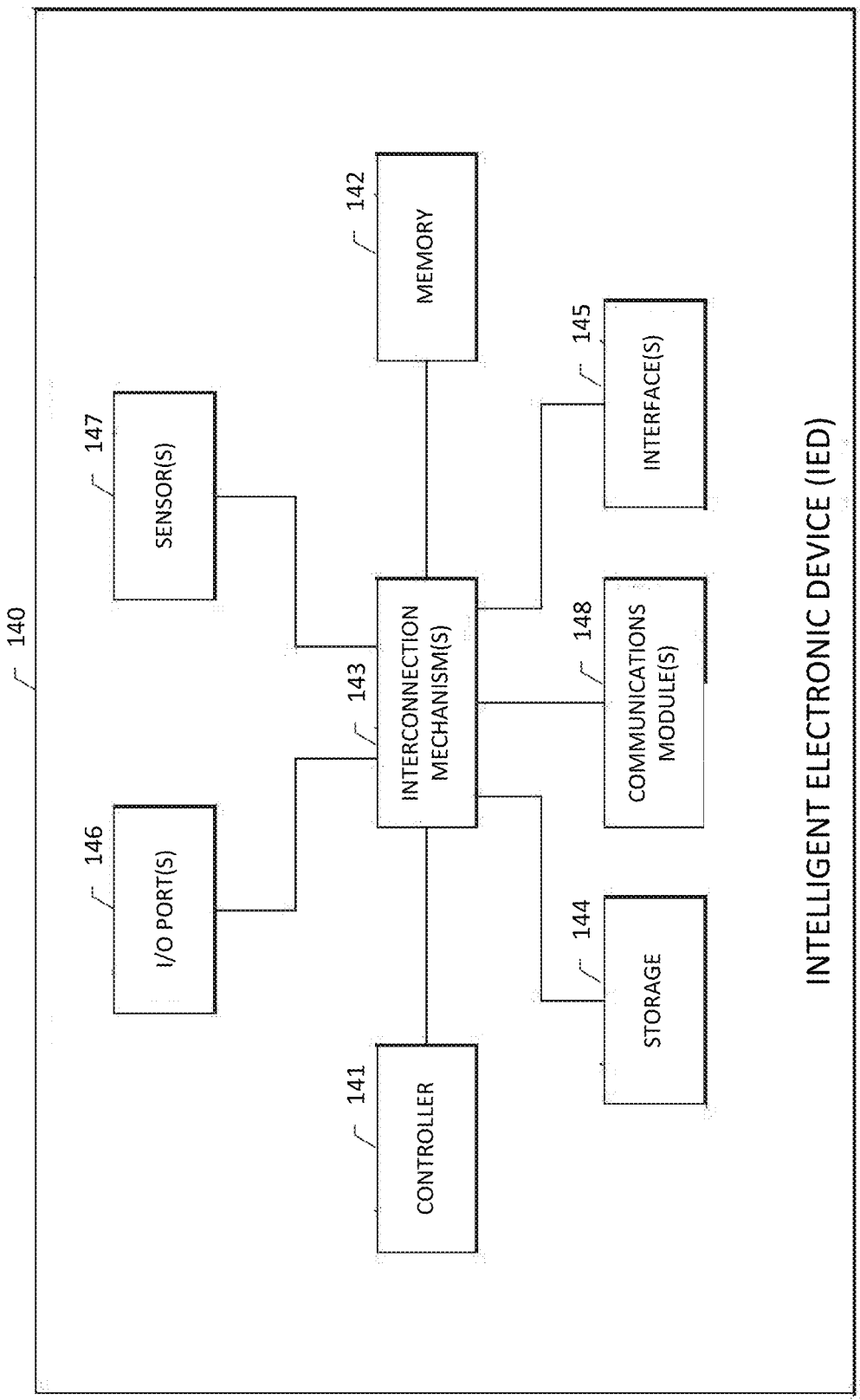
FIG. 1A shows an example intelligent electronic device (IED) that may be used in a network system in accordance with embodiments of the disclosure.
Figure 1B:
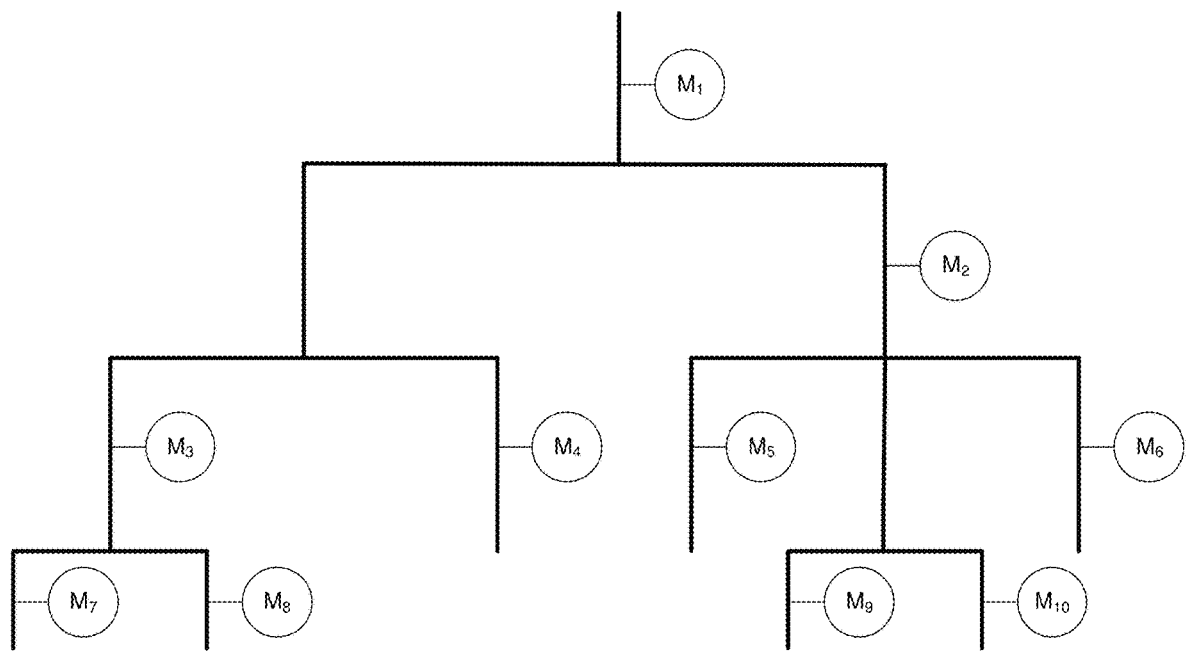
FIG. 1B shows an example configuration of IEDs in accordance with embodiments of the disclosure.

Referring to FIG. 1A, an example IED 140 that may be suitable for use in the network system architecture 100 shown in FIG. 1, for example, includes a controller 141, a memory device 142, storage 144, and an interface 145. The IED 140 also includes an input-output (I/O) port 146, a sensor 147, a communication module 148, and an interconnection mechanism 143 for communicatively coupling two or more IED components 141-148.

The memory device 142 may include volatile memory, such as DRAM or SRAM, for example. The memory device 142 may store programs and data collected during operation of the IED 140. For example, in embodiments in which the IED 140 is configured to monitor or measure one or more electrical parameters associated with one or more devices or loads in an electrical system, the memory device 142 may store the monitored electrical parameters (e.g., from energy-related signals captured or derived by the IED 140).

The storage system 144 may include a computer readable and writeable nonvolatile recording medium, such as a disk or flash memory, in which signals are stored that define a program to be executed by the controller 141 or information to be processed by the program. The controller 141 may control transfer of data between the storage system 144 and the memory device 142 in accordance with known computing and data transfer mechanisms. In embodiments, the electrical parameters monitored or measured by the IED 140 may be stored in the storage system 144.

The I/O port 146 can be used to couple loads (e.g., 111, shown in FIG. 1A) to the IED 140, and the sensor 147 can be used to monitor or measure the electrical parameters associated with the loads. The I/O port 146 can also be used to coupled external devices, such as sensor devices (e.g., temperature and/or motion sensor devices) and/or user input devices (e.g., local or remote computing devices) (not shown), to the IED 140. The I/O port 146 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the IED 140.

The communication module 148 may be configured to couple the IED 140 to one or more external communication networks or devices. These networks may be private networks within a building in which the IED 140 is installed, or public networks, such as the Internet. In embodiments, the communication module 148 may also be configured to couple the IED 140 to a cloud-connected hub, or to a cloud-connected central processing unit, associated with a network system architecture including IED 140.

The IED controller 141 may include one or more processors that are configured to perform specified function(s) of the IED 140. The processor(s) can be a commercially available processor, such as the well-known Pentium™, Core™, or Atom™ class processors available from the Intel Corporation. Many other processors are available, including programmable logic controllers. The IED controller 141 can execute an operating system to define a computing platform on which application(s) associated with the IED 140 can run.

In embodiments, the electrical parameters monitored or measured by the IED 140 may be received at an input of the controller 141 as IED input data, and the controller 141 may process the measured electrical parameters to generate IED output data or signals at an output thereof. In embodiments, the IED output data or signals may correspond to an output of the IED 140. The IED output data or signals may be provided at I/O port(s) 146, for example. In embodiments, the IED output data or signals may be received by a diagnostic computing system, for example, for further processing (e.g., to identify power events, as briefly discussed above in connection with FIG. 1), and/or by equipment (e.g., loads) to which the IED is coupled (e.g., for controlling one or more parameters associated with the equipment, as will be discussed further below). In one example, the IED 140 may include an interface 145 for displaying visualizations indicative of the IED output data or signals. The interface 145 may correspond to a graphical user interface (GUI) in embodiments.

Components of the IED 140 may be coupled together by the interconnection mechanism 143, which may include one or more busses, wiring, or other electrical connection apparatus. The interconnection mechanism 143 may enable communications (e.g., data, instructions, etc.) to be exchanged between system components of the IED 140.

It is understood that IED 140 is but one of many potential configurations of IEDs in accordance with various aspects of the disclosure. For example, IEDs in accordance with embodiments of the disclosure may include more (or fewer) components than IED 140. Additionally, in embodiments one or more components of IED 140 may be combined. For example, in embodiments memory 142 and storage 144 may be combined.

Referring to FIG. 1B, an example configuration (e.g., a hierarchical configuration) of IEDs such as IED 140 in an electrical system is shown. As discussed above, an electrical system typically includes one or more metering points or locations. As also discussed above, one or more IEDs may be installed or located (temporarily or permanently) at the metering locations, for example, to measure, protect and/or control a load or loads in the electrical system.

The illustrated electrical system includes a plurality of metering locations (here, $M_1$, $M_2$, $M_3$, etc.). In embodiments in which the electrical system is a "completely metered" system, for example, at least one IED is installed at the first metering location $M_1$, at least one IED is installed at the second metering location $M_2$, and so forth. Connection 1 is a physical point in the electrical system where energy flow (as measured at $M_1$ by the at least one IED installed at $M_1$) diverges to provide energy to the left electrical system branch (associated with metering locations $M_3$, $M_4$, $M_7$, $M_8$) and the right electrical system branch (associated with metering locations $M_2$, $M_5$, $M_6$, $M_9$, $M_{10}$). In accordance with some embodiments of this disclosure, as will be discussed further below, the IEDs installed at the various metering locations (here, $M_1$, $M_2$, $M_3$, etc.) may share electrical measurement data from or derived from energy-related signals captured by or derived from the IEDs. The shared electrical measurement data may be used, for example, to identify power events in the electrical system, and to identify alarms triggered in response to the identified power events. For example, IEDs installed at metering locations $M_7$, $M_8$ may share electrical measurement data with an IED installed at metering location $M_3$ to identify power events at metering location $M_3$, and to identify alarms triggered in response to the identified power events at metering location $M_3$.

In the illustrated example, the IED installed at metering location M3 is considered to be "upstream" from the IEDs installed at metering locations M7, M8. Additionally, in the illustrated example, the IEDs installed at metering locations M7, M8 are considered to be downstream relative to the IED installed at metering location M3. As used herein, the terms "upstream" and "downstream" are used to refer to electrical locations within an electrical system. More particularly, the electrical locations "upstream" and "downstream" are relative to an electrical location of an IED collecting data and providing this information. For example, in an electrical system including a plurality of IEDs, one or more IEDs may be positioned (or installed) at an electrical location that is upstream relative to one or more other IEDs in the electrical system, and the one or more IEDs may be positioned (or installed) at an electrical location that is downstream relative to one or more further IEDs in the electrical system. A first IED or load that is positioned on an electrical circuit upstream from a second IED or load may, for example, be positioned electrically closer to an input or source of the electrical system (e.g., a utility feed) than the second IED or load. Conversely, a first IED or load that is positioned on an electrical circuit downstream from a second IED or load may be positioned electrically closer to an end or terminus of the electrical system than the other IED. The above-described first and second IEDs can record an electrical event's voltage and current phase information (e.g., by sampling the respective signals) and communicatively transmit this information to a diagnostic computing system (e.g., 125, shown in FIG. 1). The diagnostic computing system may then analyze the voltage and current phase information (e.g., instantaneous, root-mean-square (rms), waveforms and/or other electrical characteristics) to determine if the source of the voltage event was electrically upstream or downstream from where the first and/or second IEDs are electrically coupled to the electrical system (or network), for example, to determine a direction of a power event (i.e., upstream or downstream).

It is understood that the above-discussed configuration or arrangement of IEDs is but one of many potential configurations of IEDs in an electrical system.

Figure 2:
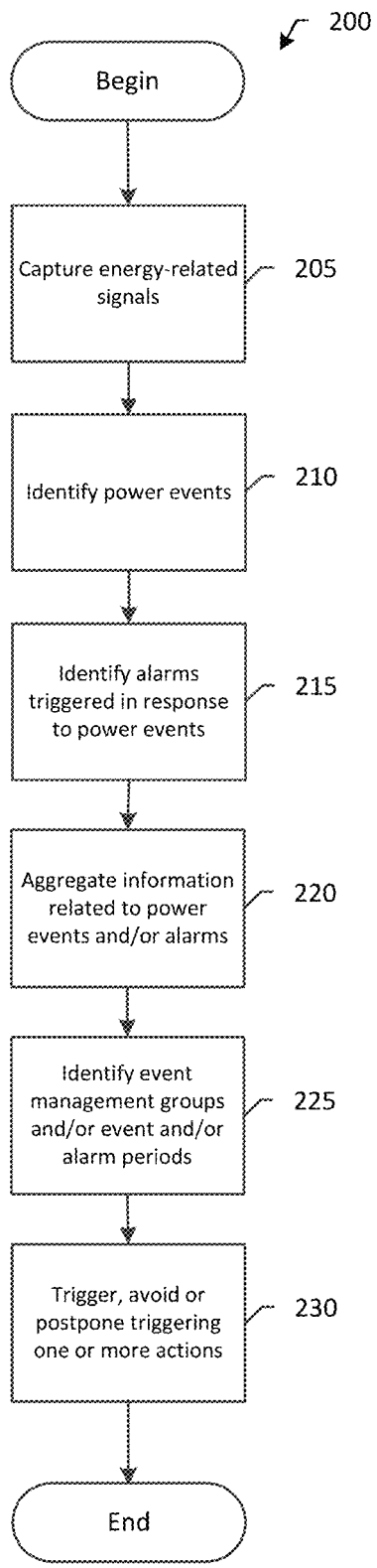
FIG. 2 shows an example method for managing smart alarms in accordance with embodiments of the disclosure.

Referring to FIG. 2 and figures below, several flowcharts (or flow diagrams) are shown to illustrate various methods of the disclosure. Rectangular elements (typified by element 205 in FIG. 2), as may be referred to herein as "processing blocks," may represent computer software and/or IED algorithm instructions or groups of instructions. Diamond shaped elements, as may be referred to herein as "decision blocks," represent computer software and/or IED algorithm instructions, or groups of instructions, which affect the execution of the computer software and/or IED algorithm instructions represented by the processing blocks. The processing blocks and decision blocks can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with "smart alarms" sought to be protected by this disclosure.

Referring to FIG. 2, a flowchart illustrates an example method 200 for managing smart alarms in an electrical/power system. The method 200 may be implemented, for example, on a processor of at least one IED (e.g., 121, shown in FIG. 1A) in the electrical/power system, a processor of a diagnostic computing system (e.g., 125, shown in FIG. 1) in the electrical/power system, and/or remote from the at least one IED and the diagnostic computing system, e.g., on a cloud computing device. The at least one IED, the diagnostic computing system and/or other devices on which the method 200 may be implemented may be included, or associated with, a monitoring and control system (MCS) in the electrical/power system, as discussed above in connection with FIG. 1, for example.

As illustrated in FIG. 2, the method 200 begins at block 205, where energy-related signals (or waveforms) are captured or derived by at least one IED in the electrical/power system. The at least one IED may be installed or located (temporality or permanently) at respective metering location in the electrical/power system, and the energy-related signals may be associated with the respective metering location (or one or more loads installed at the respective metering location). In some embodiments, the respective metering location may be a respective metering location of a plurality of metering locations in the electrical/power system, for example, in embodiments in which the at least one IED includes a plurality of IEDs. In these embodiments, the energy-related signals may be captured or derived by the plurality of IEDs at each of the respective plurality of metering locations. For example, a first one of the IEDs may be installed or located at a first metering location in the electrical/power system (e.g., $M_1$, shown in FIG. 1B), and the energy-related signals captured by the first IED may be captured at the first metering location, or derived from measurements taken at the first metering location. Additionally, a second one of the IEDs may be installed or located at a second metering location in the electrical/power system (e.g., $M_2$, shown in FIG. 1B), and the energy-related signals captured by the second IED may be captured at the second metering location, or derived from measurements taken at the second metering location.

The energy-related signals measured or derived by the at least one IED may include, for example, at least one of: voltage, current, energy, active power, apparent power, reactive power, harmonic voltages, harmonic currents, total voltage harmonic distortion, total current harmonic distortion, harmonic power, individual phase currents, three-phase currents, phase voltages, and line voltages as a few examples. It is understood that other types of energy-related signals may be captured or derived by the at least one IED.

At block 210, electrical measurement data from or derived from the energy-related signals captured or derived by the at least one IED at block 205, is processed (e.g., on the at least one IED, on the diagnostic computing system, and/or remote from the at least one IED and the diagnostic computing system) to identify power events in the electrical/power system. The identified power events may be associated with the metering location(s) in which the at least one IED is installed, a load or loads (e.g., 102, 104, 106, shown in FIG. 1) monitored by the at least one IED, and/or other portions (e.g., remote portions) or devices of the electrical/power system.

In some embodiments, identifying the power events includes identifying power quality event types of the of the power events. The power quality event types may include, for example, at least one of: a voltage sag, a voltage swell, a voltage or current transient, a temporary interruption, and voltage or current harmonic distortion as a few examples. It is understood that other types of power quality events may be identified.

Identifying the power events may additionally or alternatively include identifying a magnitude (or magnitudes) of the power events, a duration (or durations) of the power events, a location (or locations) of the power events in the electrical/power system, and/or other information that may be helpful for identifying alarms (i.e., smart alarms) triggered in response to the identified power events, e.g., at block 215, as will be discussed further below. In some embodiments, the magnitude(s), duration(s), location(s) and/or other information may be determined based on electrical measurement data from or derived from energy-related signals captured or derived by a plurality of IEDs, for example, in embodiments in which the at least one IED includes a plurality of IEDs located at a respective plurality of metering location in the electrical/power system. For example, the plurality of IEDs may share the energy-related signals captured or derived by the plurality of IEDs with select ones of the plurality of IEDs (or the diagnostic computing system), and the shared energy-related signals may be used to determine the magnitude(s), duration(s), location(s) and/or other information associated with the identified power event. This may include determining differences between the different measured levels of disturbances of power quality events (e.g., the magnitude or duration) as they propagate through the electrical/power system as this may be inferred from the energy-related signals and the location of each IED. In some embodiments, the energy-related signals captured or derived by the plurality of IEDs may be stored on a memory device associated with the plurality of IEDs, on a memory device associated with a diagnostic computing system, and/or on another memory device depending on the implementation of the method 200 (e.g., on the at least one IED, on the diagnostic computing system, and/or on another device or system).

At block 215, it is determined if any alarms have been, or should be, triggered in response to the identified power events. In some embodiments, alarms may be triggered (e.g., automatically, or semi-automatically) in response to the identified power events. For example, a load monitored by an IED in the electrical/power system may have an upper alarm threshold and/or a lower alarm threshold, and an alarm (or alarms) may be triggered in response to voltage and/or current signals captured by the IED, e.g., at block 205, being above the upper alarm threshold and/or below the lower alarm threshold. An anomalous voltage condition, for example, which is one example type of power event, corresponds to a measured IED voltage being above one or more upper alarm thresholds or below one or more lower alarm thresholds. In some embodiments, an alarm (or alarms) may be triggered in response to the anomalous voltage condition. In some embodiments, the upper alarm thresholds and the lower alarm thresholds, e.g., associated with anomalous voltage condition and/or other power events, align with a recommended operational range of one or more loads, processes, and/or systems monitored by the IEDs in the electrical/power system.

An alarm trigger may result in one or more portions (e.g., loads) of the electrical/power system being controlled, e.g., automatically by the IED, diagnostic computing device, and/or other system(s) or device(s) on which the method 200 is implemented. For example, an alarm trigger may result in a load monitored by the IED being adjusted (e.g., turned off, or having one or more parameters adjusted).

Additionally, or alternatively, an alarm trigger may result in a notification or alert indicting the alarm being sent to one or more devices or systems of the MCS, for example. In some embodiments, the MCS, or a user of the MCS, may take an action (or actions) in response to the notification or alert. Example actions may include controlling the above-mentioned one or more portions of the electrical/power system, or delaying, changing the sequence or even postponing a process in another system (e.g., in a Power SCADA system, or in a building management system, or in a manufacturing SCADA system, are but few examples). It is understood that other actions may, of course, be performed.

At block 220, information relating to the identified power events and/or alarms is aggregated (e.g., the number of daily events or alarms, or the number of groups of time-wise-overlapping events, or the impact on the downstream loads, are but few examples among many others). The information relating to the power events and/or alarms may be aggregated, for example, for a particular time period or interval, e.g., daily, as shown by plot 300 in FIG. 3, as will be described further below, or hourly, weekly, monthly, etc. Additionally, or alternatively, the information relating to the power events and/or alarms may be aggregated based on type of power event, type of alarm, metering location(s), type of load, type of IED, criticality of an alarm to a particular process or application, etc. The aggregated information may indicate a number (or frequency) of occurrences of a power event and/or alarms for a particular time period. Additionally, the aggregated information may indicate a number (or frequencies) of occurrences of a power event and/or alarms based on the type of power event, type of alarm, metering location(s), type of load, type of IED, etc.

Figure 3:
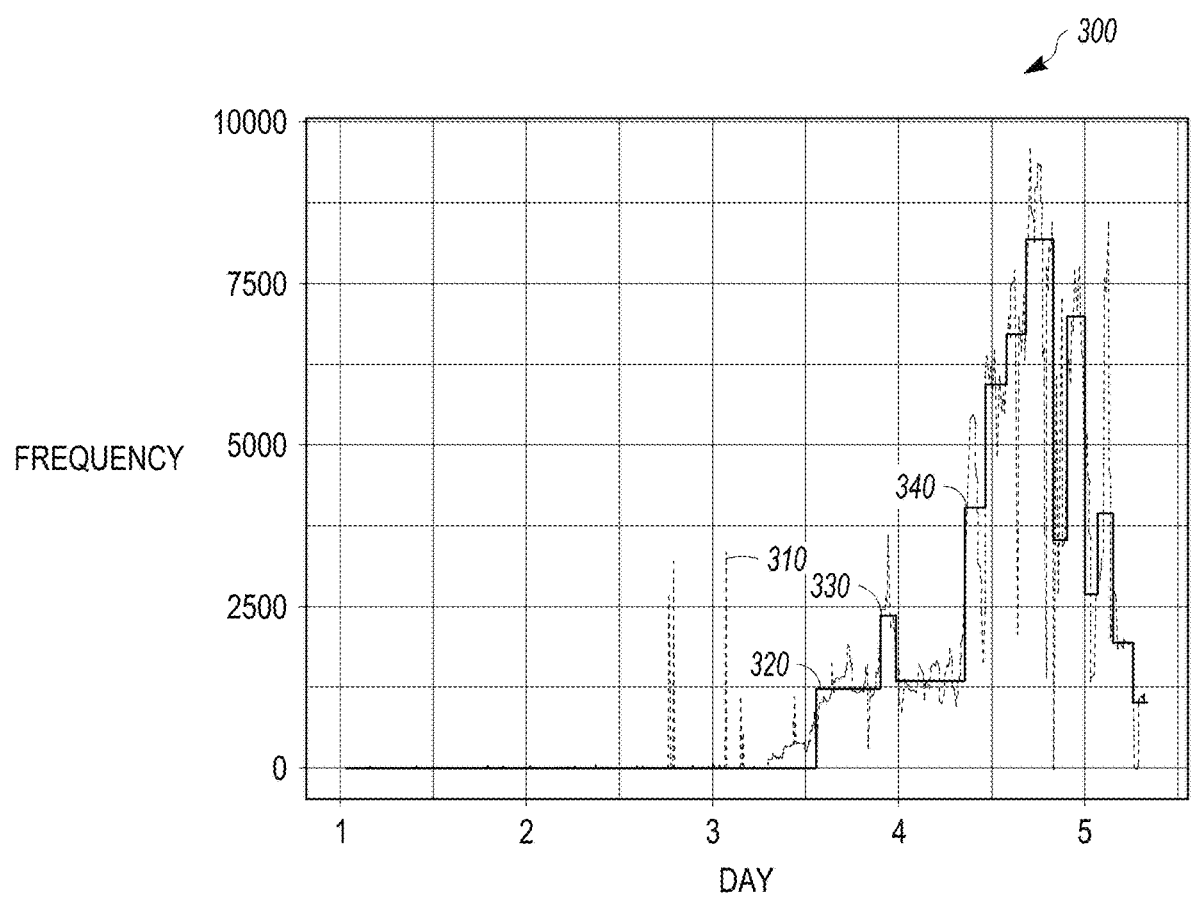
FIG. 3 illustrates an example plot that may be generated in accordance with embodiments of the disclosure.

As one example, the aggregated information may include an aggregated sum (or count) of power events and/or alarms for a day, as shown in FIG. 3. The aggregated sum may, for example, indicate or be interpreted to determine whether the number of power events and/or alarms is within acceptable limits. Additionally, in some cases, the aggregated sum may indicate whether an operator of a facility (e.g., 108, 110, 112, shown in FIG. 1) in which the at least one IED is capturing or deriving energy-related signals, has lost or is at risk of losing control of the alarms of the facility (e.g., due to the aggregated sum being above an acceptable threshold). As one example, an aggregated sum of hundreds of alarms over a one-day period may indicate the facility operator has lost control of the facility's events/alarms. In some embodiments, the aggregated information (and the aggregated sum) may be stored on a memory device associated with the at least one IED, diagnostic computing system, and/or other system(s) or device(s) on which the method 200 is implemented.

As apparent from discussions above, in some embodiments the aggregated information may be plotted, as illustrated by plot 300 shown in FIG. 3. However, it is understood that in some embodiments the aggregated information does not need to be plotted or otherwise visualized. In embodiments in which the aggregated information is plotted, the plot may be presented, for example, on a display device of a user device (e.g., 114, shown in FIG. 1) and/or a display device of another device of or associated with the MCS and/or included in a report and/or a notification sent to a user.

At block 225, relevant event management groups and/or relevant event and/or alarm periods are identified from the aggregated information. In accordance with various aspects of this disclosure, the event management groups include groups and/or sequences of the identified power events, and/or groups and/or sequences of alarm events triggered in response to the identified alarms. Groups and/or sequences of the power events may include, for example, groups and/or sequences of the power events occurring over a particular time period, in a particular metering location, etc. Additionally, groups and/or sequences of the alarm events may include groups and/or sequences of alarm events occurring over a particular time period, in a particular metering location, etc. In accordance with various aspects of this disclosure, the alarm events correspond to events resulting from the triggering of multiple alarms, e.g., from the alarms identified at block 215.

The relevant event and/or alarm periods identified from the aggregated information may be predetermined periods, e.g., daily periods, extracted from the aggregated information in some embodiments. Additionally, in some embodiments the relevant periods are identified or selected based on detected changes in relevant data from the aggregated information. As one example, the relevant periods may be identified based on breakpoints identified in the aggregated information. Breakpoints (e.g., 320, 330, 340, shown in FIG. 3) correspond to "significant" change points in the aggregated information, for example, separating one event and/or alarm period from a next event and/or alarm period. Additional aspects of breakpoints are described further below in connection with FIG. 4, for example.

At block 225, outliers or extreme (or obvious) outliers may also be identified in the aggregated information in some embodiments (e.g., for refining the aggregated information prior to the event management groups and/or event and/or alarm groups being identified from the aggregated information, or to perform specific analysis on these groups of outliers, such as inferring patterns to provide the maintenance team with more actionable recommendations in a periodic report). As used herein, "outliers" and "extreme outliers" refer to data in the aggregated information that does fit within normal boundaries or acceptable limits of the aggregated information (i.e., is not normal data). To determine what is an "outlier" or an "extreme outlier", the system may use simple statistical calculations and rules (e.g., the standard approach of comparing each data points value with the median value +/−1.5*IQR for an "outlier" and median+ 3*IQR for an "extreme outlier" (of all the data points of the group/period). The IQR being the Inter-Quantile Ratio, the value between the $75^{th}$ and the $25^{th}$ percentile) or some more advance techniques (e.g., DBSCAN or Isolation Forest algorithms).

Referring again briefly to FIG. 3, the data at or around point 310 in the plot 310 is an example of an extreme outlier. In some embodiments in which the aggregated information is analyzed to identify extreme outliers in the information, data associated with the extreme outliers may be removed from the aggregated information (e.g., prior to the event management groups and/or event and/or alarm groups being identified from the aggregated information). Removing such "outliers" or "extreme outliers" is simple if in the previous step this distinction was made and each of the outlier points/values was tagged as such (e.g., "outlier" or "extreme outlier" tags). In some embodiments, the extreme outliers are identified in each event and/or alarm period. For example, an extreme outlier in one period may not be an outlier in another period. As such, pattern analysis may show that some extreme outliers may have been early warnings or the first "weak signals" of a new issue, generating many new events/alarms.

Returning to method 200, at block 230, which is optional in some embodiments, one or more actions may be triggered, avoided or postponed in response to or based on the event management groups and/or the event and/or alarm periods identified at block 225. The actions, preventative or otherwise, may affect at least one component of the electrical/power system, for example, a load (e.g., 120, shown in FIG. 1) in the electrical/power system. As one example, the actions that are triggered or postponed may include shutting down or turning on the at least one component or adjusting one or more parameters associated with the at least one component. For example, a threshold can be created so when earth leakage current (i.e., current going to the ground) reaches the threshold, at least one component responsible for the earth current leakage may be shut down, and in some cases be disconnected (or otherwise decoupled) from the electrical/power system.

In some embodiments, the actions that are triggered or postponed may also include selectively interrupting power at one or more location in the electrical/power system, generating an alarm or report, shutting off something in a manufacturing process or taking preventative action, as a few further examples. Additionally, the actions that are avoided may include launching a specific process or step which would be normal in the schedule, as an example. As one example of such "postponing a normal process steps" in a Power SCADA environment, not energizing a capacitor bank while voltage is already lower than normal due to some other load, process or action would be an illustration. As another example, delaying turning on the HVAC rooftop unit while some heavy motor is started in the manufacturing plant may be an illustration in another domain.

In some embodiments, the actions that are triggered, avoided or postponed are automatically performed by a control device of the MCS. In some embodiments, the at least one IED responsible for capturing the energy-related signals, e.g., at block 205, includes the control device. In other embodiments, one or more other portions of the MCS includes the control device. For example, in some embodiments the diagnostic computing system of the MCS may include the control device.

Subsequent to block 230 (or 225), the method may end in some embodiments. In other embodiments, the method may return to block 205 and repeat again. For example, in embodiments in which it is desirable to continuously (or semi-continuously) capture energy-related signals and to dynamically analyze these captured energy-related signals for power events and/or alarms, the method may return to block 205. Alternatively, in embodiments in which it is desirable to analyze a single set of captured energy-related signals, for example, the method may end. In some embodiments in which the method ends after block 230 (or 225), the method may be initiated again in response to user input and/or a control signal, for example.

It is understood that method 200 may include one or more additional blocks in some embodiments. For example, the method 200 may include identifying discriminant characteristics associated with the aggregated information (i.e., the aggregated information from block 220), and determining a relative criticality score of each of the identified discriminant characteristics to a process or an application associated with the electrical/power system, as described further below in connection with FIG. 4, for example.

Figure 4:
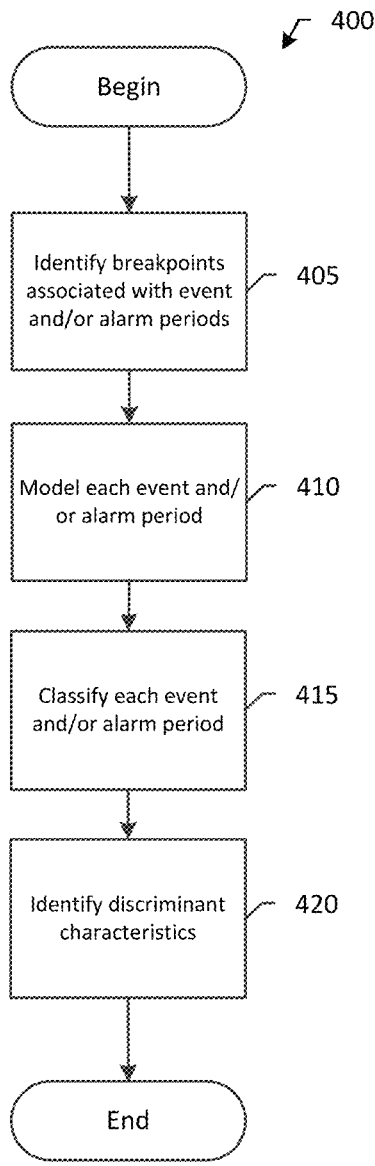
FIG. 4 shows an example method for identifying discriminant characteristics in accordance with embodiments of the disclosure.

Referring to FIG. 4, a flowchart illustrates an example method 400 for identifying discriminant characteristics in information related to power events and alarms. In accordance with some embodiments of this disclosure, method 400 is illustrative of example steps that may be performed in connection with method 200 discussed above in connection with FIG. 2. Similar to method 200, method 400 may be implemented on a processor of at least one IED (e.g., 121, shown in FIG. 1A) in the electrical/power system, a processor of a diagnostic computing system (e.g., 125, shown in FIG. 1) in the electrical/power system, and/or remote from the at least one IED and the diagnostic computing system.

As illustrated in FIG. 4, the method 400 begins at block 405, where breakpoints associated with the event and/or alarm periods discussed above in connection with method 200, are identified in information related to power events and alarms. In some embodiments, the information related to power events and alarms corresponds to the aggregated information from block 215 of method 200.

As briefly discussed above in connection with method 200, the breakpoints (e.g., 510, 520, 530, shown in FIG. 5) correspond to "significant" change points in the aggregated information, e.g., for a particular data set such as aggregated sum of power events and/or alarms, from one time period (N) to a next time period (N+1). For example, the significant change points may be rules based such as correspond to points in the aggregated data in which a significant increase (e.g., a greater than fifty percent increase) in a number of occurrences of power events and/or alarms from one time period to a next time period is observed. Or it may be a statistical threshold (e.g., using the "extreme outlier" threshold value of median+3*IQR).

Figure 5:
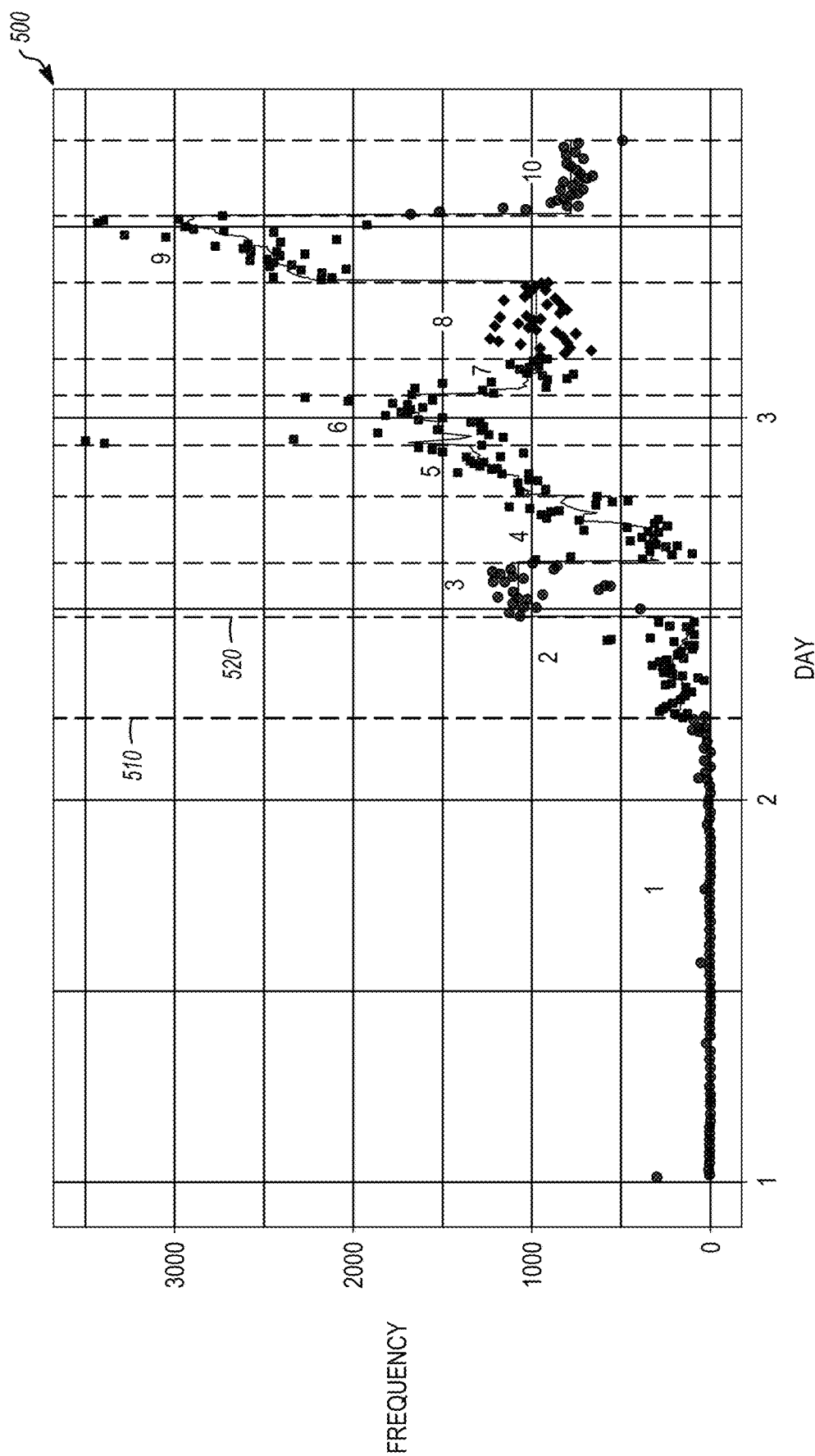
FIG. 5 illustrates an example plot that may be generated in accordance with embodiments of the disclosure.

In some embodiments, the breakpoints are identified or selected, for example, using a machine learning algorithm. The machine learning algorithm (self-learning, self-organizing, self-identification) may optimize the number of change-points. It may be a combination of several machine learning algorithms and rules. One example would optimize the number and place of the change points by minimizing the RSS (residual sum of square) and using a penalty score for more change points (these are machine learning typical tasks, so are considered as state of the art) as well as using a rule such as defining a minimal duration of any period (e.g., not less than 14 days as one example). FIGS. 3 and 5 were derived from such machine learning algorithms. In each of these cases, "significant changes" are used in the data science common usage of the word (e.g., statistically different mean or median values or different regression lines for each one of the periods).

As briefly discussed above in connection with method 200, in some embodiments the relevant periods (e.g., P1, P2, P3, shown in FIG. 5) are identified or selected based on the breakpoints. In particular, the breakpoints may separate one event and/or alarm period from a next event and/or alarm period, thereby providing for identification of the event and/or alarm periods. This is done in both FIGS. 3 & 5 by using the number of daily events/alarms as the input data. In this embodiment, this quantitative data is fed into the machine learning algorithms sequences. In another embodiment, the daily number of separate sequences of overlapping events (groups of events defined based on the start and end time stamps of the events) could be used.

At block 410, each of the identified event and/or alarm periods is modeled, for example, as illustrated by plot 500 shown in FIG. 5. In accordance with some embodiments of this disclosure, modeling the identified event and/or alarm periods includes determining a best possible model for each of the identified event and/or alarm periods, and modeling each of the identified event and/or alarm periods (e.g., using again RSS optimization techniques) based on the determined best possible model. The best possible model (e.g., median, increasing, decreasing, etc.) for each of the identified event and/or alarm periods may be determined, for example, by comparing each event and/or alarm period of the identified event and/or alarm periods with a previous event and/or alarm period of the identified event and/or alarm periods. For example, an impact of each event and/or alarm period on the electrical/power system may be compared with the impact of a previous event and/or alarm period on the electrical/power system to determine the best possible model. Referring again to FIG. 5, the identified event and/or alarm periods shown in blue indicate a decreasing number of events and/or alarms in the illustrated example. Additionally, the identified event and/or alarm periods shown in red indicate an increasing number of events and/or alarms, and the identified event and/or alarm periods shown in green indicate a stable number of events and/or alarms, i.e., the events and/or alarms are relatively stable. The lines connecting the points shown in FIG. 5 are based on a median value in the illustrated embodiment.

At block 415, each of the modeled event and/or alarm periods is classified or categorized, for example, as stable, rising, dropping, etc. based on an analysis of the modeled event and/or alarm periods. Referring briefly to FIG. 5, the modeled event and/or alarm periods may be analyzed to determine if the trend of the number of events and/or alarms is increasing, decreasing, or stable from the start of each event and/or alarm period (e.g., from a first breakpoint of the period, e.g., 510 shown in FIG. 5) to the end of each event and/or alarm period (e.g., from a second breakpoint of the period, e.g., 520 shown in FIG. 5). If it is determined that the trend of the number of events and/or alarms is increasing from the start of an event and/or alarm period to an end of an event and/or alarm period, the event and/or alarm period may be classified as rising. Additionally, if it is determined that the trend of the number of events and/or alarms is decreasing from the start of an event and/or alarm period to an end of an event and/or alarm period, the event and/or alarm period may be classified as dropping. Further, if it is determined that the frequency or number of events and/or alarms is stable from the start of an event and/or alarm period to an end of an event and/or alarm period, the event and/or alarm period may be classified as stable. The fact of looking for a trend may be done by using local regression over a moving period, or any other suitable algorithm. This enables the algorithm to identify sub-periods which may be better modeled as stable periods, even if the original algorithm had not identified any changepoint within a period. The modeling may thus identify additional changepoints.

In some embodiments, each of the modeled event and/or alarm periods is classified through curve fitting techniques, for example, using one or more statistical learning algorithms where slope or slope variations of the event and/or alarm periods are modeled. In one such embodiment a list of possible curves is used and the best matching curve (using again the RSS as key metrics) is then selected for each period. For illustration purposes only, a very simple list of such curves may be made of linear regression, exponential functions and polynomial regressions. In another embodiment, a machine learning "curve fitting in R" algorithm is applied.

At block 420, discriminant characteristics are identified in each of the modeled event and/or alarm periods. The aim of this step is to explain what Example discriminant characteristics that may be identified may include, for example, particular devices (e.g., IEDs) or locations (e.g., metering locations) in the electrical/power system associated with a "high" (or greater than "normal") amount of power events and/or alarms in the electrical/power system. Additionally, example discriminant characteristics that may identify patterns may include days of the week and/or daily times and/or seasons on which a significant number of power events and/or alarms occur. For example, it may be observed that a "higher" (or greater than "normal") amount of power events and/or alarms occur on Sundays at 5 PM. From this observance, further analysis may occur to determine why a "higher" (or greater than "normal") amount of power events and/or alarms occur on Sundays at 5 PM. For example, it may be determined that a "higher" (or greater than "normal") amount of power events and/or alarms occur on Sundays at 5 PM since this is when updates (e.g., time sync operations, and/or software and/or hardware updates) typically occur in the electrical/power system. Additional aspects of identification of discriminant characteristics are described further below in connection with FIGS. 6-7E, for example.

After block 420, the method may end in some embodiments. In other embodiments, the method may return to block 405 and repeat again (e.g., in response to receiving additional information related to power events and/or alarms). Similar to method 200, it is understood that method 400 may include one or more additional blocks in some embodiments. For example, in some embodiments the method 200 may include determining a relative criticality score of each of the identified discriminant characteristics to a process or an application associated with the electrical/power system, e.g., over a predetermined time period. The relative criticality score may be based, for example, on an impact of the identified discriminant characteristics to the process or the application, e.g., over the predetermined time period. In some embodiments, the impact of the identified discriminant characteristics is related to tangible or intangible costs associated with the identified discriminant characteristics to the process or the application. In some embodiments, the relative criticality score is presented on at least one plot of the at least one plot visually representing the identified discriminant characteristics. Additionally, in some embodiments the relative criticality score may be used prioritize responding to the identified alarms (e.g., at block 230 of method 200).

Figure 6:
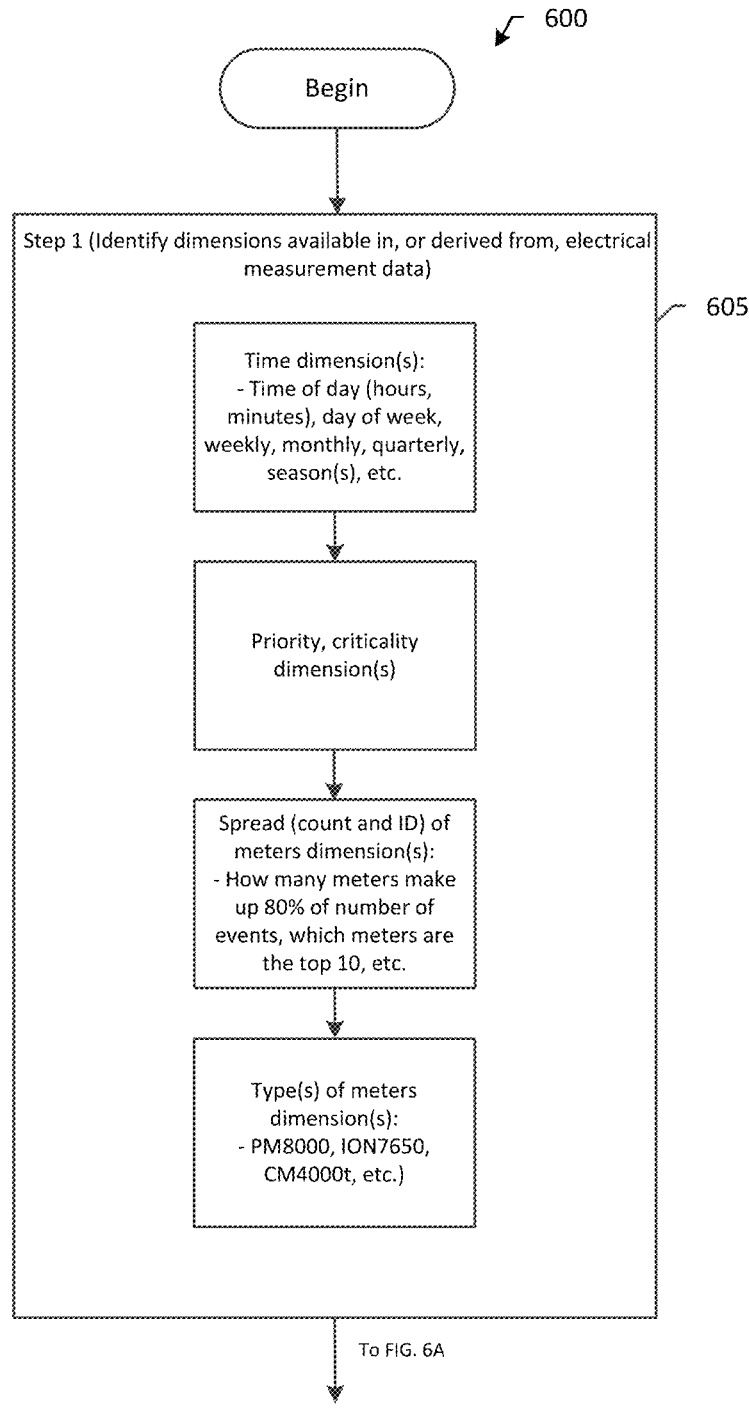
FIGS. 6-6C shows another example method for identifying discriminant characteristics in accordance with embodiments of the disclosure.
Figure 6A:
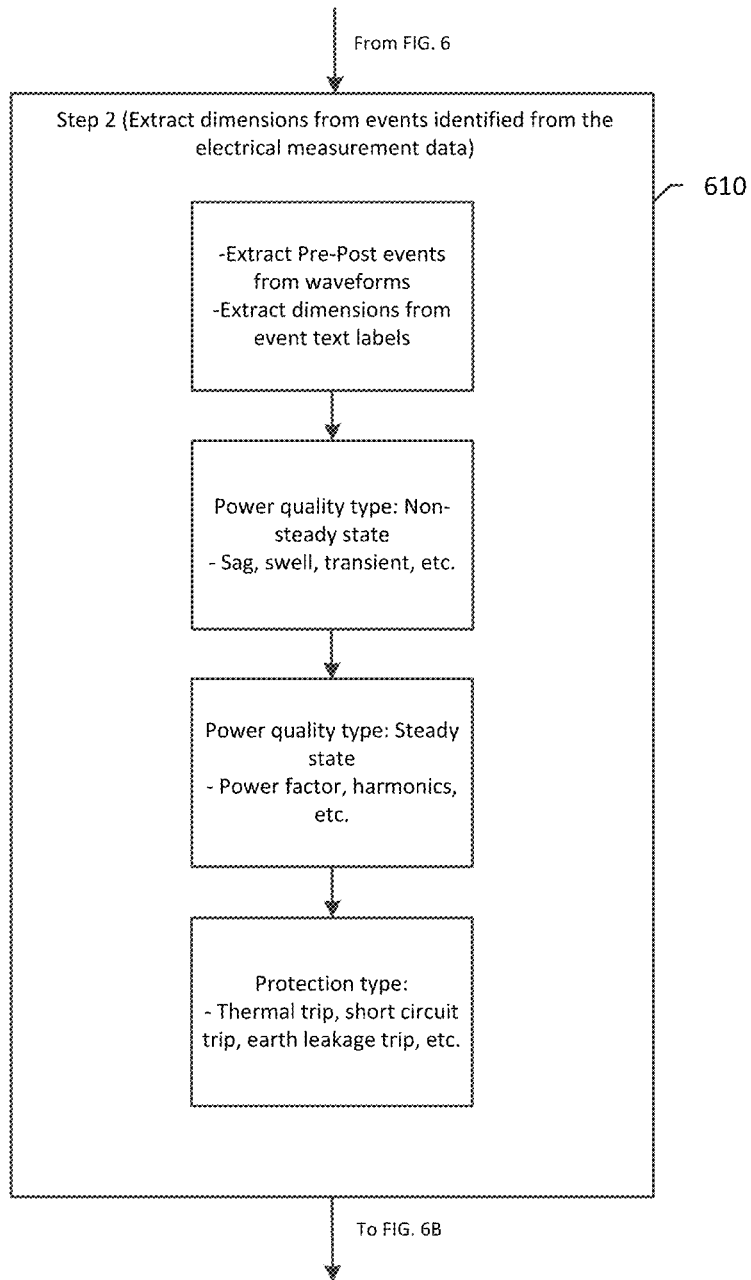
Figure 6B:
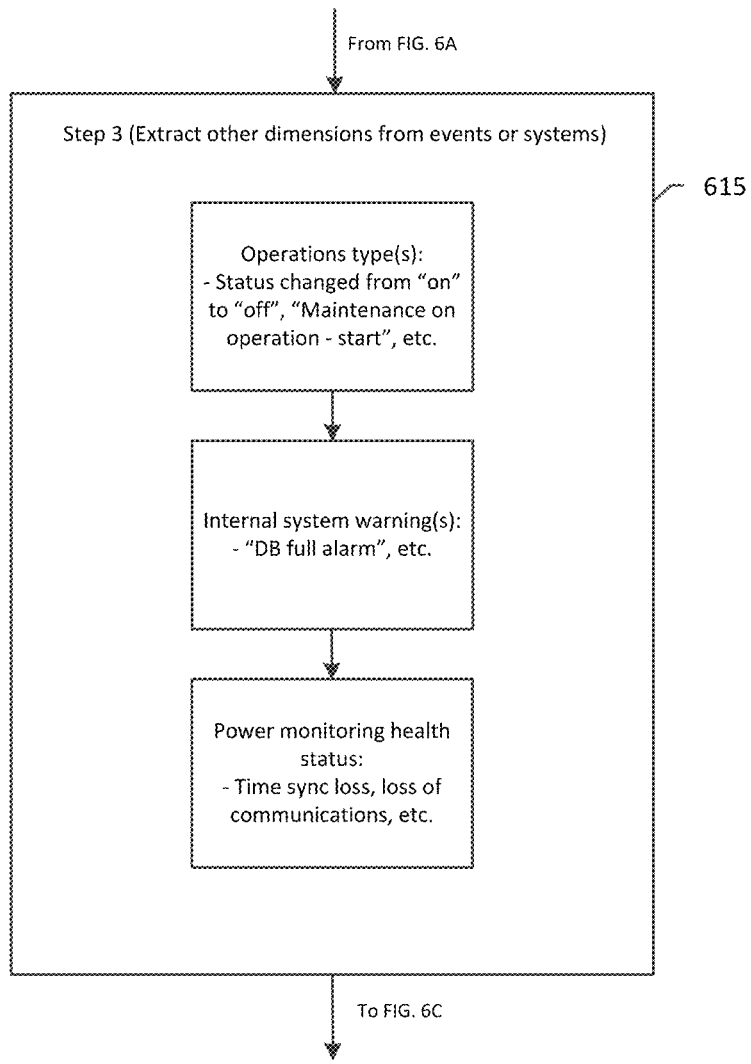
Figure 6C:
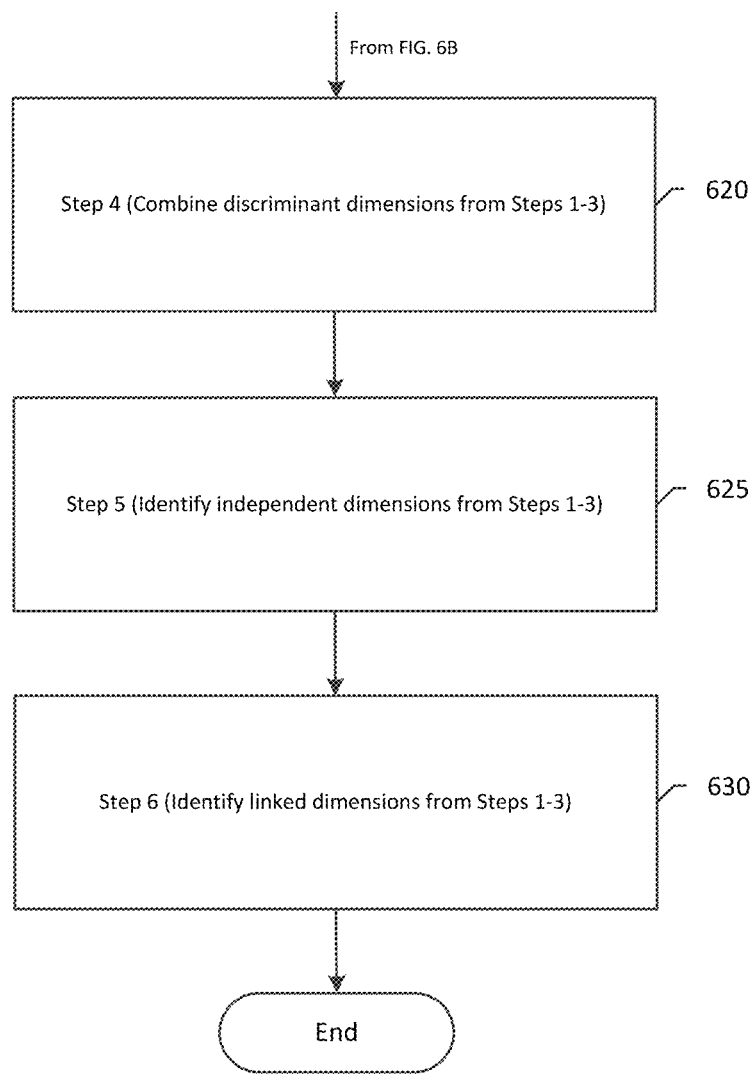

Referring to FIGS. 6-6C, a flowchart illustrates an example method 600 for identifying discriminant characteristics/parameters/dimensions (the "characteristic" is an observation directly inferred from the data, "parameter" is the name used in the electrical/power system due to the fact that a controller may use a parameter as input to a measurement setting or to control the electrical/power system, both of these words, when used in any data science field analysis, become a dimension of the analysis). In accordance with some embodiments of this disclosure, method 600 is illustrative of example steps that may be performed in connection with method 200 discussed above in connection with FIG. 2 and/or method 400 discussed above in connection with FIG. 4. As one example, method 600 may be illustrative of example steps performed at block 420 of method 400. Similar to methods 200 and 400, method 600 may be implemented on a processor of at least one IED (e.g., 121, shown in FIG. 1A) in the electrical/power system, a processor of a diagnostic computing system (e.g., 125, shown in FIG. 1) in the electrical/power system, and/or remote from the at least one IED and the diagnostic computing system.

As illustrated in FIG. 6, the method 600 begins at block 605 where dimensions available in, or derived from, electrical measurement data are identified. As discussed in connection with figures above, electrical measurement data may be from, or derived from, energy-related signals captured or derived by at least one IED in an electrical/power system. As also discussed in connection with figures above, power events and alarms triggered in response to the power events may be identified from electrical measurement data, and information related to the identified power events and alarms may be aggregated. In accordance with some embodiments of this disclosure, dimensions, such as time dimensions, priority and criticality dimensions, count and identified of meter dimensions, type of meter dimensions, etc., may be identified from, or derived from, the electrical measurement data directly, or from the above-discussed aggregated information. Additionally, in accordance with some embodiments of this disclosure, the dimensions may be identified from, or be derived from other information related to the electrical/power system in which the electrical measurement data is measured. The other information may include, for example, known system configuration data (e.g., using the type of meters defined in a Power Monitoring software, as a dimension. This is useful to look for a possible cause of an abnormal increase of events identified, including waveform captures, which may be explained by a firmware update implemented on a specific type of meter. The user or the system may know the date of the firmware update push, and use this as an additional confirmation of this possible use case/cause/source, explaining what created this increase. This dimension may be the statistically most discriminant dimension identified by the analysis. A report may be presented to the user showing this identified discriminant dimension, as well as the confirmation of the timely co-occurrence of the firmware push. It may then be up to the user/expert to identify if this is a problem, such as a too sensitive default setting threshold value on sags for example, or if this update fixed a problem, explaining why some events may have been missed before.

Figure 7:
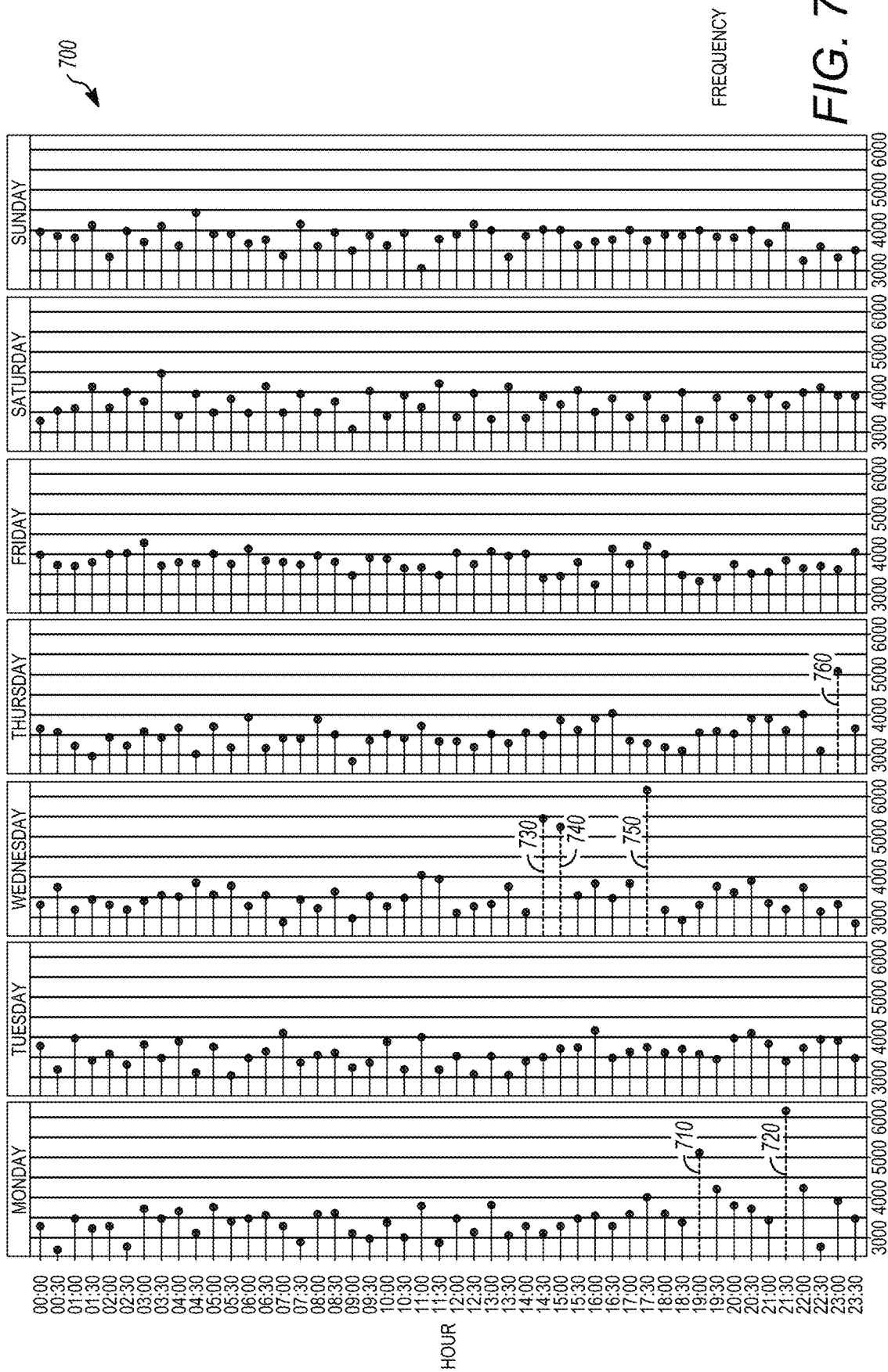
FIGS. 7-7G illustrate various plots that may be generated in accordance with embodiments of the disclosure.
Figure 7A:
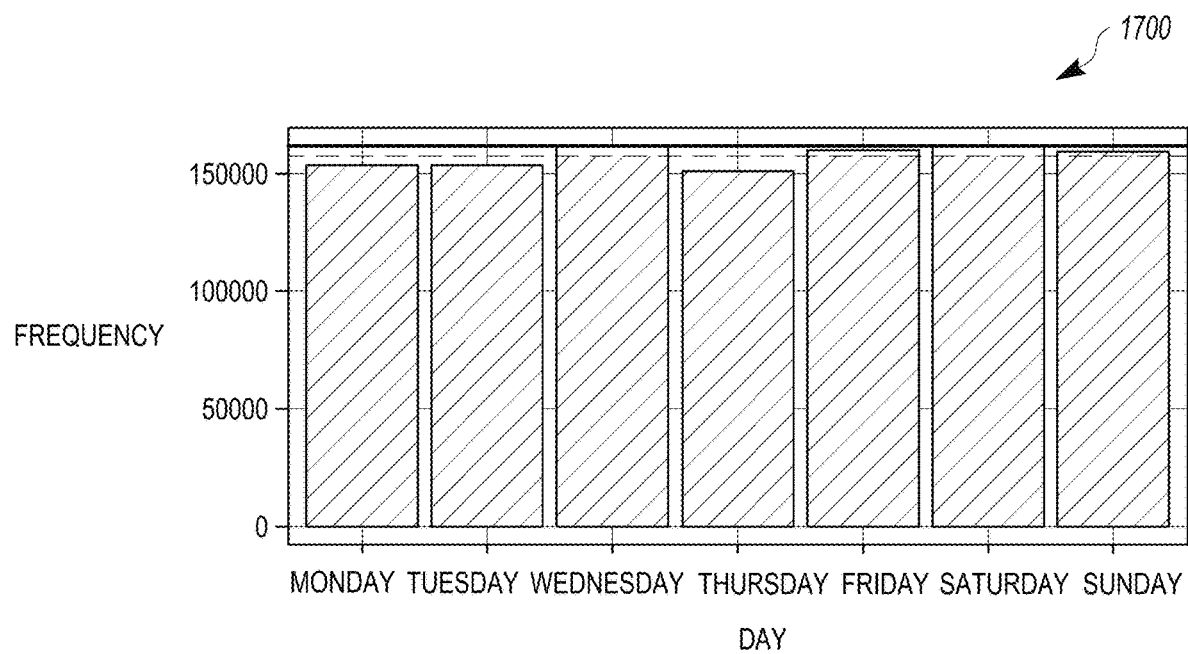
Figure 7B:
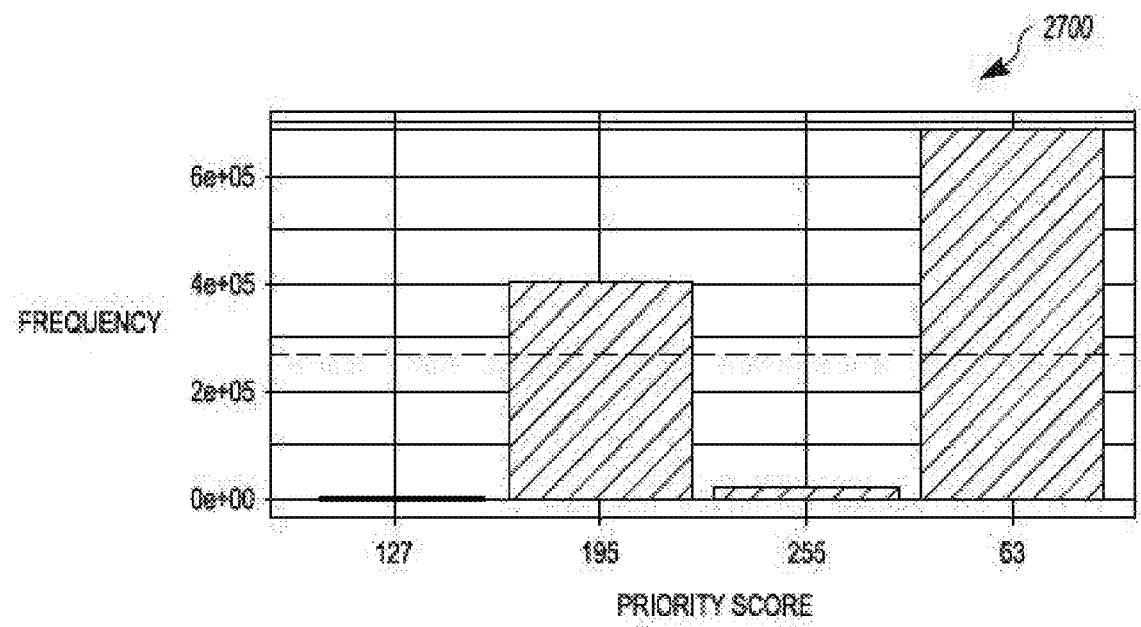

The above-discussed time dimensions may indicate, for example, time of day (hours or minutes) of discriminant events (e.g., as shown in FIG. 7, as will be discussed further below), days of week of discriminant events (e.g., as shown in FIG. 7A, as will be discussed further below), etc. Additionally, the priority dimensions may include priority scores, or values, associated with responding to particular power events and/or alarms in the electrical/power system (e.g., as shown in FIG. 7B, as will be discussed further below). Criticality dimensions may indicate, for example, criticality of a power event and/or an alarm to a particular process or application, etc. In accordance with some embodiments, the criticality dimensions may be determined based on, or in response to, the relative criticality score discussed above in connection with method 200. The way the system identifies the most discriminant dimension may be in one possible implementation, by using the "outlier" or "extreme outlier" rules or statistical or machine learning algorithms (e.g., checking if a particular day of the week explains by itself more than 50% of all the events/alarms).

Figure 7C:
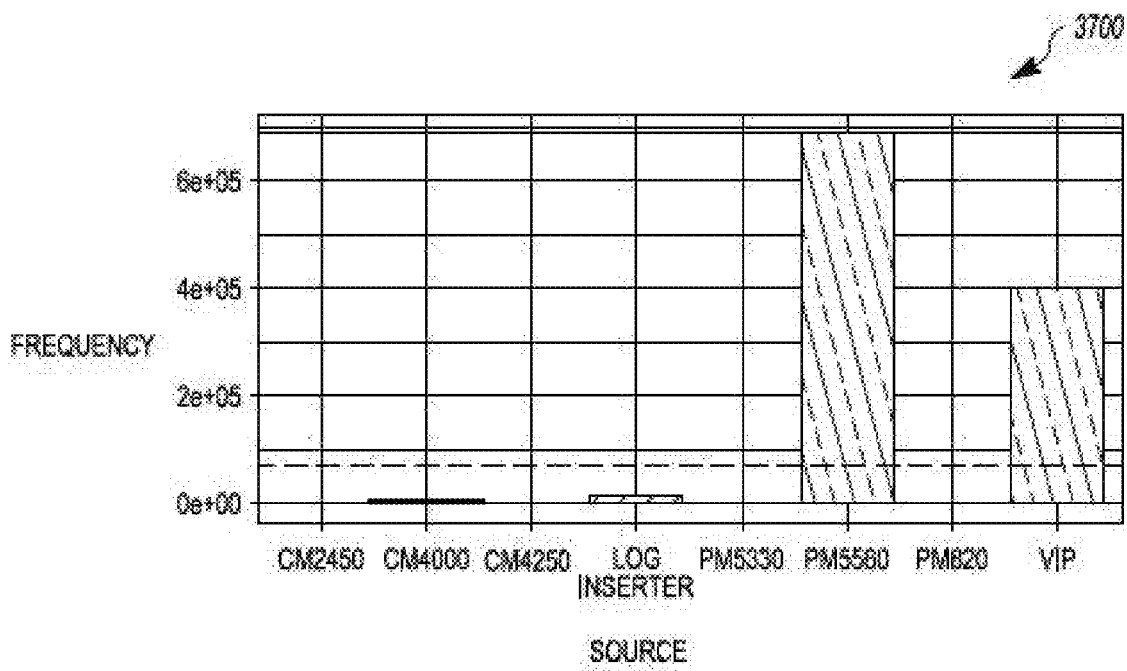
Figure 7D:
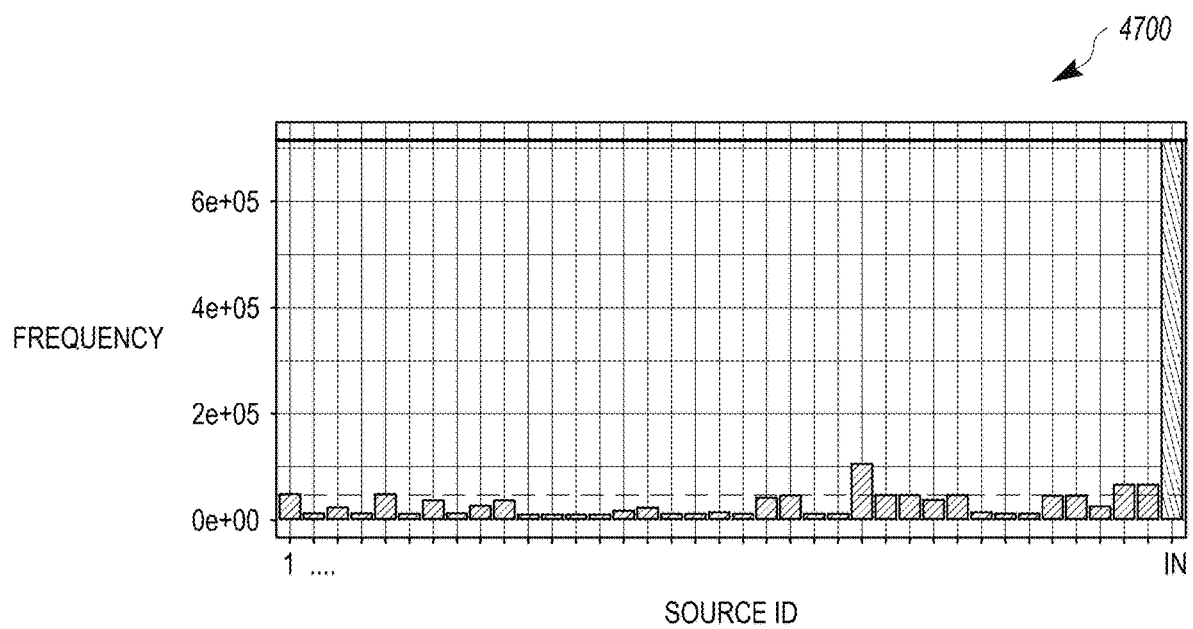

Count and identification (or spread) of meter dimensions may indicate, for example, how many meters (e.g., IEDs) are associated with or responsible for detecting a particular percentage of events in the electrical/power system, which meters are in the top ten for detecting events, etc. (e.g., as shown in FIG. 7C, as will be discussed further below). Additionally, type(s) of meters dimensions may indicate types of meters associated with, or proximate to, detected events in the electrical/power system. The types of meters may include, for example, PM8000, ION7650, CM4000t, and other metering devices provided by Schneider Electric. In some embodiments, the types of meters are determined by a source identification number of the meters (e.g., as shown in FIG. 7D, as will be discussed further below), and/or locations of the meters in the electrical/power system It is understood that the above example dimensions are but a few of many potential dimensions which may be identified at block 605.

At block 610, dimensions are extracted from events identified from the electrical measurement data. In some embodiments, the events identified from the electrical measurement data may correspond to power events identified from electrical measurement data at block 210 of method 200, for example.

Example dimensions that may be extracted may include, for example, pre-event and post-event information from energy-related signals (or waveforms) associated with the electrical measurement data. As previously discussed, electrical measurement data may be from or derived from energy-related signals captured by at least one IED in an electrical/power system. Dimensions may also be extracted from event text labels, for example, which are re-use in further analysis and/or displayed on a plot illustrating the electrical measurement data and/or associated identified events (e.g., extracting the two dimensions of power quality issue=sag, and phase=A, from the various different labels "VA sag", "voltage dip ph.A", "Phase A voltage sag", all three meaning the same thing="Voltage Sag on Phase A). The event text labels may be automatically generated in some embodiments, and manually (or semi-automatically) generated in other embodiments to tag a group of events, or to re-tag in a non-ambiguous way, the events (e.g., call all voltage sags on phase A, "Voltage Sag Phase A").

Further example dimensions that may be extracted may include power quality type(s) further distinctions/groups of the events identified from the electrical measurement data, for example, non-steady state power quality types such as sag, swell, transient, etc. as one dimension, distinguished from another dimension of steady state power quality types such as power factor, harmonics, etc. Protection types, such as those that may be used in triggering, avoiding or postponing triggering one of more actions at block 230 of method 200, for example, may also be extracted from the electrical measurement data in some embodiments. Example protection types may include thermal trip, short trip, earth leakage trip, etc., as a few examples. It is understood that other types of dimensions may be extracted from events identified in the electrical measurement data.

In one embodiment, the dimensions are extracted by observing differences between one phase and another phase for measurements (e.g., voltage sag magnitude measurements) obtained or derived from measurements by each meter or IED in the electrical/power system.

At block 615, other dimensions may be extracted from events identified from the electrical measurement data and/or other systems (e.g., sensors or devices) in the electrical/power system, for example, to identify a source (or sources) of problems in the electrical/power system. These other dimensions may include, for example, operation type(s), such as status changed from "on" to "off", "maintenance on operation—start", etc. The other dimensions may also include internal system warnings, such as a warning "DB full alarm" generated in response to a database of one or more systems in the electrical/power system having a full database. Additionally, the other example dimensions may include power monitoring health status, for example, of the power monitoring and control system responsible for monitoring and controlling the electrical/power system. The power monitoring health status may indicate, for example, time sync loss, loss of communications, etc. It is understood that further dimensions may be extracted.

In some embodiments, the other dimensions may be extracted from automatically detected configurations of the electrical/power system (e.g., number and type of IEDs, number and type of loads, etc.), for example, from sensor data received from one or more sensors in the electrical/power system that may be helpful for identifying dimensions in the electrical/power system. One example of sensor would be temperature or vibrations measured on the electrical equipment/load (e.g., on a motor or a transformer). In some embodiments, the other dimensions may also be extracted from electrical/power system configuration data manually input by a user, for example, as may be received from a user device (e.g., 114, shown in FIG. 1) (e.g., alarm (non-)acknowledgement).

At block 620, discriminant dimensions, for example, from the dimensions identified or extracted at blocks 605, 610, and 615, are selectively combined or aggregated. For example, discriminant dimensions (e.g., frequency of events per day) associated with one meter in the electrical/power system may be combined with like discriminant dimensions (e.g., frequency of events per day) associated with another meter in the electrical/power system, to determine a combined number of discriminant dimensions, e.g., frequency of events in the electrical/power system per day. This can be done systematically by pairwise aggregating the dimensions as illustrated in FIG. 7 (e.g., a day of week dimension on the X axis is combined with a 30-minute intervals dimension on the Y axis, the result being the number of events per 30-minute interval, per day of the week).

At block 625, independent dimensions are identified, for example, from the dimensions identified or extracted at blocks 605, 610, and 615. For example, it may be determined that dimensions associated with priority score of an event, e.g., as shown in FIG. 7B, are independent from dimensions associated with metering device type, e.g., as shown in FIG. 7C. One possible implementation to identify the independence of dimensions is to calculate if every days of week, at 21 h30, there are significantly more events, than the rest of the daily hours. The reverse may than be applied to identify the linked dimensions, calculating that only on Mondays, at 21:30 (e.g., 720) as well as some other distinct points across day time and day of week (e.g., 710, 730, 740, 750, 760) have significantly more events. Further checks or operations (e.g., removing "extreme outliers" prior to this analysis) need to be performed to validate that it is not just one single day explaining this "linked dimension".

At block 630, linked dimensions are identified, for example, from the dimensions identified or extracted at blocks 605, 610, and 615. For example, days of week dimensions may be linked to dimensions associated with particular times of day, e.g., as shown in FIG. 7, in some embodiments.

After block 630, the method may end in some embodiments. In other embodiments, the method may return to block 605 and repeat again (e.g., in response to receiving additional electrical measurement data). Similar to methods 200 and 400, it is understood that method 600 may include one or more additional blocks in some embodiments.

Referring to FIG. 7, a plot 700 illustrates a frequency of events occurring during each hour of each day over a one-week period of time (i.e., Monday thru Sunday). Discriminant points (i.e., points that stand out with extreme high values) are indicated by reference designators 710, 720, 730, 740, 750, 760. By analyzing the patterns of these discriminant points, the system automatically deduces which dimensions are discriminant or not (e.g., time per day, day of the week, or the combination of both time per day and day of week), and if they are independent or if they are linked. Referring to FIG. 7A, a plot 1700 illustrates a frequency of events occurring during each day of the one-week period where no day of the week is discriminant. In the illustrated embodiment, data is aggregated for multiple devices in an electrical/power system. However, in some embodiments, the data may be aggregated for a single device (FIG. 7D).

Referring to FIG. 7B, a plot 2700 illustrates a frequency of events in an electrical/power system per priority score. In accordance with some embodiments, events may have a priority score, for example, that is defined within the meter or historian system (e.g., power monitoring system). Additionally, in accordance with some embodiments, event priority may be based on a range of priority score values. For example, low priority events (not really an alarm) may have a range of priority values from 0-63 (indicated as 63 in FIG. 7B), and low/mid priority events (still not considered an alarm in most cases) may have a range of priority values from 64-127 (indicated as 127 in FIG. 7B). Additionally, mid priority events (e.g., events that impact system and result in one or more alarms being triggered) may have a range of priority values from 128-195 (indicated as 195 in FIG. 7B), and high priority events (e.g., events that significantly impact system and result in one or more alarms being triggered) may have a range of priority values from 196-255 (indicated as 255 in FIG. 7B). For example, time sync issues may not be considered as critical, so related events may not raise alarms and thus be tagged as a score of 63. A voltage sag, on the contrary may be considered a high impact issue, and receive a score of 196, while an interruption may receive a score of 255. With this information, it is possible to diagnose when an issue occurred, and to trace the potential source of the issue. For example, can see that before a software (or firmware) upgrade was applied to a metering device, X number of issues existed, while after the software upgrade was applied, Y number of issues exist. If Y is greater than X, can assume that there is an issue with the software upgrade that needs to be addressed.

The information shown in FIG. 7B, for example, may be used to direct a system's resources to events that are a high priority, e.g., for mitigating or eliminating effects of the high priority event(s). Additionally, the information shown in FIG. 7B may be used to observe increases in alarm priority from one period to a next period, and to take an action (or actions) in response to this increase (e.g., at block 230 of method 200). The type of actions may depend, for example, on the importance of acting fast or not, and associated costs (monetary and otherwise, e.g., opportunity costs) with acting or not acting.

Referring to FIG. 7C, a plot 3700 illustrates frequency of events per device type (here, metering devices provided by Schneider Electric). As illustrated in this example, there are very few events associated with (e.g., detected by) metering type CM4000. As also illustrated, there is a fairly significant number of events associated with (e.g., detected by) metering type PM5560. In one example configuration, CM2450, CM4000, and CM4250 meters are located proximate to an input of the electrical/power system, PM5560 is located closer to the loads in the electrical/power system, and VIP is located between CM2450, CM4000, CM4250 and PM5560. In this example configuration (using the information provided in plot 3700), it can be determined that most of the events/alarms are not occurring at the input of the electrical/power system, but rather further down (i.e., downstream) in the electrical/power system. As illustrated, using plots similar to plot 3700 and a hierarchical analysis of where a metering device is in the electrical/power system (e.g., as shown in FIG. 1B), it can be determined where in the electrical/power system the events are occurring (e.g., proximate to the electrical/power system input, or further downstream). With this information, it may be possible to diagnose when an issue occurred, and to trace the potential source of the issue.

Referring to FIG. 7D, a plot 4700 illustrates a frequency of events per device type, similar to plot 3700 discussed above. Here, however, the device type is indicated by source identification number. As illustrated, one of the devices is associated with a significant number of events compared with the rest of the devices.

Figure 7E:
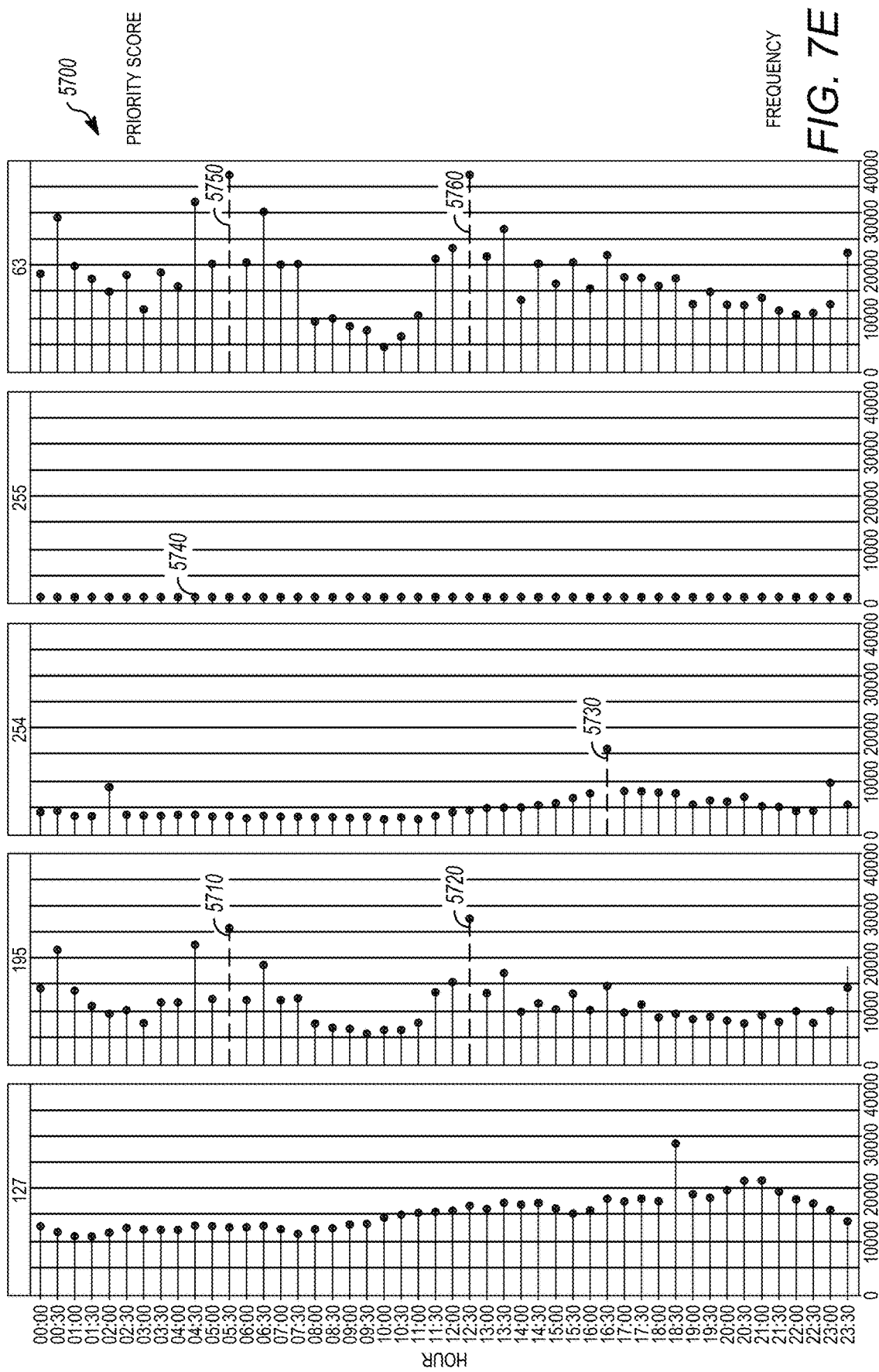

Referring to FIG. 7E, a plot 5700 illustrates example linked dimensions (here, time, event frequency and priority score dimensions). As illustrated, several discriminant dimensions are associated with lower priority events (e.g., 5750, 5760), and several discriminant dimensions are associated with mid- and high-priority events (e.g., 5710, 5720, 5730, 5740).

Figure 7F:
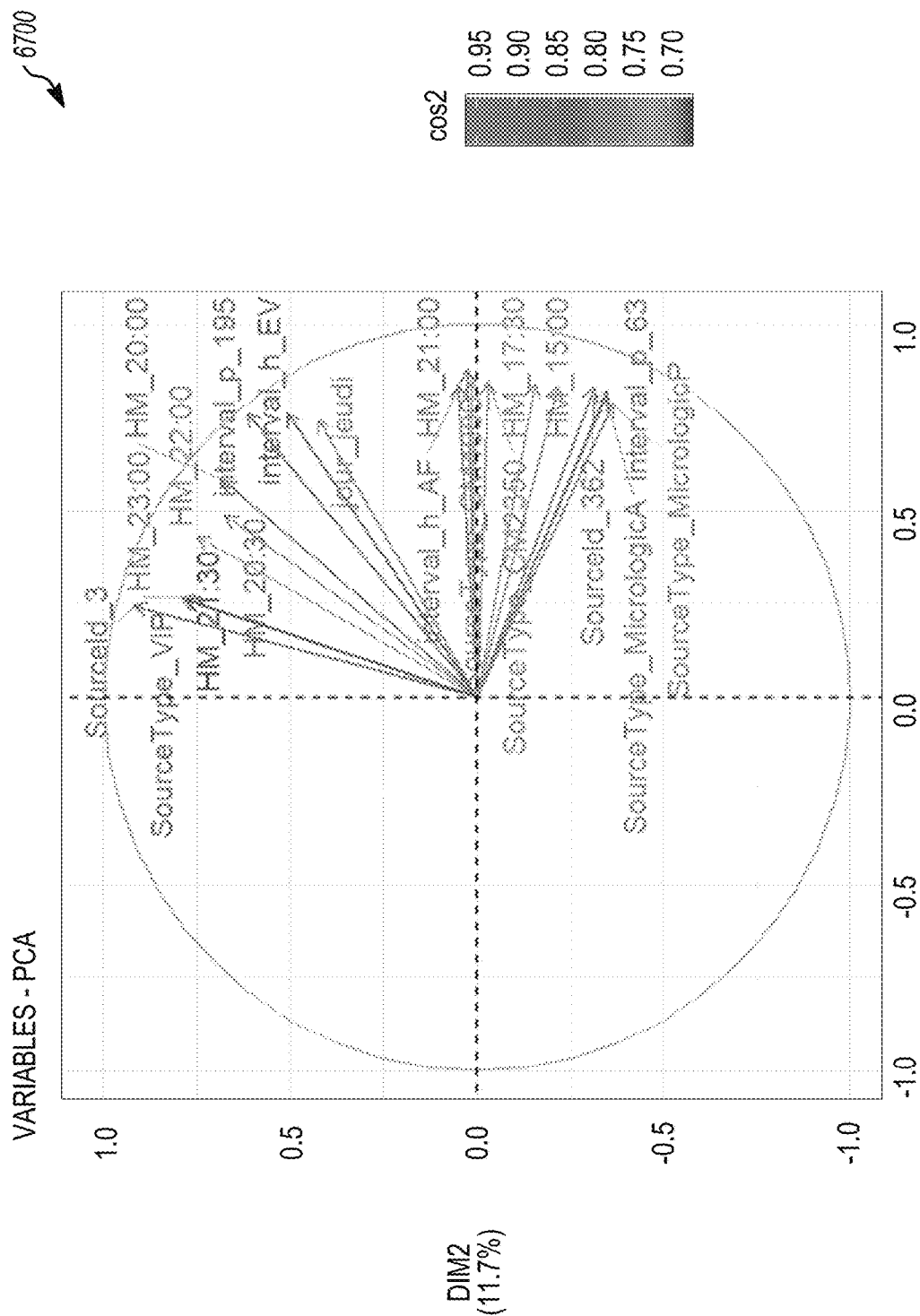
Figure 7G:
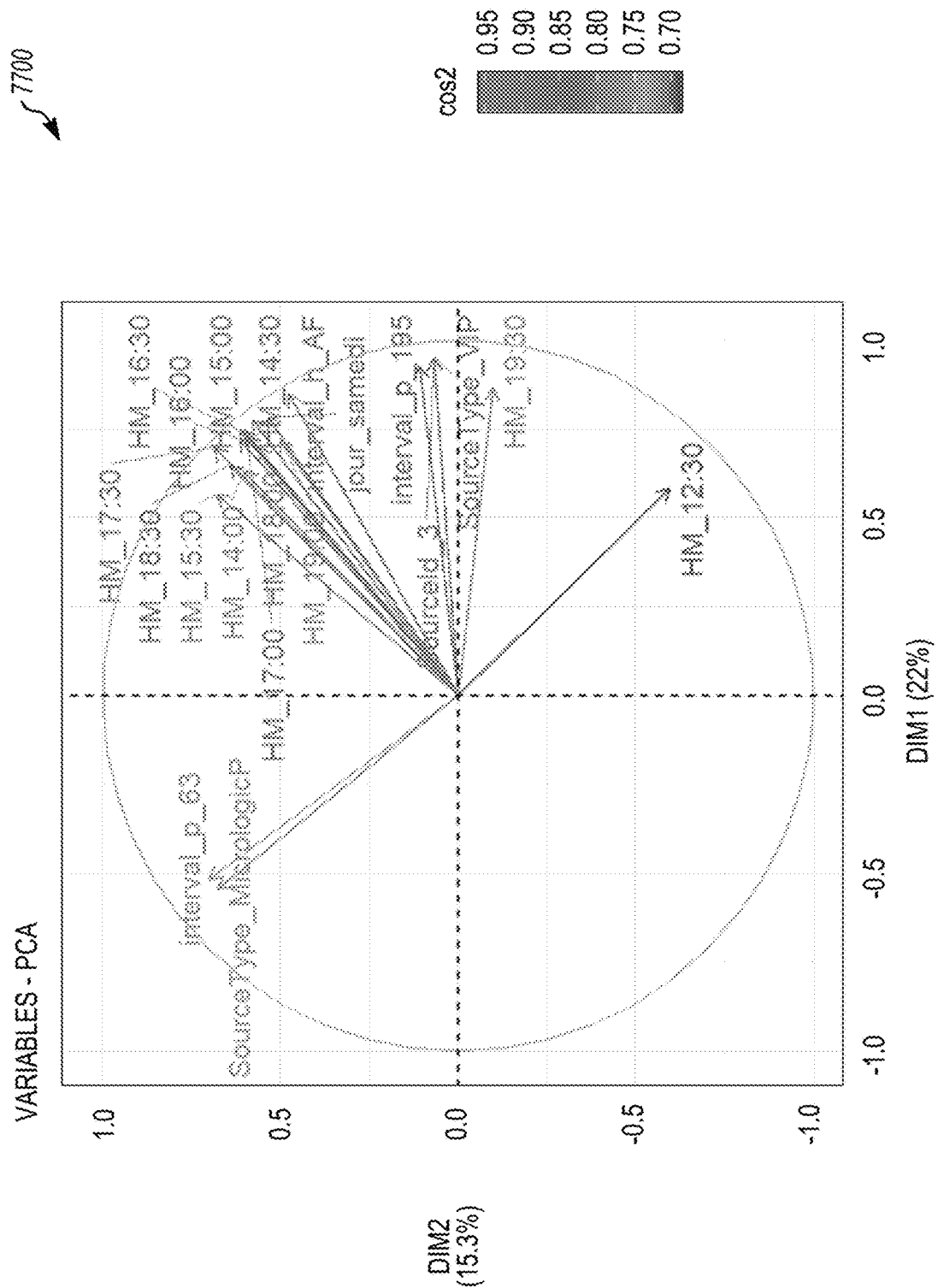

Referring to FIGS. 7F and 7G, plots 6700, 7700 show another example way of illustrating dimensions. This illustrates another way of identifying linked and independent discriminant dimensions. The system uses dimension reduction algorithms, such as principal components analysis, as one implementation. By calculations, or visually for a experts or data scientists' eye, groupings may become obvious. A simplified explanation is that "the closer together, the more linked", and the reverse, "the more isolated, the more independent" (e.g., FIG. 7G, the daily time of 12:30 arrow is separate from all the other discriminant points). In accordance with some embodiments, each technique requires its appropriate checks to make sure the system provides reliable analysis and actionable recommendations which will help solve the issue. Any change should be cross-checked for effectiveness in some embodiments, and maintenance operation may be an additional input into the system to create a learning/feedback loop, validating the analysis and measuring the effectiveness of the operations. This in turn makes the system grow in intelligence, providing even smarter recommendations (e.g., including the effectiveness of the user/maintenance teams' corrective actions into the system).

Figure 8:
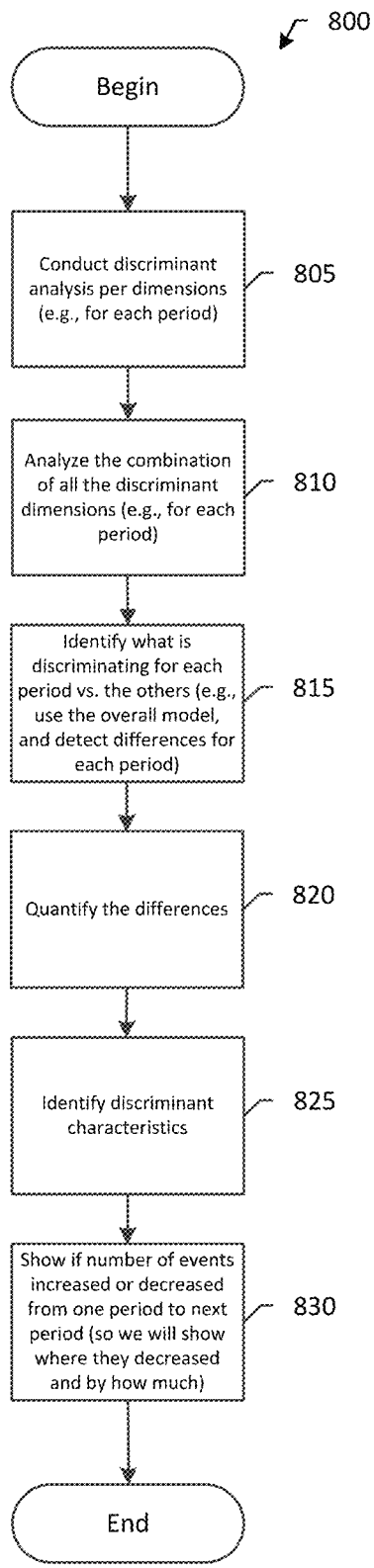
FIG. 8 shows an example method for identifying and analyzing discriminant characteristics in accordance with embodiments of the disclosure.

Referring to FIG. 8, a flowchart illustrates an example method 800 for identifying and analyzing discriminant characteristics/parameters/dimensions in an electrical/power system. In accordance with some embodiments of this disclosure, method 800 is illustrative of example steps that may be performed in connection with method 200 discussed above in connection with FIG. 2 and/or method 400 discussed above in connection with FIG. 4, for example. As one example, method 600 may be illustrative of example steps performed at block 420 of method 400. Similar to methods 200 and 400, method 800 may be implemented on a processor of at least one IED (e.g., 121, shown in FIG. 1A) in the electrical/power system, a processor of a diagnostic computing system (e.g., 125, shown in FIG. 1) in the electrical/power system, and/or remote from the at least one IED and the diagnostic computing system.

As illustrated in FIG. 8, the method 800 begins at block 805 where discriminant analysis is conducted per dimensions, for example, from dimensions identified from electrical measurement data (e.g., at block 605 of method 600 shown in FIG. 6), dimensions associated with events identified from the electrical measurement data (e.g., at block 610 of method 600), and/or other dimensions associated with events and/or system in the electrical/power system (e.g., at block 615 of method 600). As discussed above in connection with FIG. 6, for example, dimensions identified from electrical measurement data (e.g., electrical measurement data from, or derived from, energy-related signals captured by at least one IED in the electrical/power system) may include time dimensions, priority and criticality dimensions, count and identification of meter dimensions, type of meter dimensions, etc. As also discussed above in connection with FIG. 6, dimensions associated with (or extracted from) events identified from the electrical measurement data may include pre-event and post-event information from energy-related signals (or waveforms) associated with the electrical measurement data, dimensions extracted from event text labels, power quality type(s) of the events identified from the electrical measurement data, protection types, etc. As further discussed above in connection with FIG. 6, other dimensions associated with events and/or system in the electrical/power system may include operation type(s), internal system warnings, monitoring health status, etc. The power monitoring health status may indicate, for example, time sync loss, loss of communications, etc. It is understood that further dimensions may be extracted. It is understood that other dimensions may be considered in conducting the discriminant analysis at bock 805.

In accordance with some aspects of this disclosure, conducting discriminant analysis includes (among all the other previously described processes, methods, calculations and results and examples, and not limited to any or all of these) finding the linked dimensions of day time (e.g., 30 minute intervals) and of day of week (e.g., on Mondays) described in the descriptions of and illustrated in FIG. 7, specifically illustrate here by the reference 710. It is understood that other example processes for conducting discriminant analysis may occur.

In accordance with some aspects of this disclosure, conducting discriminant analysis per dimension, focusing on each single period (or on other sub-groups such as certain hours of each day e.g., morning, afternoon, night time periods), may provide for deeper relevant analysis of discriminant dimensions (e.g., than conducting discriminant analysis for a full day). The analysis per period may be a preparation step of further analysis steps, such as is the case in this exemplary flow diagram where 805 is preparation for 810 and then for 815.

At block 810, the combination of all (or substantially all) the discriminant dimensions are analyzed, for example, to enable identification of what is discriminating for each period versus other periods at block 815. For example, returning briefly to FIG. 5, the combination of discriminant dimensions associated with period 5 may be compared to the combination of discriminant dimensions associated with period 4, to identify what is discriminating in period 5 versus period 4. In one embodiment, all periods data may be used as input to an overall discriminant analysis (e.g., considering all data as one period). In this case, only discriminant dimensions which are discriminant across all periods will be identified (e.g., these may be called "constant discriminant dimensions" list). In another embodiment, all the different discriminant dimensions identified in each of the periods, may be combined into a list of discriminating dimensions (e.g., "all active, at least in one period, or across several or all periods, discriminant dimensions" list).

At block 820, the differences between one period (e.g., period 5) and a next period (e.g., period 4), for each of the periods, may be quantified. For example, it may be determined that period 5 has three (or another number) more new discriminant dimensions than period 4. This may in one embodiment aim at disaggregating the "inherited" discriminant dimensions form each one of the previous periods. The goal in this case could be to provide a "historical steps of unresolved issues" diagnostic report to help a new user who arrived on the site after the previous expert retired, to gain understanding of the number and importance of the ongoing events. This example may identify which previous periods' event types become the new normal, when not resolved. A typical graph of such a case would be a "step by step" increasing number of events. Reference 820 would then show how many of the events would be added from one period to the next. In such a case, again additional assumptions would need to be confirmed such as subtracting the previous periods numbers of events and checking that the same discriminating dimensions continue on, even if more and more blurred by the addition of the next unresolved issues. At block 825, discriminant characteristics, such as those discussed in connection with figures above and described in the previous example of step wise increments of quantities related to unresolved issues piling on each other, are identified based on the quantified differences.

Figure 9:
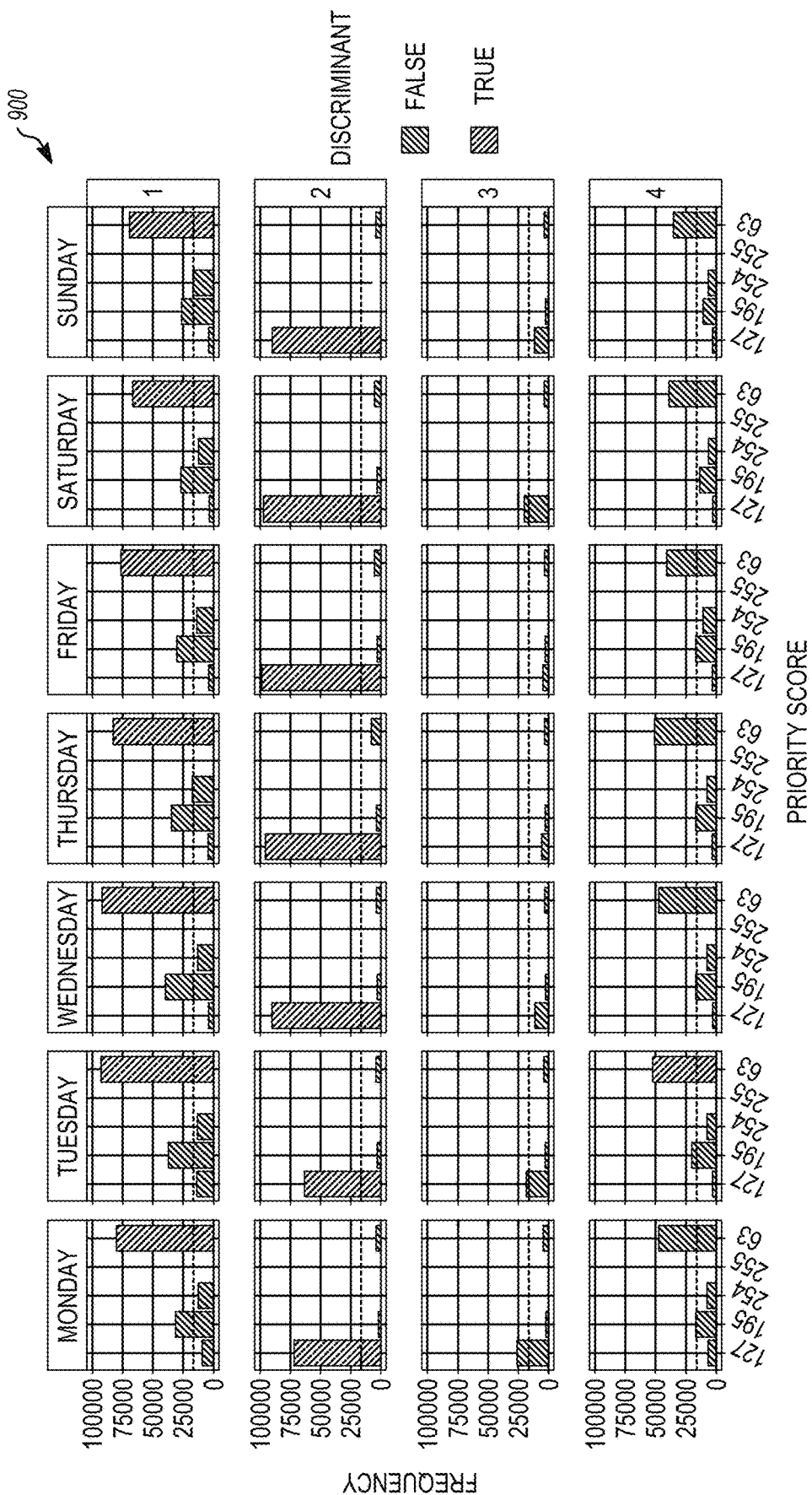
FIGS. 9-9A illustrate various plots that may be generated in accordance with embodiments of the disclosure.
Figure 9A:
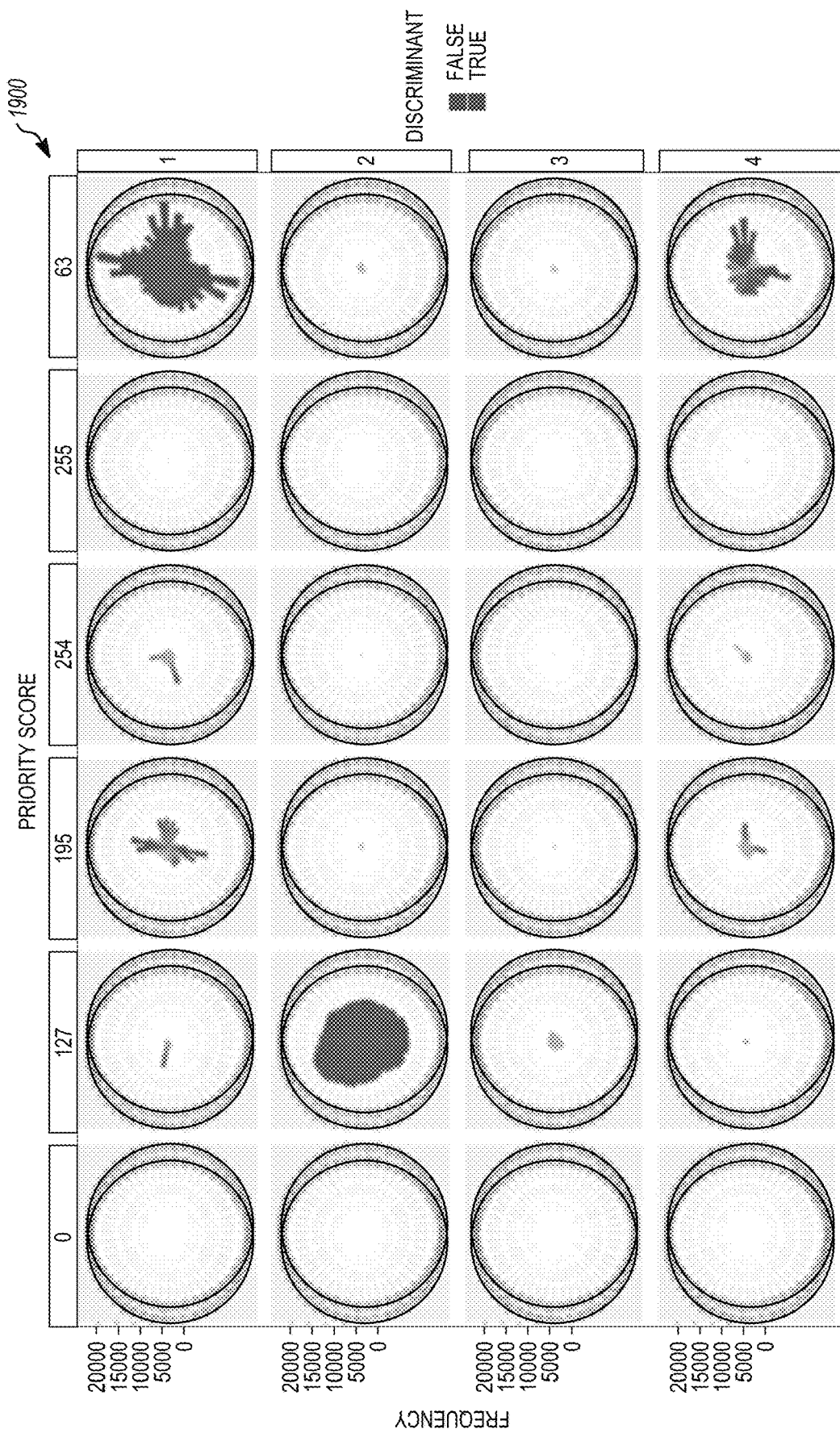

In some embodiments, at block 830 (which is optional in some embodiments), the discriminant characteristics associated each period and/or information associated with the discriminant characteristics (such as priority scores as shown in FIGS. 9 and 9A, as will be discussed further below), may be presented, for example, on a plot. The plot may display or indicate, for example, if the number of events increased or decreased from one period to a next period, and by how much the number of events increased or decreased (in embodiments in which the number of events increased or decreased). The plot may be presented on a display device of a user device (e.g., 114, shown in FIG. 1, for example), or another device of or associated with the monitoring and control system closed herein, for example. A decrease may thus be analyzed in the same way, for example: Was any of the previous existing issues solved? Was it the most recent previous period, or some other older previous period related issue? Or was it a constantly existing discriminant dimension (it's related real issue)?

After block 830, the method may end in some embodiments. In other embodiments, the method may return to block 805 and repeat again (e.g., in response to receiving additional electrical measurement data). Similar to methods 200, 400 and 600, it is understood that method 800 may include one or more additional blocks in some embodiments.

Referring to FIGS. 9 and 9A, plots 900 and 1900 illustrate two example ways in which information associated with discriminant characteristics may be plotted (e.g., at block 830 of method 800). As illustrated in plot 900 shown in FIG. 9, for example, information associated with the discriminant characteristics (here, frequency of events and priority scores) may be plotted for each period over a week timeframe. In the illustrated embodiment, there are four periods. As shown, during the first period, there are many low priority events (indicated by 63 in the figure). As also shown, during the second period, there are many low/mid priority events (indicated by 127 in the figure).

Referring also to plot 1900 shown in FIG. 9A, this plot illustrates in another similar example how the information shown in plot 900 may be presented in a different manner (e.g., after removing the days of week dimensions which was not discriminant in this new example). More particularly, it can be seen that most of the low priority events (indicated by 63 in the figure) occur during the first period, and most of the low/mid priority events (indicated by 127 in the figure) occur during the second period. From this information, causes of the events may be determined (or potential causes may at least be narrowed down). For example, it may be determined that the low priority events most often occur when employees are starting their work for the day. Using this information and information about habits or customs of employees when they start their work for the day (e.g., they run certain processes to begin their day), the cause(s) of the low priority events may be isolated.

Figure 10:
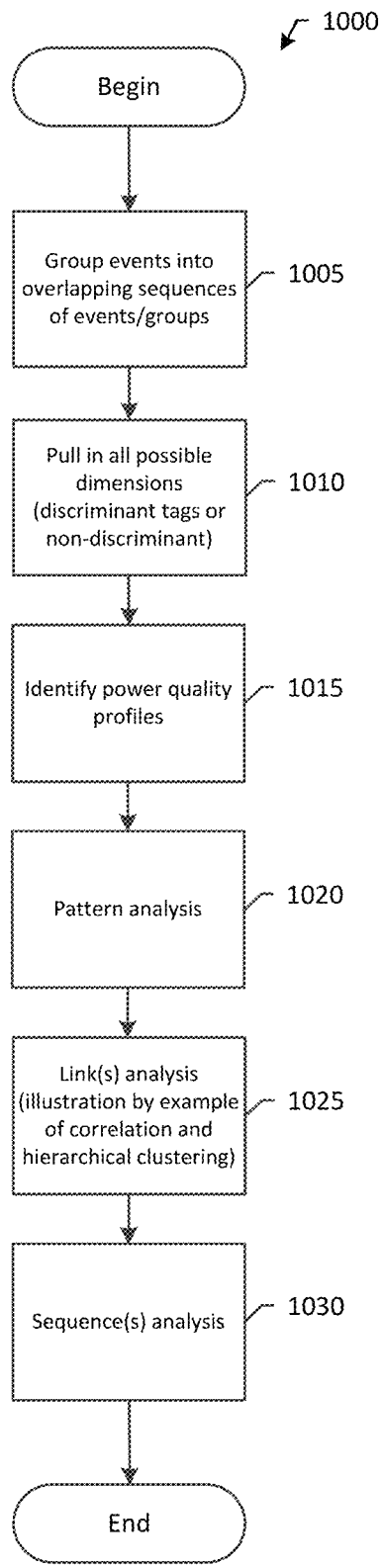
FIG. 10 shows an example method for identifying and analyzing sequences of events/groups in an electrical/power system.

Referring to FIG. 10, a flowchart illustrates an example method 1000 for identifying and analyzing sequences of events/groups in an electrical/power system. Similar to method 800, in accordance with some embodiments of this disclosure, method 1000 is illustrative of example steps that may be performed in connection with method 200 discussed above in connection with FIG. 2 and/or method 400 discussed above in connection with FIG. 4, for example. This is illustrative of another type of aggregation and analysis. It may be conducted in parallel and in addition to the previously used examples of aggregating the number of events/alarms per day. Or it may be conducted independently of the previously described aggregations and analysis. In this particular embodiment, the analysis focuses on the groups of overlapping events (aggregation of number of events/alarms is done per sequences of overlapping events (SooE), and not per day). The goal is to identify patterns, trends, clusters of these sequences of overlapping events (groups of similar SooE, distinctively different from other groups of SooE). If not done independently, but in conjunction with the previous analysis, the system in one embodiment may consider the SooE analysis as a specific discriminant dimension of the previous daily aggregation (e.g., using the discriminant clusters as one-dimension analysis in the daily analysis. Technically this may be done by using each cluster in the same way as each one of the power quality types). Similar to methods 200 and 400, method 1000 may be implemented on a processor of at least one IED (e.g., 121, shown in FIG. 1A) in the electrical/power system, a processor of a diagnostic computing system (e.g., 125, shown in FIG. 1) in the electrical/power system, and/or remote from the at least one IED and the diagnostic computing system.

As illustrated in FIG. 10, the method 1000 begins at block 1005 where events, such as the power events identified at block 210 of method 200, are grouped into overlapping sequences of groups/events. For example, it is possible for at least one of the events identified at block 210 to overlap with, or occur in sequence with, at least one other event identified at block 210. In accordance with some embodiments, the overlapping events or sequences of events may be grouped based on similarity (e.g., event type), proximity (e.g., location of event), etc., e.g., using a hierarchical approach of clustering. It is understood that these events may be grouped based on any number of characteristics.

At block 1010, all (or substantially all) dimensions may be "pulled in" or otherwise extracted or identified from each of the groups formed at block 1005. In some embodiments, the dimensions may include both discriminant and non-discriminant dimensions.

At block 1015, power quality profiles may be identified for each of the groups (and subparts of the groups in some instances), for example, using a power quality profile library. In accordance with some embodiments of this disclosure, the power quality profile library is stored on or accessed by the system(s) or device(s) on which method 1000 is implemented. As one example, the power quality profile library may be accessed from a storage device associated with a cloud-computing device containing the latest power quality profiles.

At block 1020, pattern analysis techniques are used to identify patterns in the each of the groups, for example, based on the power quality profiled identified at block 1015. Some of the patterns were already allude to previously: Daily hourly patterns (e.g., most SooE, or the longest duration SooE, or the SooE with most alarms/events appear at 17 h30), days of week patterns (e.g., on Sundays). Other examples of patterns are seasonal patterns (e.g., temperature related, holidays related), amongst many others. A simple calculation of which pattern has the most "explanatory capability" explains most cases, in the most distinctive way (from the other SooE clusters for example).

At block 1025, the groups (or subparts of the groups) as well as the discriminant dimensions are analyzed for obvious or non-obvious links, possibly based on the identified patterns at block 1020. Examples of linked dimensions are shown, for example, in FIGS. 11-11B, as will be described further below. Link analysis techniques used in one embodiment is to apply a correlation analysis, and then apply a hierarchical clustering to order the dimensions by proximity. This often visually helps to show statistical proximity (groups=clusters co-occurring) as well as statistical distance or "oppositions" one can visually observe (e.g., if this dimension is discriminant, then in "excludes" this other dimension (e.g., calculated negative correlations, as in FIG. 1100 in dark blue color).

At block 1030, sequence(s) analysis techniques are used to analyze internal sequences of the groups (e.g., the SooE cluster 1 may show a pattern of sags, followed by interruptions), as well as between the different SooE (e.g., a pattern of a cluster 1 SooE generally followed later by a SooE of cluster 2), possibly the ones linked at block 1025.

After block 1030, the method may end in some embodiments. In other embodiments, the method may return to block 1005 and repeat again (e.g., in response to additionally power events being identified). Similar to methods 200, 400, 600 and 800, it is understood that method 1000 may include one or more additional blocks in some embodiments.

Figure 11:
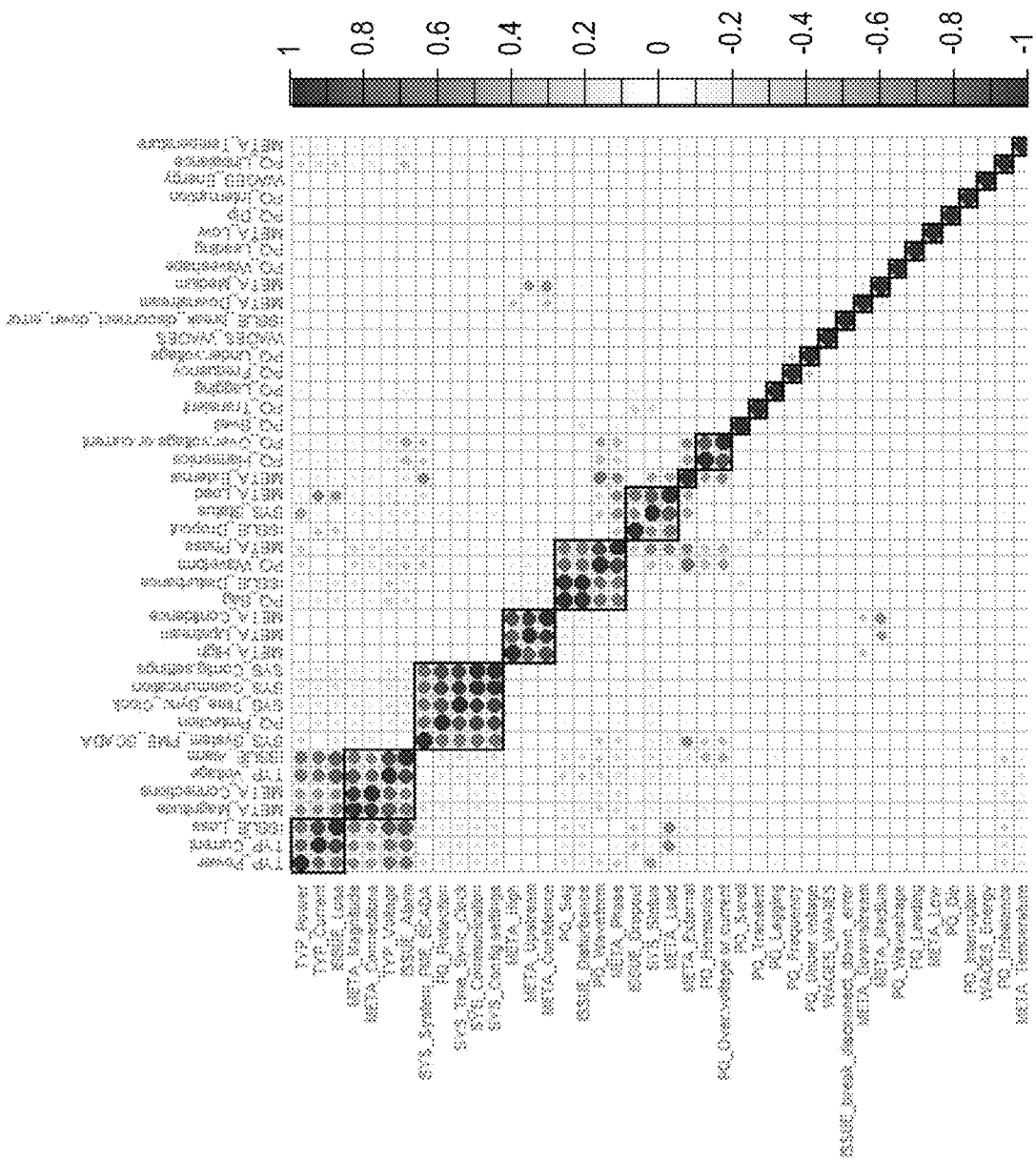
Figure 11A:
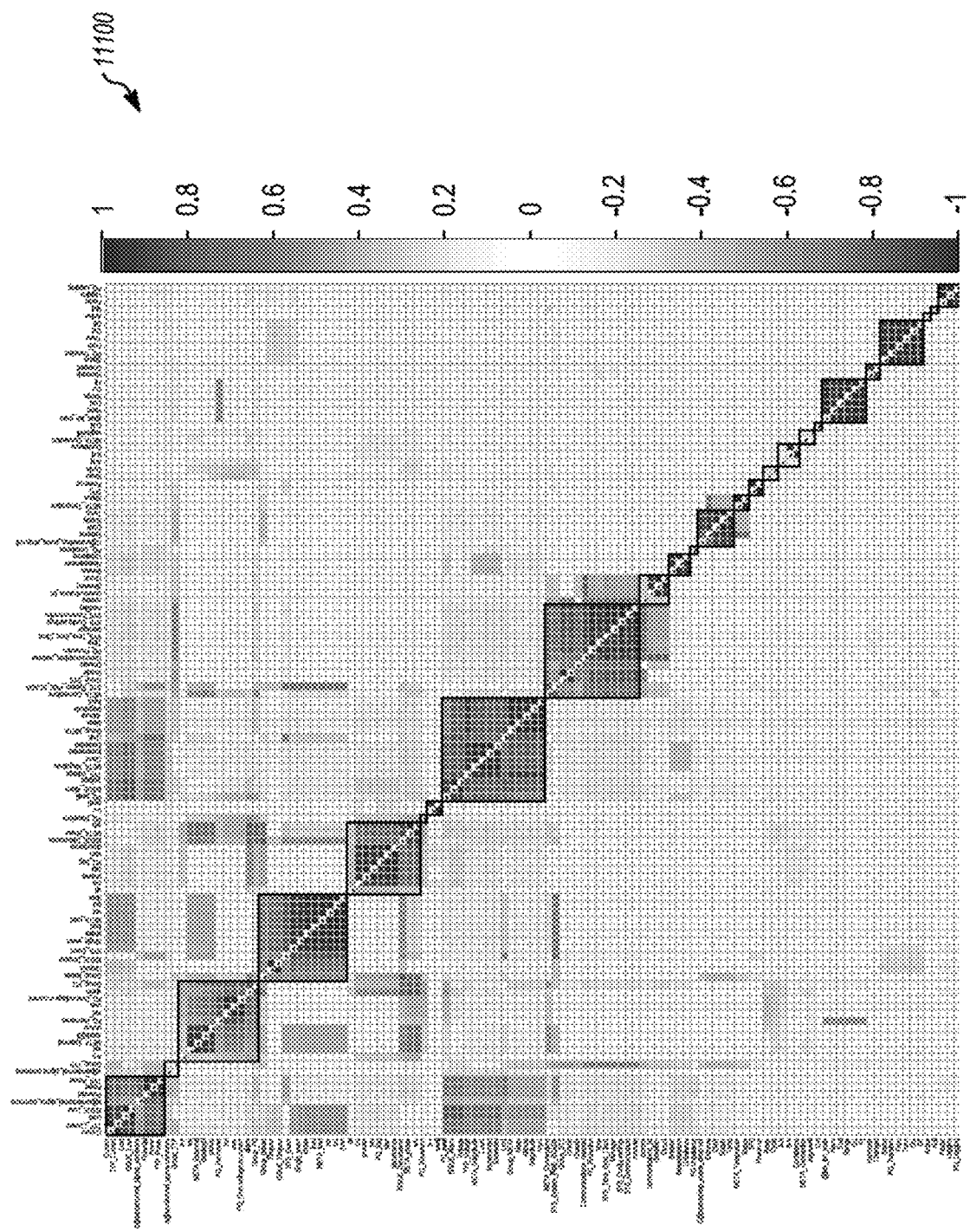
Figure 11B:
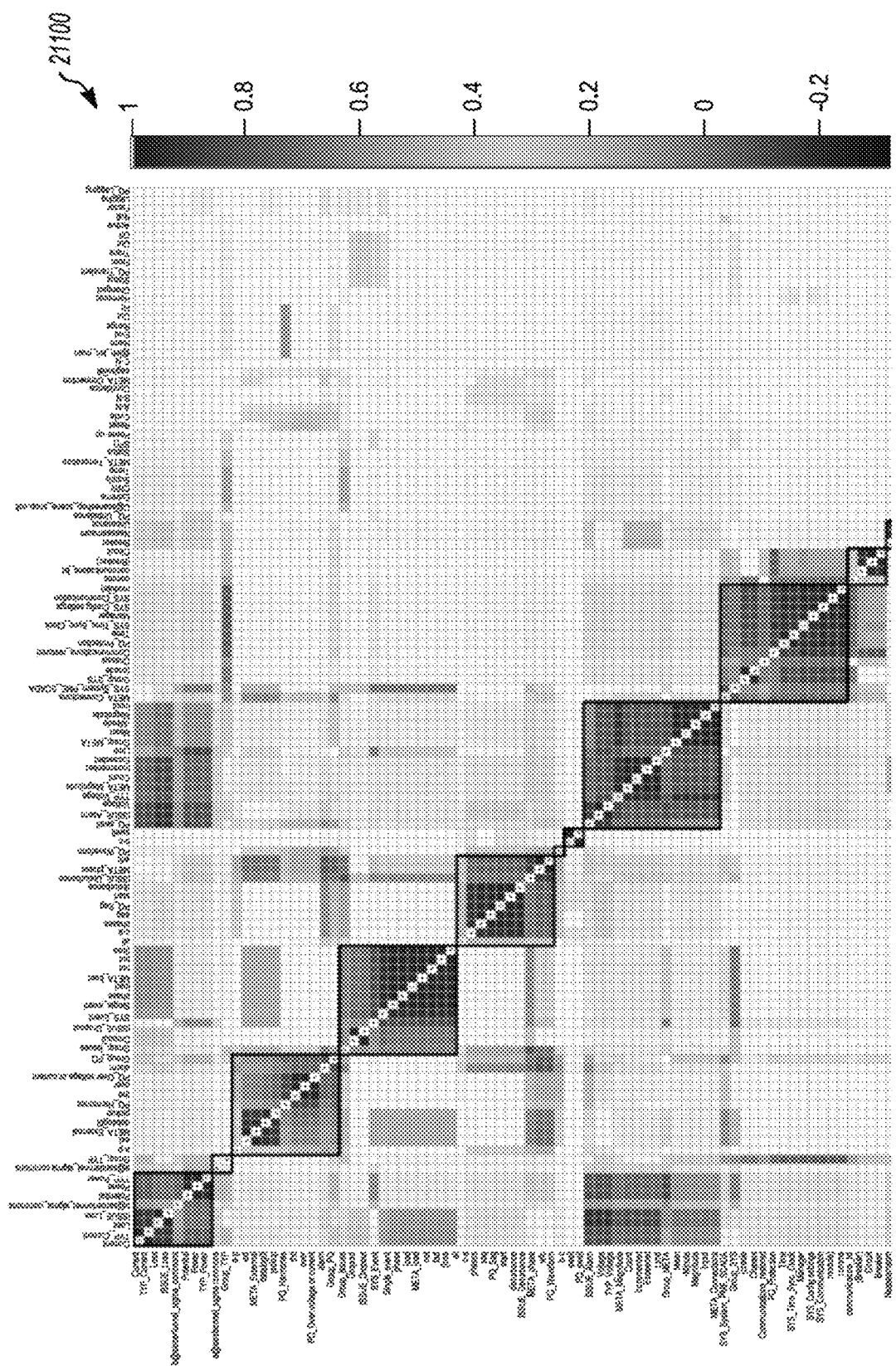

Referring to FIGS. 11-11B, plots 1100, 11100, and 21000 illustrate link analysis, for example, as may occur at block 1025 of method 1000 discussed above. As illustrated in each of these figures, patterns of groups (and subgroups in some instances) stick out pretty clearly. Deep blue means you are above 0.8 in terms of correlations, which means there is a very strong correlation between the groups and/or subgroups. Additionally, deep red means you are below −0.8 in terms of negative correlations, which means that it is very significant exclusive of the other dimension(s) or groups (e.g., a cluster). This type of analysis can be conducted with increasing depth (e.g., 1100 shows less dimensions than 11100). Thus, it is important to distinguish high-level dimensions (e.g., 1100 only keeping few discriminant dimensions) from a more complete or more detailed analysis (e.g., 21100 where the system may keep not only the discriminant dimensions, but even the values such as the daily hourly of 21:30 previously mentioned in one of the examples). This enables to see non-obvious links (of links or of exclusions). Exclusions are sometimes the most useful to experts to identify the probable source/cause (e.g., knowing a PQ event is not due to a fault may guide him to search for correlations (co-occurrences) in the building management system, which may not yet be linked to this present system).

Figure 12:
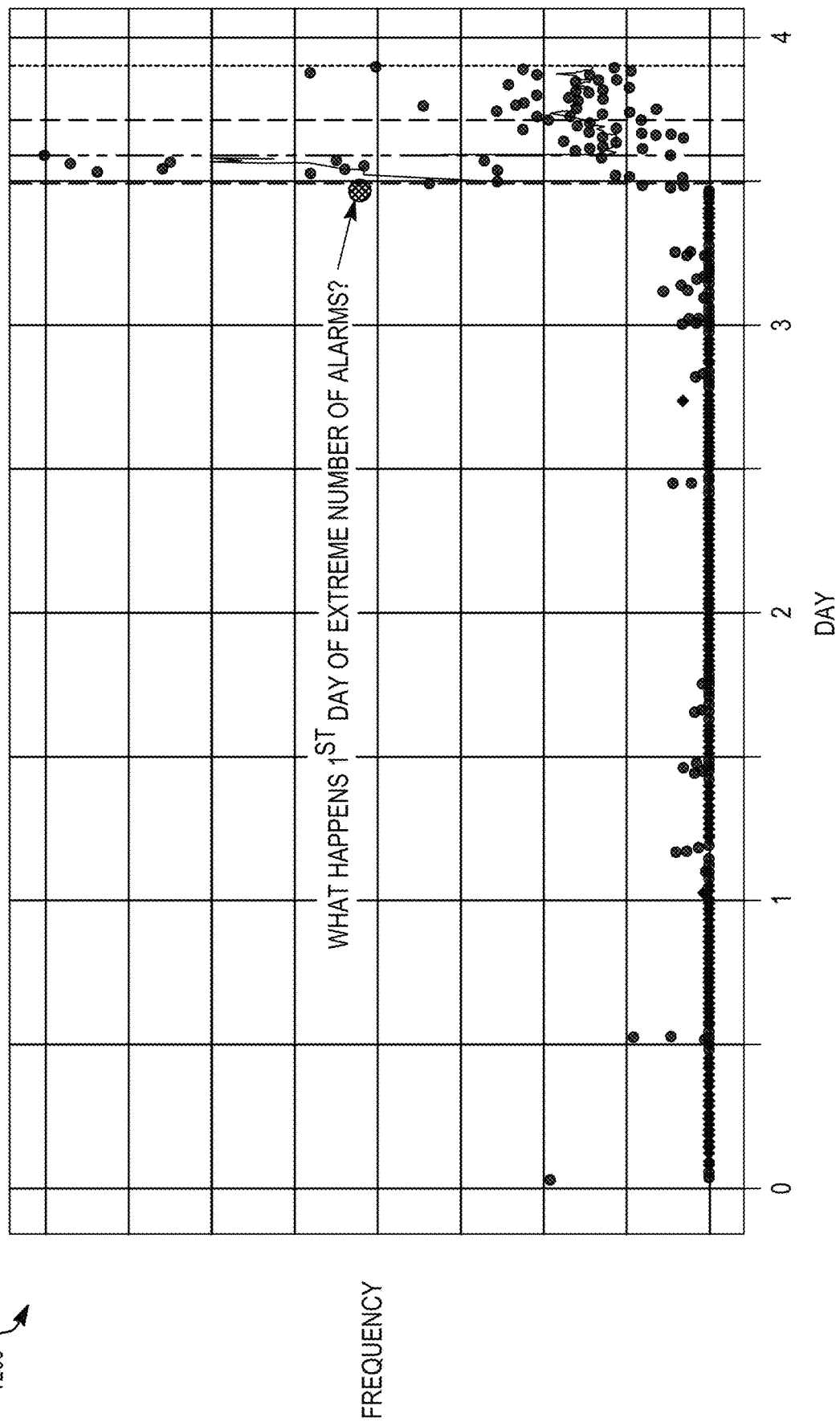

Referring to FIG. 12, plot 1200 illustrates the concept of daily/close to real time alarms and diagnostics in accordance with embodiments of this disclosure. In some embodiments, an alarm may include a warning and a diagnostic. Example warnings may include, for example, a first warning indicating moved over threshold (is extreme day), and a second warning (which is optional in some embodiments) indicating moved above any previous existing day. Example warnings may also include a third warning indicating on demand current status during the day (after warning 1), and a fourth warning indicating daily sum of alarms. For each alarm, available and significant diagnostics may be provided, for example, to indicate new issues, few or spread meters, specific types of meters, etc.

In accordance with some aspects of this disclosure, a "extreme outlier day" may be detected by the electrical/power system either at a specific location (e.g., at a specific IED), or at the aggregated level of all monitored points (e.g., all the IEDs and all the electrical devices capable of monitoring or creating events or alarms). The system dynamically defines for each IED and for the global system (as well as for other relevant locations in the electrical/power system hierarchy), a threshold of what is the value which defines an "extreme outlier day" as described previously (e.g., using the median value+3*IQR, of the current/active period, so of the period for which no new change point has been determined active since the last identified change point). If during any day, the number of events exceeds this threshold, the system may issue a warning in some embodiments. This warning may be an alarm visualized in the mobile application on the user devices, or a message sent per SMS or email.

In accordance with another implementation, the user may request a "current state diagnostic" after receiving a notification of an "extreme outlier day". The system will then run all the discriminating analysis as previously described. The main difference is that it will take the current state of this day as if it was a new period following the current one. In FIG. 12 there is only one period identified on the $1^{st}$ day of extreme outlier. In some embodiments, the system will run all the analysis to compare the one period (as if it had stopped the previous day=yesterday in a real-time system), and compare to it the current day (e.g., identifying for this day the discriminant dimensions, then compare the differences with period 1 as if this day was in fact a period 2). This then may result in finding what major differences there are, where the user may need to focus (e.g., a specific meter? A specific location? A specific time? A specific type of meter? Etc.). This report may, in some embodiment, be directly generated and sent with the first alert of "extreme outlier day".

In some embodiment, a second alarm threshold may be defined in a system, "remembering" the worst day ever of the past. This may create an additional alarm if during an "extreme outlier day", this second threshold is also exceeded. This may in turn trigger additional actions, such as sending a notification to more users/managers as one example among others.

In another embodiment, the system may send the next day a summary report of such an "extreme outlier day" to a pre-defined list of users. This may include a trend evaluation (e.g., applying predictive algorithms and trends analysis, especially if the issue was detected late the previous day, and is constantly accelerating).

In accordance with further embodiments, a method and system are provided for monitoring an electrical system using event stream analysis (also referred to as data stream analytics or analysis). The method and system can monitor and analyze event stream(s) over time to detect changes in activity, which can indicate a change in system state(s) such as from an "ordinary" state to an "exceptional" state. The event stream(s) can be a stream of events in real-time or semi-real-time or a stream of time-stamped events upon which stream analysis is performed according to their time. The event stream analysis can evaluate the stream of events over time to identify actionable triggers, which in turn can also be further analyzed to determine whether to take action (e.g., alarm or other notification, additional analysis or data processing, reconfiguration or repair of the monitored system, turnoff monitored system or particular system components/sub-systems, other action, etc.). The monitored events can include power, electrical and other events, such as described in the various examples herein. The data for the events or actionable triggers or other data can be streamed from a location(s) to a remote location(s) or central location for analysis using known data streaming configurations or frameworks.

The event stream analysis may be subject to time constraint(s), such as time duration (e.g., sliding time window) and/or time-ordered sequence, for assessing validity or invalidity of data from the stream(s) to be considered in the stream analysis. The use of the time constraint(s) can identify or address issues related to the validity or invalidity of data, such as for event(s) and/or actionable trigger(s), which are for example unavailable, missing, incomplete, delayed, contradictory or received out of sequence.

In some embodiments, the actionable trigger may relate to characteristic(s) of the event stream(s). For example, a characteristic of a volume or rate of an event stream(s) of one or more types of events may be monitored to ascertain a rate of change of such events or event severity in order to identify any significant changes to a state of the data stream and/or event(s). In such an approach, the detailed characteristics of the customer process or business may not need to be known in advance. In some cases, this approach can make use of imperfectly configured monitoring devices. The resulting action can include, among other things, a notification which allows a user such as a support engineer or customer to investigate the state change and act. The notification could also signal another process to take a more detailed look at the system data stream overall and apply analytics or machine learning to determine a root cause. The resulting action can also include signaling other analytics components of the system which could search for anything that correlates with the state change. These and other examples of actionable triggers are discussed in further detail below.

Figure 13:
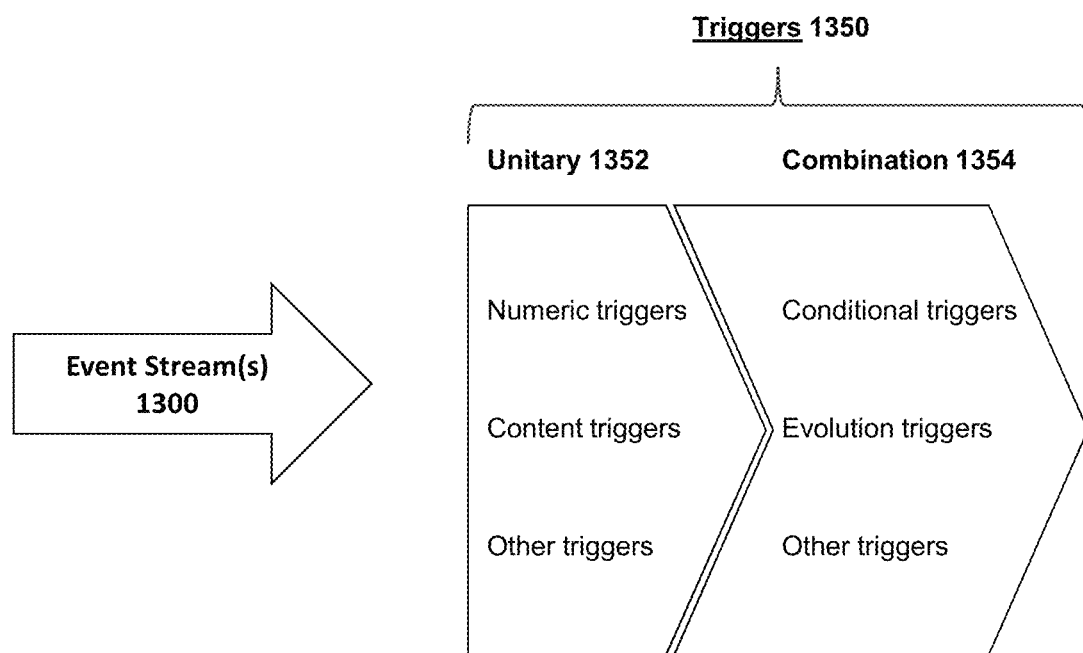
FIG. 13 illustrates a high level diagram of different types of actionable triggers, which can be identified by analyzing event stream(s).

FIG. 13 illustrates a high level diagram of different types of actionable triggers 1350, which can be identified by analyzing event stream(s) (or data thereof) 1300 such as for an electrical system. An actionable "trigger" is a situation (or scenario) which may be the basis upon which to take some action. An actionable trigger can include a unitary trigger 1352, a combination trigger 1354 or other triggering situation, which may be identified based on stream analysis of events, such as from event stream(s) of one or more different types of events. The event stream(s) can be a stream of events in real-time or semi-real-time or a stream of time-stamped events upon which stream analysis is performed according to their time.

The unitary trigger 1352 can include a numeric trigger, content trigger or other trigger, which is based on analysis of a state of a factor, such as for example from analysis of a single event or single event type satisfying (or not) a condition(s).

The numeric trigger can refer to a numerical (or quantifiable) state of an event or event type (such as in the form of a value, rate, severity, etc.) which satisfies (or not) a numerical condition. An example of a rate can be a median daily rate of a previous stable period+3*IQR, etc. Another example could be a value exceeding a given threshold, such a flood condition defined in ISA 18.2, or a number of alarms per 10 minutes period exceeding a threshold defined according to ISA 18.2 (e.g., dependent on the number of operators inside an alarm management system). Another numeric trigger could be the number of IEDs included inside the events stream. This could be indicative for instance of the "spreading" of issues inside a Power system. This triggering could be based on a user set threshold (e.g., "I want to be alerted when more than 5 meters are picking up an event"), or be automatically triggered based on previous operational conditions (e.g., when previously, events stream would be typically impacting between 1 to 5 meters, the system could automatically set a threshold at 7 or plus meters impacted based on standard statistical analysis). Another example would be on a calculated value such as for example the percentage of a Load loss (e.g. if a load loss is >30%). Or it could be a trigger related to other values such as energy consumption exceeding a given or calculated threshold for example.

The content trigger can refer to a qualifiable state of an event or event type, which satisfies (or not) a condition. For example the content trigger can include a specific alarm text/label such as "Load Loss >30%". Another example of content trigger would be a specific type of Power Quality alarm message, (e.g., "1-phase Voltage Loss", "voltage unbalance", "voltage sag", "voltage transient", "flicker detected", etc.). Or again another illustration of possible content trigger could be a specific WAGES related alarm (e.g., "utility highest rate period").

The combination trigger 1354 can include a conditional trigger, an evolution trigger or other combination trigger which is based on a combination of an occurrence and/or non-occurrence of a plurality of actionable triggers at the time of analysis. When performing event data stream analysis, various time constraints can be employed in relations to time-stamped event data to ascertain and address a validity/invalidity of data. The Time constraint can identify or address data such as incomplete/complete data, contradictory data, inconsistent data, complementary data, or a state of the data stream(s) relating to an event(s) or actionable trigger(s). In some embodiments, a confidence factor (e.g., a probability or confidence index) may be developed and reported on whether the observed or identified trigger(s) or combination of occurring and/non-occurring actionable triggers is the actual trigger(s) or combination of actionable triggers.

The conditional trigger can also refer to an occurrence or non-occurrence of specific actionable triggers which satisfy (or not) a condition. The conditional trigger may be evaluated for the relevant group of actionable triggers over or within a time duration, e.g., over or within a predefined time period (e.g., a running time window) which can incorporate a predefined receipt delay period that takes into account acceptable delay in the receipt of data to be considered for analysis. The receipt delay period can refer to a time between identification or transmission of the relevant data (e.g., event or actionable trigger) and a time when the data is received for stream analysis. The data can be time-stamped at the various stages in the process(es) (e.g., identification, transmission, receipt, etc.,), such as described herein, to determine a desired period for comparison to the receipt delay period or other time condition. For the purposes of explanation, a conditional trigger can be expressed using logical operators such as AND, OR, XOR, NOT, and so forth. One example of a conditional trigger can take the following form: IF (Numeric_A) AND (Content_C) AND NOT (Content_B) AND triggered THEN Trigger (Conditional_D), where Numeric_A can represent a numerical trigger, Content_B and Content_C can represent content triggers, and Conditional_D can represent the conditional trigger D.

The evolution trigger can refer to an evolution of a state of a monitored system, which satisfies (or not) a condition, and can involve an evaluation of a sequence of actionable triggers over time. The sequence of actionable triggers can be evaluated according to a predefined order and within a predefined time duration (e.g., a running time window). An example of an evolution trigger can take the following form: IF Sequence=TRUE WITHIN Time_duration THEN Trigger (Sequence_E), where Sequence can represent a sequence of actionable triggers which occur within a predefined time period and in a predefined order, and Sequence_E can represent the evolution trigger E.

When performing stream analysis, the data stream to be evaluated may contain invalid or other data, which may not accurately reflect or provide an accurate reflection of one or more states of the monitored system. Such invalid or other data may include data, such as for event(s) or actionable trigger(s), which are unavailable, missing, incomplete, delayed, contradictory, or received out of sequence. To address these potential data streaming issues, which may be particularly relevant to combination triggers, the event stream analysis may use time constraint(s), such as a time duration (e.g., a sliding time window, a data receipt delay period, a time window incorporating a data receipt delay period, etc.) and/or time-ordered sequence, for assessing validity or invalidity of data to be considered in the analysis. Yet time should be considered as one dimension provided for illustration purposes. Other rules or dimensions may be also applied to address the various data streaming issues as constraints or solutions (e.g., data interpolation for missing data, outlier removal for extreme outliers, etc.). Various example scenarios of data streaming issues are discussed below for the purposes of explanation.

For example, incomplete data may pose a potential issue when performing stream analysis. A stream analysis system may address, in part, the issue of incomplete data in the data stream by applying an absolute completeness requirement (e.g., condition(s)) when performing identification of an actionable trigger(s) or taking some action after such identification which for example can include among other actions processing, alarming or controlling. Some stream analysis systems, which perform alarming, additional monitoring-related analysis and/or triggering Power-related actions (e.g., «switch to UPS», «turn generator to ON, do not yet switch to generator power», «switch to generator power»), allow for incomplete data (e.g., missing or invalid data). There is a sufficient validity (e.g., SUFFICIENT_VALIDITY) status which is appended to data. This may happen as data quality is being monitored, and a system/processing flag will be triggered. The flag, in turn, can allow for processing. As an example, in the context of a combination trigger, several conditional thresholds may be implemented. One example of the conditional thresholds can be that if more than a cumulated period (e.g., 7 hours out of 24 hours) of a day is missing, the day will be flagged as Incomplete which in turn will disable most of the data stream processing. The factor of time is relevant to conditions related to incomplete data and contradictory data, which will be discussed in further detail further below.

Furthermore, "complementary data" may provide a useful alternative to incomplete or missing data when performing stream analysis. For example, a stream analysis system may not receive any interval data for a given period (e.g., Day 100, between 22:00:00 and 23:30:00) or in other words, is missing some data. However, the system may have a cumulative index which was received at the 23:30:00 timestamp. This is an example of complementary data. The system has detected 6× missing «15 mn-interval data points», and thus, the status is defined as non-applicable «NA». The system also received the incremental value of what energy was measured during these missing intervals. This value is the incremental value received at the 23:30:00 timestamp. The system can then use this complementary data to make an assumption: each of the 6 missing values can be classified as Baseload time, and thus, the system will not trigger an alarm. More specifically, for Baseload alarm calculation, the model can require each energy-timestamp to be classified as either «Shutdown hours» or as «Running Hours». The classification of «Shutdown hours» has very little variations (e.g., standard deviation). The mean of «Shutdown Hours» is 6× lower than average «Running Hours». Thus, by taking the Cumulative value and dividing it by the number of missing timestamps, it is possible to obtain the same average value as the Shutdown hours. Due to the small standard deviation, the system can classify the missing measurements into the Shutdown hours class.

In stream analysis system, time and data quality are relevant when analyzing a data stream(s), such as where there is incomplete or contradictory data in the data stream(s). Incomplete Data can refer to different time validity (TIME_VALIDITY) related to late data (e.g., «Late Data»). Contradictory Data can refer to different state validity (STATE_VALIDITY) related to each of the measurements/time stamps. A discussion of the general relevance of time will be initially discussed, and will be followed with a discussion on example scenarios of incomplete data and contradictory data.

In the stream analysis system, a time constraint such as TIME_BEFORE_ACTION may be defined differently for each PROCESS/ACTION. This TIME_BEFORE_ACTION (or time duration) can be considered an additional CONDITION or STATE. For example, as data does not flow homogenously with a metering system, the measurements values/time stamps will be flowing at different speeds and with time fluctuations (delays). There are many different reasons for this situation such as for example, MODBUS congestions (creating a data traffic jam), the speed difference between MODBUS and Ethernet, Driver translation time for Edge software and Hardware mapping of registries to text labels, etc. The system, for each timestamp or period, for any or all triggers (models, alarms, actions, etc.), may use a Timer before action. It is a time condition to wait for more data to be received or processed by a previous step. This will apply at each step of action to be taken. The values may differ per step of action (e.g., possible illustration: wait 1 minute for late data at pre-processing step, wait 20 seconds before taking sending SMS). This then by itself requires again a clear conditional processing, when during the waiting period of a following step waiting period, new data arrives. There may be degraded modes (such as send a different message if data is incomplete vs. if data is complete).

A data quality issue may arise with incomplete data, such as late data (e.g., late energy data arrival). The use of a validity time may be useful in addressing this data quality issue. For example, in an example Energy Analytics case, June Data is received from a system, for the data of the month of February. Some issue prevented the communications (e.g., a local firewall configuration change, or a physical wire disconnection as possible causes). The system processed the data and found 3 different Energy related Alarms on February Data. There are various approaches in handling this situation in the stream analysis system, such as follows.

Create the alarms and send the alarms. However, this information may not be helpful to the user 4 months after the event. The provision of a time constraint, such as time validity, may be used to determine whether to send an alarm or warning or to take other actions when the late data is still considered relevant. The time duration of the time validity may be different for different users (e.g., valid within 48 hrs, 1-month, 3-month, etc.). This makes especially sense when there are services teams and facility management teams involved from different partner companies. The services teams will be interested in a historical view, including all the trends and also system issues. The facility management team is interested "in what happens now . . . what should I do about it", and maybe just a high level historical quarterly review of trends. A system warning may also be provided for late data, e.g., «Late data created 3 not_sent alarms».

Re-process the monthly Energy Analysis models. This allows the models to reflect the best possible historical available data (e.g., models as close as possible to the factual behavior). This may apply to the case for the Baseload alerts (e.g., shutdown hours alarms model), and for the Building Signature (e.g., external air temperature related alarms model).

Send the updated monthly reports to users, send an update information message (e.g., an email) to the users, or simply store the newly updated report with a «updated»flag in a table (so that if needed, the users can go and retrieve it).

This example illustrates the time-related and sequences-related possible layers of successive triggered actions (as conditions, or as sequences such as «if . . . then . . . if . . . then . . . if . . . then»).

A data quality issue may also arise with contradictory data, such as where different state validity (STATE_VALIDITY) is associated with measurements or time stamps. For example, historical data resent after transformation or export issues stemming from a master data management (e.g., updating the Data Model) or from the DB management (e.g., data base) such as DB migration projects. Such migration projects appear when one application or application architecture or components are deprecated or replaced by a new version. The stream analysis system may be a slave to the master database, which may be a live system that updates its Data Model. In both cases, the system may receive some contradictory data. Two different examples are provided for illustration purposes. In the first example, the data validity status value associated to each time stamp may be changed due to a recoding of the valid value from 255 to another values such as 192. In a second example, a change in the unit calculation may have been changed in the new system from Watt hours to K-Watt hours (so the value will be divided by 1000). The system may have in the streaming system received the original values, but as the migration is implemented, the new values are sent to the analytics system again. In the stream analysis system, a contradictory value can be flagged as invalid if two different values are received for a given measure-Timestamp. This may be reversed, and a second re-import may be triggered. Alternatively, the system can allow for an erase of all previously received historical values, so that the migrated data matches the live system data transformation. Alternatively, the system may be set up to always consider the latest version as valid, yet also sending an alert report per day of all characteristics which have different values for a given source and time stamp (e.g., a specific measurement such as "Current phase A" of "meter 345" for a given time stamp "2019/09/13" may have received twice values such as "20000 mA" and "20A". In this example, the new value used in further analysis or reports or displays, would be "20A").

Figure 14:
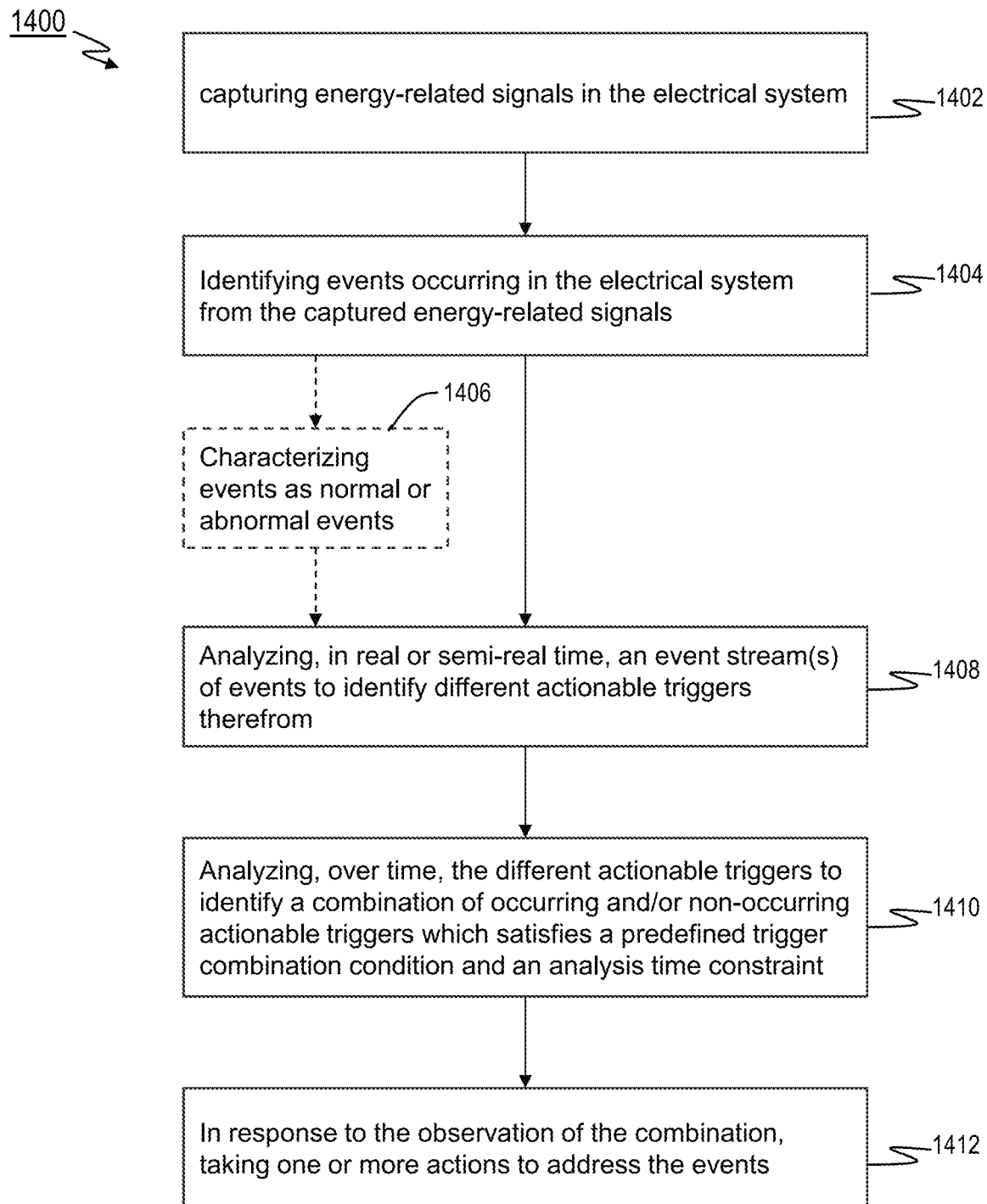
FIG. 14 illustrates an example method for evaluating an event stream(s), in accordance with an embodiment.

FIG. 14 illustrates an example process 1400 for evaluating an event stream(s), in accordance with an embodiment. The operations of the process 1400 may be implemented using or under control of one or more processors. The processor(s) can be configured to perform stream analytics on data streams or stream processing (e.g., stream processor(s)). The one or more processors may be situated at or across one or more IEDs or other computer systems with processor(s), memory and communication module/interface in the monitoring environment.

At block 1402, energy-related signals are captured in the electrical system. The energy-related signals may be captured by IEDs or other devices.

At block 1404, events occurring in the electrical system are identified from the captured energy-related signals. The identified events may be further characterized as normal or abnormal events at block 1406. The events may be identified at an IED(s) or other monitoring devices in communication with the sensors, or downstream of such devices by one or more processors of a remote computer.

At block 1408, an event stream(s) of events is analyzed, in real or semi-real time, to identify different actionable triggers.

At block 1410, the different actionable triggers are analyzed over time to identify a combination of occurring and/non-occurring actionable triggers, which satisfies a predefined trigger combination and an analysis time constraint. For example, data of an event or actionable trigger which does not satisfy the analysis time constraint can be considered invalid data. The invalid data can include data of an event or actionable trigger which is unavailable, missing, incomplete, delayed or received out of sequence when performing the analysis of the event stream(s) to identify an actionable trigger or a combination of occurring and/or non-occurring actionable triggers.

The analysis time constraint can for example, include a predefined time duration within which data of actionable triggers or their associated events are to be considered valid or invalid when performing the analysis of the event stream(s) to identify an actionable trigger or a combination of occurring and/or non-occurring actionable triggers. The time duration can be implemented using a running time window for analyzing the event stream(s) to identify an actionable trigger or a combination of occurring and/or non-occurring actionable triggers. The time window can also incorporate a receipt delay period which defines an acceptable delay for receipt of data to be considered in the event stream analysis.

The analysis time constraint can also include a predefined timing sequence in which actionable triggers and their associated events are to be considered valid or invalid when performing the analysis of the event stream(s) to identify an actionable trigger or a combination. The analysis time constraint can include a time condition in which data of any events or actionable triggers having the same time-stamp are considered invalid as contradictory data.

The analysis time constraint can also include a time condition in which the event data stream(s) includes incomplete event data. In some embodiment, the process 1400 can further substitute incomplete event data with complementary event data from the event data stream(s) for the purpose of performing the event stream analysis.

At block 1412, one or more actions are taken to address the events in response to the observation of the combination of occurring and/non-occurring actionable triggers. The actions may include, for example, an alarm or other notification, additional analysis or data processing, reconfiguration or repair of the monitored system, turnoff monitored system or particular system components/sub-systems, or any other user or system determined actions (e.g., trigger a protection relay of motor if motor data is invalid and thus protection may fail).

It is understood that process 1400 may include one or more additional blocks, steps or operations in some embodiments. For example, in some embodiments, process 1400 may include developing a confidence factor that the observed or identified trigger(s) or combination of occurring and/non-occurring actionable triggers is the actual trigger(s) or combination of actionable triggers. In one example implementation, the confidence factor may be developed based on how closely the characteristics and/or quantities associated with the time-series information match characteristics and/or quantities associated with a selected trigger(s) or combination of actionable triggers. The selected trigger(s) or combination of actionable triggers may be selected from a plurality of potential trigger(s) or combination of actionable triggers listed in a library of combination types. In accordance with some embodiments of this disclosure, the confidence factor may additionally or alternatively be developed from input provided by an end-user to validate the trigger(s) or combination of actionable triggers. The confidence factor may be communicated to the end-user, equipment manufacturer(s), and/or services team (e.g., via a text, report, etc.), as few examples. In accordance with some embodiments of this disclosure, the communicated confidence factor may be updated, for example, in response to user input. The user input may include, for example, a user selection of the identified trigger(s) or combination of actionable triggers from a list of a plurality of possible trigger(s) or combination types and/or user validation of the identified trigger(s) or combination of actionable triggers, as a few examples. Justifications/reasons for the confidence factor may also be communicated. For example, a confidence level associated with the confidence factor may be communicated, such as in a qualitative form of high, medium or low confidence or quantitative form (e.g., 10% or 0.1, 90% or 0.9, etc.) for an observation or identification of selected trigger(s) or combination of actionable triggers. The implementation of the confidence factor analysis may be performed as additional operation(s) in block 1410, or performed as additional block(s) or step(s) in process 1400.

Figure 15:
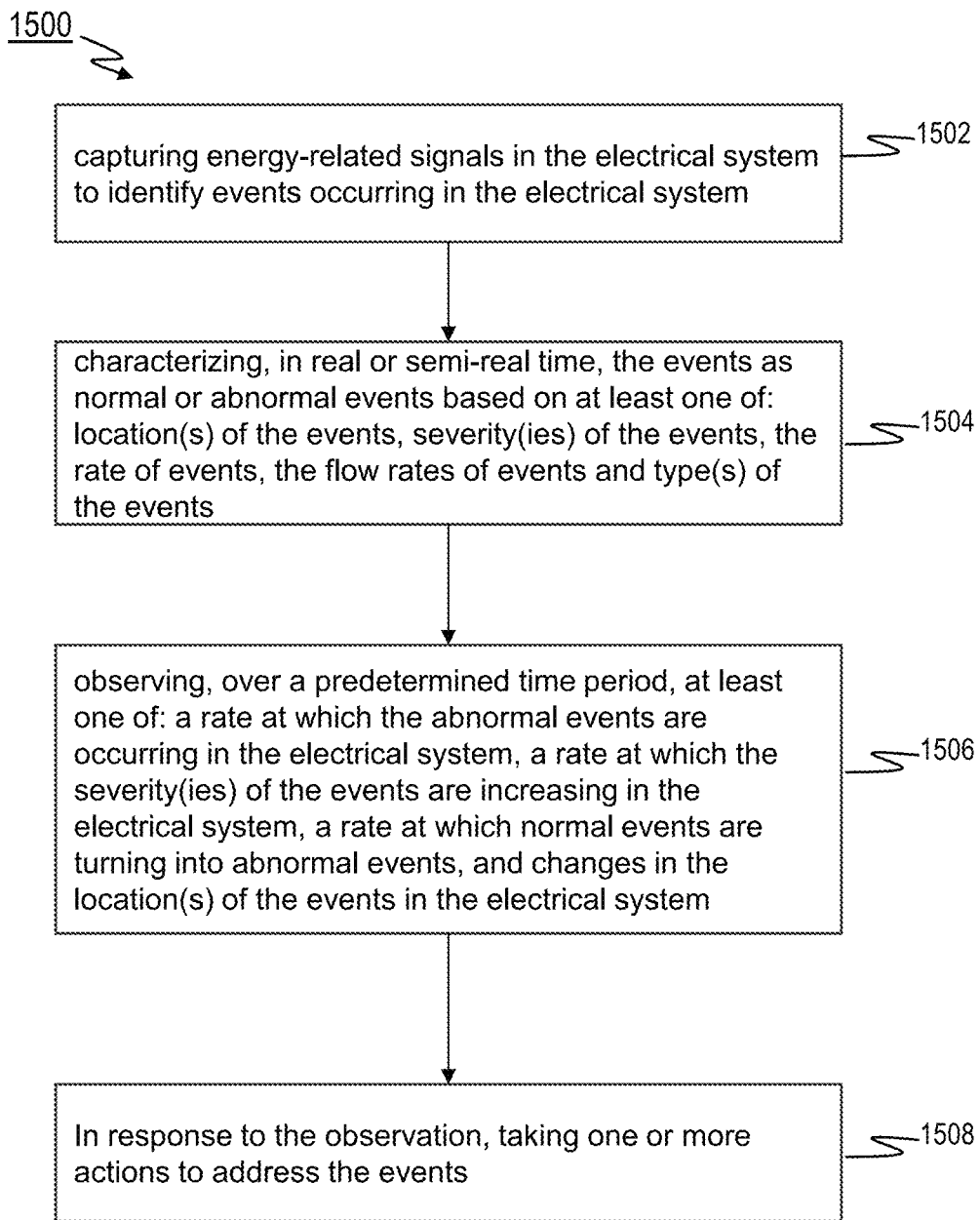
FIG. 15 illustrates an example method for evaluating an event stream(s), in accordance with a further embodiment.

FIG. 15 illustrates an example process 1500 for evaluating an event stream(s), in accordance with a further embodiment. The process 1500 may be implemented by or across or under control of one or more processors. The one or more processors can be configured to perform stream analytics on data streams or stream processing (e.g., stream processor(s)). The one or more processors may be situated at or across one or more IEDs or other computer systems with processor(s), memory and communication module/interface in the monitoring environment.

At block 1502, energy related signals are captured in the electrical system. The energy related signals may be captured by IEDs or other devices.

At block 1504, the events are characterized, in real or semi-real time, as normal or abnormal events based on at least one of: location(s) of the events, process steps related to events, the rate of events, the flow rates of events, the severity(ies) of the events, and type(s) of the events. The flow rate changes of normal events may constitute a trigger of events as being abnormal (e.g., when a system normally is measuring a flow rate of 0 to 5 "normal" events such as operational switching information from turning several HVAC systems "On/off" per 10 minutes interval, and then suddenly the system starts measuring a strong increase in the flow rate of 20 to 50 operational switching per 10 minutes interval). Another example could be linked to measuring the time between arrival of data and the end of processing the data. This is by nature a "normal event". But if processing time moves beyond a certain previously "normal duration" (e.g., between 0 and 5 seconds) to an "abnormal duration" (e.g., using a calculated threshold such as the mean of the "normal duration"*6), then this processing becomes a trigger to alert the system of an abnormal situation to be identified and analyzed.

Furthermore, events are very often related to processes. Processes may be linked to various systems. These systems may be illustrated by two non-limiting examples: (1) building management processes (e.g., HVAC and lighting are just two of the sub-processes which everyone can relate to), or (2) manufacturing processes such as required by a metal panelboard assembly line.

In each of these cases, process steps may, for example, be identified as follows.

For a building management system, there may for example be two main rooftop units which will be turned ON and OFF alternatively to reduce energy consumption. In this case, sensors can send event data related to each status change (e.g., turning each one ON, then OFF) as well as provide continuous data measurements (e.g., for each rooftop unit, a related temperature measurement, etc.). These cycles will most often have typical patterns which can be learned by a system (e.g., in one example the time between each cycle for each rooftop unit switching ON can range between a few minutes and maximum of a couple of hours). This will be considered for each step as a normal condition. If very fast cycling is detected (e.g., less than 1 minute), an alarm may be sent to a facility manager to provide warning of a potential dysfunction of one of the rooftop units. This alarm may be triggered by monitoring the flow rate of the events of each rooftop unit.

For a manufacturing system one example of possible process steps can be: Stock retrieval may be process step 1, a conveyor belt moving pieces into the manufacturing hall may be process step 2, an assembly line may then be process step 3, a painting process may then be process step 4, and final assembly and packaging may be step 5. A process step may be defined as one step required in a process flow. Each process step may thus generate many events (e.g., turning ON/OFF a motor, turning ON/OFF a paint robot, turning ON/OFF a paint cooking machine, turning ON/OFF a conveyor belt). If the manufacturing system (e.g., a Manufacturing SCADA software) picks up abnormally high rates of switching (e.g., ten times higher switching in our example for one or several process steps) an alert may be sent to a process supervisor.

Accordingly, processes may apply to very different types of applications. In each case, the process steps may be specific. They can be defined as sub-processes, running in parallel or in sequence to each other. And so, if sensors are installed, these may capture event data linked to each of the process steps capturing the status changes (e.g., switching ON/OFF) or continuous measurements (e.g., continuously varying speed of conveyor belt or ° F. temperature measurements of the paint cooking process).

At block 1506, observation is performed, over a predetermined time period, for at least one of: a rate at which the abnormal events are occurring in the electrical system, a rate at which the severity(ies) of the events are increasing in the electrical system, a rate at which normal events are turning into abnormal events, and changes in the location(s) of the events in the electrical system.

At block 1508, one or more actions are taken to address the events in response to the observation. The actions may include, for example, an alarm or other notification, additional analysis or data processing, reconfiguration or repair of the monitored system, turnoff monitored system or particular system components/sub-systems, other action, etc.

In some embodiments, if a streaming component has access to the timestamp associated with the event capture (e.g. the time at which the event actually occurred), comparing that timestamp to the time it passed through a stream processor(s) can offer some additional insight into the operations of the event monitoring system and collection of event or other associated data. For example, each event can have a first time stamp associated with a time at which the event is identified. The analytic system and method can involve the transmission from one or more edge devices an event stream(s) of event data of the identified events in real time across a network environment to a remote or central location for performing characterizing or observing operations, the receipt of the event stream(s) of event data of the identified events. Each identified event can have assigned thereto a second time stamp indicating when the event data for the identified event is received. The system and method can further involve the evaluation of the first and second time stamps for the received identified events over time to identify timing issues with the event stream(s). An example process is described in FIG. 16.

Figure 16:
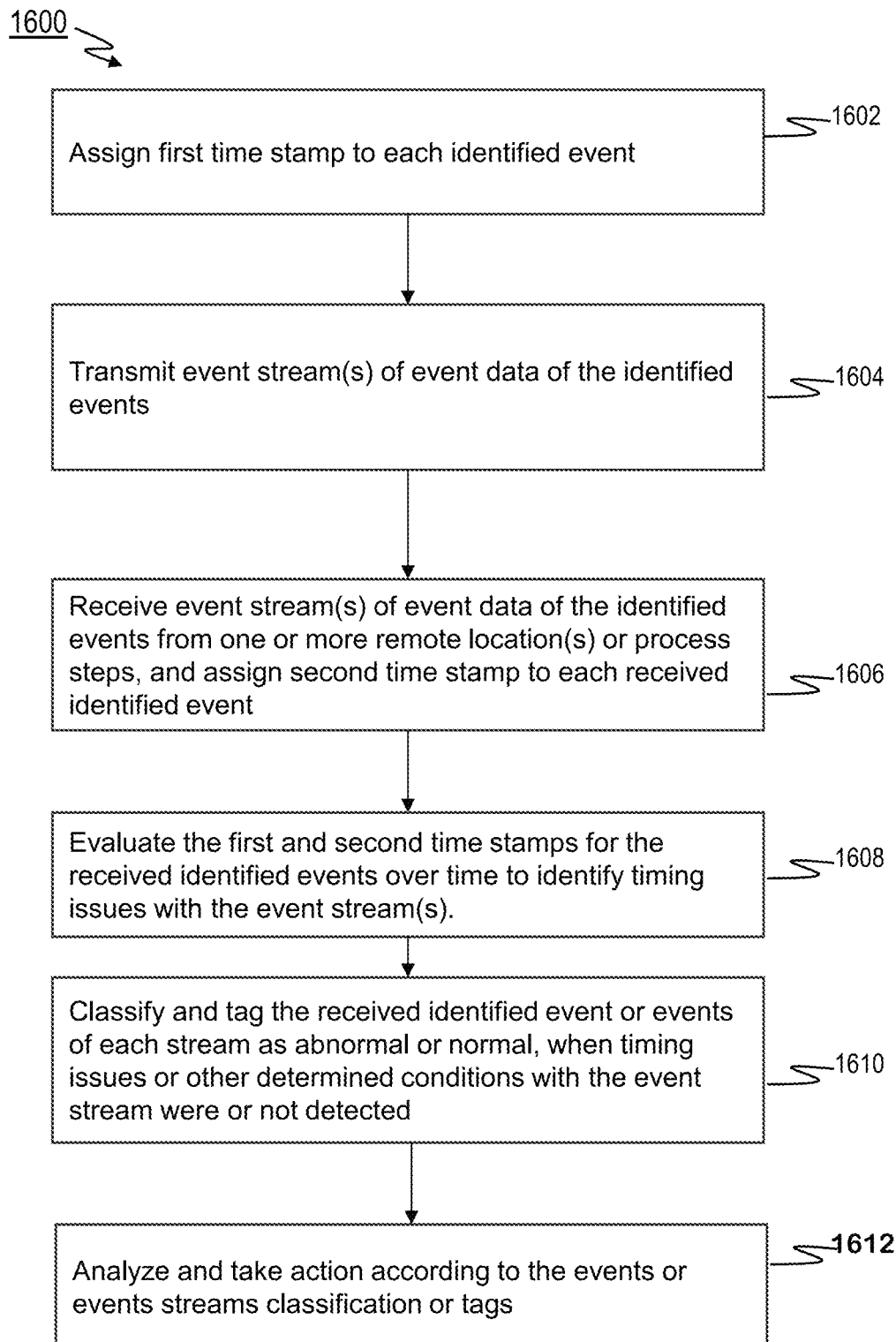
FIG. 16 illustrates an example method for evaluating an event stream(s), in accordance with another embodiment.

FIG. 16 illustrates an example process 1600 for evaluating an event stream(s), in accordance with an embodiment. The process 1600 may be implemented by or under control of a plurality of processors, which are in communication with each other and can be configured to perform stream analytics on data streams. The one or more processors may be situated at or across one or more IEDs or other computer systems with processor(s), memory and communication module/interface in the monitoring environment.

At block 1602, a first time stamp is assigned to each identified event. The event may be identified based on signals captured in the electrical system.

At block 1604, event stream(s) of event data of the identified events are transmitted, such as from a monitoring device (e.g., an IED or computer system) to a remote device (e.g., a remote IED or computer system).

At block 1606, event stream(s) of event data of the identified events are received from one or more remote location(s) or process steps, and a second time stamp is assigned to each received identified event. The second time stamp can indicate the time at which an event (or data thereof) is received. In the case of another location, this will enable analysis of issues related to connections, communications, and data transfer bottlenecks amongst others inside the Power System. In the case of process steps, this will enable analysis of processing bottlenecks, processing overload, of even hardware issues such as memory instability, as a few examples, At block 1608, the first and second time stamps for the received identified events are evaluated over time to identify timing issues with the event stream(s). The evaluated timing issues can include, among other things, the following:

If the event timestamp is later than the receive time (i.e. in the future) it can imply a clock problem somewhere in the data capture system.

The computation and tracking of typical event transfer latency.

If the event timestamp has a consistent delta from the receive time, this would also indicate a clock problem.

If all events from a particular edge platform had a similar timestamp delta, it would imply a clock problem at the time sync service for the site.

If the event timestamps were gradually falling behind the receive time it can indicate that the process of data collection and transmission is unable to transfer event data as quickly as it is being generated.

At block 1610, the events or events streams are classified and tagged as abnormal or normal, when timing issues or other determined conditions with the event stream were or were not detected. Descriptions of blocks 1412 and 1504 provide some examples of classifying events or events streams as normal or abnormal.

At block 1612, the events or events streams are analyzed and the system takes action according to the analysis of the events or events streams classification or tags. Descriptions of blocks 1408, 1410 and 1506 provide descriptions of some examples of analysis. Descriptions of blocks 1412 and 1508 provide descriptions of some examples of possible actions.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications) but rather, may be useful in substantially any application where it is desired to manage smart alarms in an electrical system. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

What is claimed is:

1. A method of analyzing events for an electrical system, comprising:

receiving an event stream(s) of events occurring in the electrical system, the events being identified from captured energy-related signals in the electrical system;

characterizing the events as normal or abnormal events based on at least one of: location(s) of the events, process steps related to events, severity(ies) of the events, impact of the events, and type(s) of the events;

analyzing, an event stream(s) of the events to identify different actionable triggers therefrom, the different actionable triggers including a scenario in which a group of events satisfies one or more predetermined triggering conditions;

analyzing, over time, the different actionable triggers to identify a combination of occurring and/or non-occurring actionable triggers which satisfies at least one of a predefined trigger combination condition and an analysis time constraint, the analysis time constraint being a time period duration and/or sequence within which time-stamped data of events in the event stream(s) and the associated actionable triggers are considered or not considered in the analysis to identify the combination of occurring and/or non-occurring actionable triggers; and in response to the observation of the combination, taking one or more actions to address the events, the one or more actions including at least one of an alarm or other notification, additional analysis or data processing, reconfiguration or repair of the electrical system, turning off particular system components/sub-systems and other user or system determined actions, wherein the event stream(s) comprises a stream(s) of normal and abnormal events, and the one or more predetermined triggering conditions comprises:

a rate at which the events are occurring in the electrical system exceeding an acceptable level based on the electrical system's current configuration, a rate at which the severity(ies) or derived impact of the events are increasing in the electrical system exceeding an acceptable level based on the electrical system's current configuration, a rate at which normal events are turning into abnormal events exceeding an acceptable level based on the electrical system's current configuration, or changes in the location(s) of the events in the electrical system exceeding an acceptable level based on the electrical system's current configuration.

2. The method according to claim 1, wherein the event streams(s) are analyzed in real or semi-real time or based on all available time stamped events at the time of analysis.

3. The method according to claim 1, wherein data of an event or actionable trigger which does not satisfy the analysis time constraint is considered invalid data, the invalid data including data of an event or actionable trigger which is unavailable, missing, incomplete, delayed or received out of sequence when performing the analysis of the event stream(s) to identify an actionable trigger or a combination of occurring and/or non-occurring actionable triggers.

4. The method according to claim 1, wherein the analysis time constraint comprises a predefined time duration within which data of actionable triggers or their associated events are to be considered valid or invalid when performing the analysis of the event stream(s) to identify an actionable trigger or a combination of occurring and/or non-occurring actionable triggers.

5. The method according to claim 4, wherein the analysis time constraint comprises a running time window for analyzing the event stream(s) to identify an actionable trigger or a combination of occurring and/or non-occurring actionable triggers, the time window incorporating a receipt delay period which defines an acceptable delay for receipt of data to be considered in the event stream analysis.

6. The method according to claim 4, wherein the analysis time constraint further comprises a predefined timing sequence in which actionable triggers and their associated events are to be considered valid or invalid when performing the analysis of the event stream(s) to identify an actionable trigger or a combination.

7. The method according to claim 1, wherein the analysis time constraint comprises a time condition in which the event data stream(s) includes incomplete event data, the method further comprising:

substituting incomplete event data with complementary event data from the event data stream(s) for the purpose of performing the event stream analysis.

8. A method for analyzing events in an electrical system, comprising:

receiving an event stream(s) of events occurring in the electrical system, the events being identified from captured energy-related signals in the electrical system;

characterizing, in real or semi-real time, the events as normal or abnormal events based on at least one of: location(s) of the events, process steps related to events, severity(ies) of the events, and type(s) of the events;

observing, over a predetermined time period, at least one of: a rate at which the events are occurring in the electrical system, a rate at which the severity(ies) of the events are increasing in the electrical system, a rate at which normal events are turning into abnormal events, and changes in the location(s) of the events in the electrical system; and in response to the at least one of: the rate at which the events are occurring in the electrical system, the rate at which the severity(ies) of the events are increasing in the electrical system, the rate at which normal events are turning into abnormal events, and the changes in the location(s) of the events in the electrical system, exceeding an acceptable level based on the electrical system's current configuration, taking one or more actions to address the events, the one or more actions including at least one of an alarm or other notification, additional analysis or data processing, reconfiguration or repair of the electrical system, turning off particular system components/sub-systems and other user or system determined actions.

9. The method according to claim 8, wherein each event has a first time stamp associated with a time at which the event is identified, and a second time stamp indicating when the event data for the identified event is received, the method further comprising:

evaluating the first and second time stamps for the received identified events over time to identify timing issues with the event stream(s).

10. A system for analyzing events for an electrical system, comprising:

memory; and one or more processors, coupled to the memory, configured to:

receive an event stream(s) of events occurring in the electrical system, the events being identified from captured energy-related signals in the electrical system, characterize the events as normal or abnormal events based on at least one of: location(s) of the events, process steps related to events, severity(ies) of the events, impact of the events, and type(s) of the events, analyze the event stream(s) of the events to identify different actionable triggers therefrom, the different actionable triggers including a scenario in which a group of events satisfies one or more predetermined triggering conditions, analyze, over time, the different actionable triggers to identify a combination of occurring and/or non-occurring actionable triggers which satisfies a predefined trigger combination condition and an analysis time constraint, the analysis time constraint being a time period duration and/or sequence within which time-stamped data of events in the event stream(s) and the associated actionable triggers are considered or not considered in the analysis to identify the combination of occurring and/or non-occurring actionable triggers, and in response to the observation of the combination, take one or more actions to address the events, the one or more actions including at least one of an alarm or other notification, additional analysis or data processing, reconfiguration or repair of the electrical system, turning off particular system components/sub-systems and other user or system determined actions, wherein the event stream(s) comprises a stream(s) of normal and abnormal events, and the one or more predetermined triggering conditions comprises:

a rate at which the events are occurring in the electrical system exceeding an acceptable level based on the electrical system's current configuration, a rate at which the severity(ies) or derived impact of the events are increasing in the electrical system exceeding an acceptable level based on the electrical system's current configuration, a rate at which normal events are turning into abnormal events exceeding an acceptable level based on the electrical system's current configuration, or changes in the location(s) of the events in the electrical system exceeding an acceptable level based on the electrical system's current configuration.

11. The system according to claim 10, wherein the event streams(s) are analyzed in real or semi-real time or based on all available time stamped events at the time of analysis.

12. The system according to claim 10, wherein data of an event or actionable trigger which does not satisfy the analysis time constraint is considered invalid data, the invalid data including data of an event or actionable trigger which is unavailable, missing, incomplete, delayed or received out of sequence when performing the analysis of the event stream(s) to identify an actionable trigger or a combination of occurring and/or non-occurring actionable triggers.

13. The system according to claim 10, wherein the analysis time constraint comprises a predefined time duration within which data of actionable triggers or their associated events are to be considered valid or invalid when performing the analysis of the event stream(s) to identify an actionable trigger or a combination of occurring and/or non-occurring actionable triggers.

14. The system according to claim 13, wherein the analysis time constraint comprises a running time window for analyzing the event stream(s) to identify an actionable trigger or a combination of occurring and/or non-occurring actionable triggers, the time window incorporating a receipt delay period which defines an acceptable delay for receipt of data to be considered in the event stream analysis.

15. The system according to claim 13, wherein the analysis time constraint further comprises a predefined sequence in which actionable triggers and their associated events are to be considered valid or invalid when performing the analysis of the event stream(s) to identify an actionable trigger or a combination.

16. The system according to claim 10, wherein the analysis time constraint comprises a time condition in which the event data stream(s) includes incomplete event data, the one or more processors being further configured to substitute incomplete event data with complementary event data from the event data stream(s) for the purpose of performing the event stream analysis.

17. A system for analyzing events in an electrical system, comprising:
  memory; and
  one or more processors, coupled to the memory, configured to:
    receive an event stream(s) of events occurring in the electrical system, the events being identified from captured energy-related signals in the electrical system,
    characterize, in real or semi-real time, the events as normal or abnormal events based on at least one of: location(s) of the events, process steps related to events, severity(ies) of the events, and type(s) of the events;
    observe, over a predetermined time period, at least one of: a rate at which the events are occurring in the electrical system, a rate at which the severity(ies) of the events are increasing in the electrical system, a rate at which normal events are turning into abnormal events, and changes in the location(s) of the events in the electrical system; and
    in response to the at least one of: the rate at which the abnormal events are occurring in the electrical system, the rate at which the severity(ies) of the events are increasing in the electrical system, the rate at which normal events are turning into abnormal events, and the changes in the location(s) of the events in the electrical system, exceeding an acceptable level based on the electrical system's current configuration, take one or more actions to address the events, the one or more actions including at least one of an alarm or other notification, additional analysis or data processing, reconfiguration or repair of the electrical system, turning off particular system components/sub-systems and other user or system determined actions.

18. The system according to claim 17, wherein each event has a first time stamp associated with a time at which the event is identified, and a second time stamp indicating when the event data for the identified event is received, and the one or more processors are further configured to evaluate the first and second time stamps for the received identified events over time to identify timing issues with the event stream(s).

19. A non-transitory computer medium storing code, which when executed by one or more processors, performs a method of analyzing events for an electrical system, the method comprising:
  receiving an event stream(s) of events occurring in the electrical system, the events being identified from captured energy-related signals in the electrical system;
  analyzing, an event stream(s) of the events to identify different actionable triggers therefrom, the different actionable triggers including a scenario in which a group of events satisfies one or more predetermined triggering conditions;
  analyzing, an event stream(s) of the events to identify different actionable triggers therefrom, the different actionable triggers including a scenario in which a group of events satisfies one or more predetermined triggering conditions;
  analyzing, over time, the different actionable triggers to identify a combination of occurring and/or non-occurring actionable triggers which satisfies a predefined trigger combination condition and an analysis time constraint, the analysis time constraint being a time period duration and/or sequence within which time-stamped data of events in the event stream(s) and the associated actionable triggers are considered or not considered in the analysis to identify the combination of occurring and/or non-occurring actionable triggers; and
  in response to the observation of the combination, taking one or more actions to address the events, the one or more actions including at least one of an alarm or other notification, additional analysis or data processing, reconfiguration or repair of the electrical system, turning off particular system components/sub-systems and other user or system determined actions,
  wherein the event stream(s) comprises a stream(s) of normal and abnormal events, and the one or more predetermined triggering conditions comprises:

a rate at which the events are occurring in the electrical system exceeding an acceptable level based on the electrical system's current configuration, a rate at which the severity(ies) or derived impact of the events are increasing in the electrical system exceeding an acceptable level based on the electrical system's current configuration, a rate at which normal events are turning into abnormal events exceeding an acceptable level based on the electrical system's current configuration, or changes in the location(s) of the events in the electrical system exceeding an acceptable level based on the electrical system's current configuration.

20. A non-transitory computer medium storing code, which when executed by one or more processors, performs a method of analyzing events for an electrical system, the method comprising:

receiving an event stream(s) of events occurring in the electrical system, the events being identified from captured energy-related signals in the electrical system;

characterizing, in real or semi-real time, the events as normal or abnormal events based on at least one of: location(s) of the events, process steps related to events, severity(ies) of the events, and type(s) of the events;

observing, over a predetermined time period, at least one of: a rate at which the events are occurring in the electrical system, a rate at which the severity(ies) of the events are increasing in the electrical system, a rate at which normal events are turning into abnormal events, and changes in the location(s) of the events in the electrical system; and in response to the at least one of: the rate at which the events are occurring in the electrical system, the rate at which the severity(ies) of the events are increasing in the electrical system, the rate at which normal events are turning into abnormal events, and the changes in the location(s) of the events in the electrical system, exceeding an acceptable level based on the electrical system's current configuration, taking one or more actions to address the events, the one or more actions including at least one of an alarm or other notification, additional analysis or data processing, reconfiguration or repair of the electrical system, turning off particular system components/sub-systems and other user or system determined actions.

\* \* \* \* \*